United States Patent [19]
Yoneda et al.

[11] Patent Number: 5,610,414
[45] Date of Patent: Mar. 11, 1997

[54] SEMICONDUCTOR DEVICE

[75] Inventors: Hiroshi Yoneda, Ikoma; Shigeto Yoshida; Kenichi Katoh, both of Tenri; Yasukuni Yamane, Shiki; Yutaka Ishii, Nara, all of Japan

[73] Assignee: Sharp Kabushiki Kaisha, Osaka, Japan

[21] Appl. No.: 275,676

[22] Filed: Jul. 15, 1994

[30] Foreign Application Priority Data

| Jul. 28, 1993 | [JP] | Japan | 5-186459 |
| Sep. 29, 1993 | [JP] | Japan | 5-242259 |
| Oct. 27, 1993 | [JP] | Japan | 5-268929 |

[51] Int. Cl.$^6$ .......................... H01L 29/04; H01L 33/00; H01L 27/10
[52] U.S. Cl. .................. 257/99; 257/59; 257/72; 257/203
[58] Field of Search ................... 257/99, 57, 59, 257/60, 72, 203; 359/54, 57, 58, 73, 198

[56] References Cited

U.S. PATENT DOCUMENTS

| 4,107,656 | 8/1978 | Farnsworth | 340/825.15 |
| 5,071,733 | 12/1991 | Uekita et al. | 430/326 |
| 5,200,847 | 4/1993 | Mawatari et al. | 359/59 |
| 5,399,992 | 3/1995 | Itakura et al. | 330/257 |
| 5,434,433 | 7/1995 | Takasu et al. | 257/89 |
| 5,479,236 | 12/1995 | Tanaka | 354/430 |

FOREIGN PATENT DOCUMENTS

| 3314778 | 11/1983 | Germany. |
| 3709086 | 9/1987 | Germany. |
| 4306988 | 9/1993 | Germany. |
| 57-31159 | 2/1982 | Japan. |
| 2-214817 | 8/1990 | Japan. |
| 4-348385 | 12/1992 | Japan. |

OTHER PUBLICATIONS

Semiconductor Devices, Physics & Technology, S. M. Sze, 85.

*Primary Examiner*—Sara W. Crane
*Assistant Examiner*—Fetsum Abraham
*Attorney, Agent, or Firm*—Nixon & Vanderhye P.C.

[57] ABSTRACT

In a semiconductor device wherein an active device circuit and electrically conductive lines, such as a power source line for supplying power to the semiconductor active device circuit or signal lines for inputting a signal to the semiconductor active device circuit, are formed together on a single substrate, an improved arrangement wherein a conventional power source or signal line is formed by using a plurally of individual lines of substantially uniform electrical resistance where the electrical resistance of each line is limited to a predetermined value. Moreover, a waveform deterioration response signal component is added to a signal transmitted through the signal lines so as to improve the transmitted signal by compensating for waveform deterioration experienced during circuit operation. In addition, an electrical capacity forming electrode is provided alongside substantial length of the power source line. A capacitor is thus effectively formed within the active device circuit by intervening a dielectric between the power source line and the capacity forming electrode so as to reduce high-frequency noise which occurs in the power source line. The disclosed arrangements substantially reduce the occurrence of an irregular operation in the active device circuit.

75 Claims, 35 Drawing Sheets

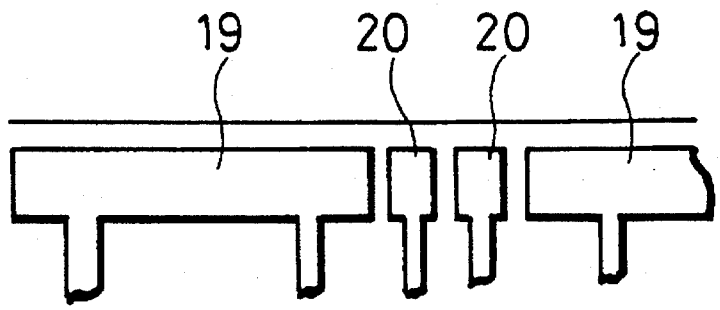
FIG.22
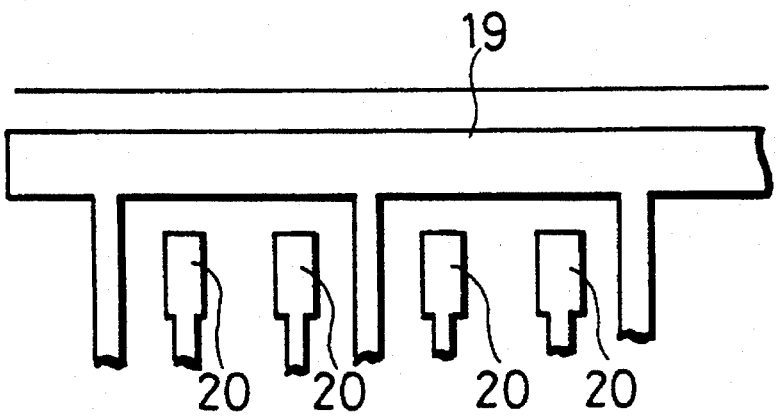
FIG.23
FIG.24(a)
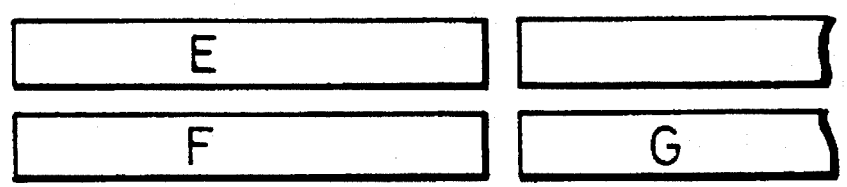
FIG.24(b)

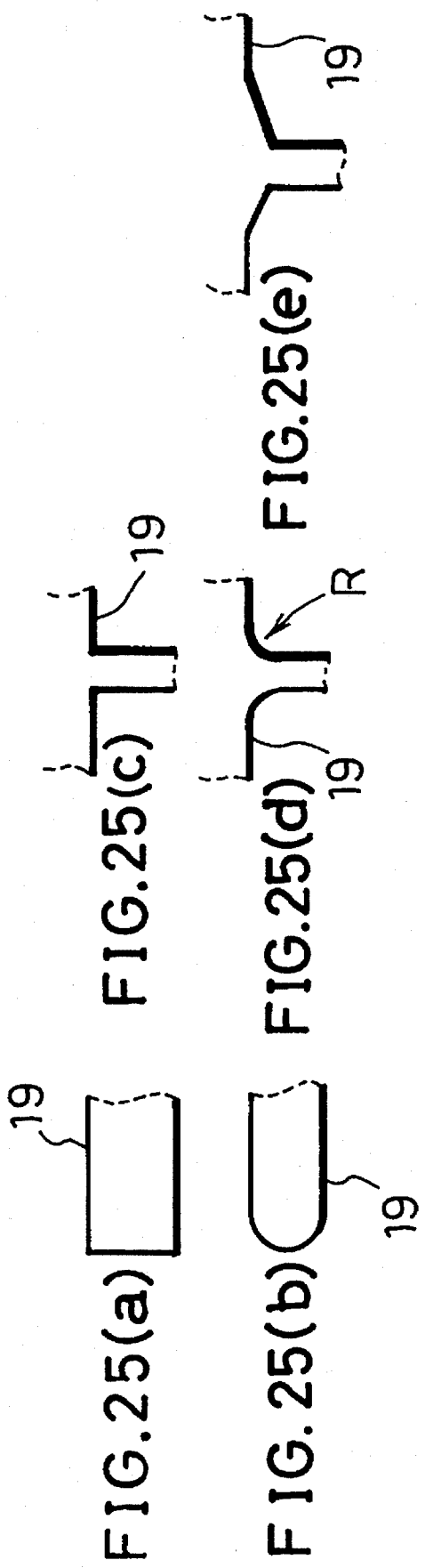

FIG.26
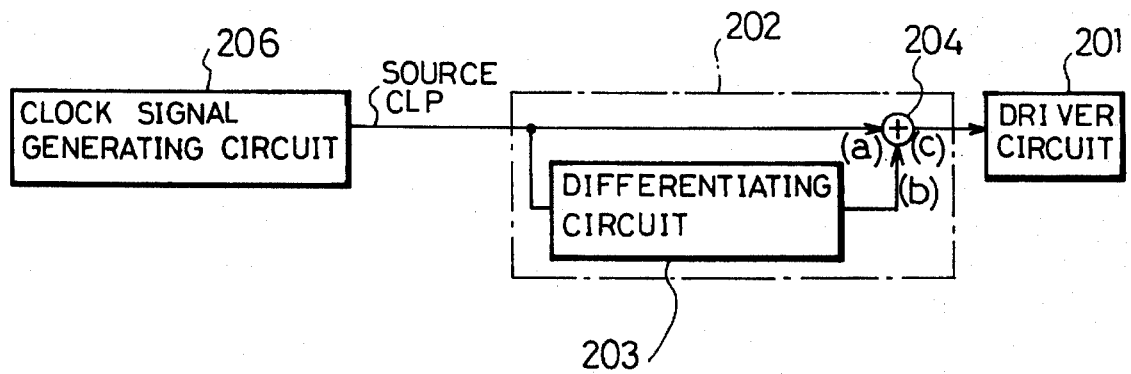
FIG.27(a) SOURCE CLOCK SIGNAL (SOURCE CLP)
FIG.27(b) RESPONSIBILITY IMPROVEMENT SIGNAL
FIG.27(c) IMPROVENT CLOCK SIGNAL (SOURCE CLP)
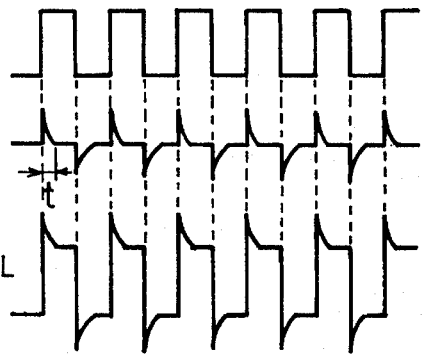
FIG.28
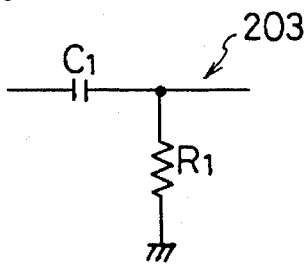

TO EACH DATA
SIGNAL LINE

FIG.35(a) SOURCE CLP
FIG.35(b) DIFFERENTIATING CIRCUIT INPUT SIGNAL
FIG.35(c) DIFFERENTIATING CIRCUIT OUTPUT SIGNAL
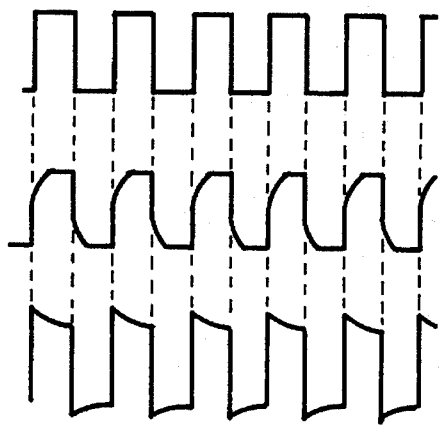
FIG.36
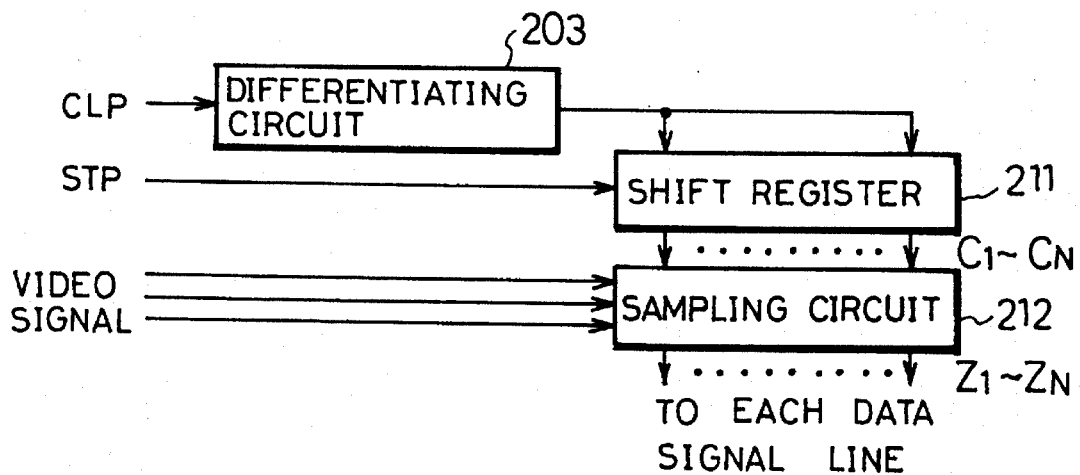

FIG. 39(a) SOURCE CLP 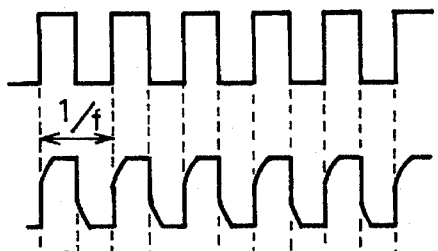
FIG. 39(b) INPUT SIGNAL 
FIG. 39(c) RESPONSIBILITY IMPROVEMENT SIGNAL 
FIG. 39(d) IMPROVEMENT CLP 
FIG. 39(e) RESPONSIBILITY IMPROVEMENT SIGNAL 
FIG. 40
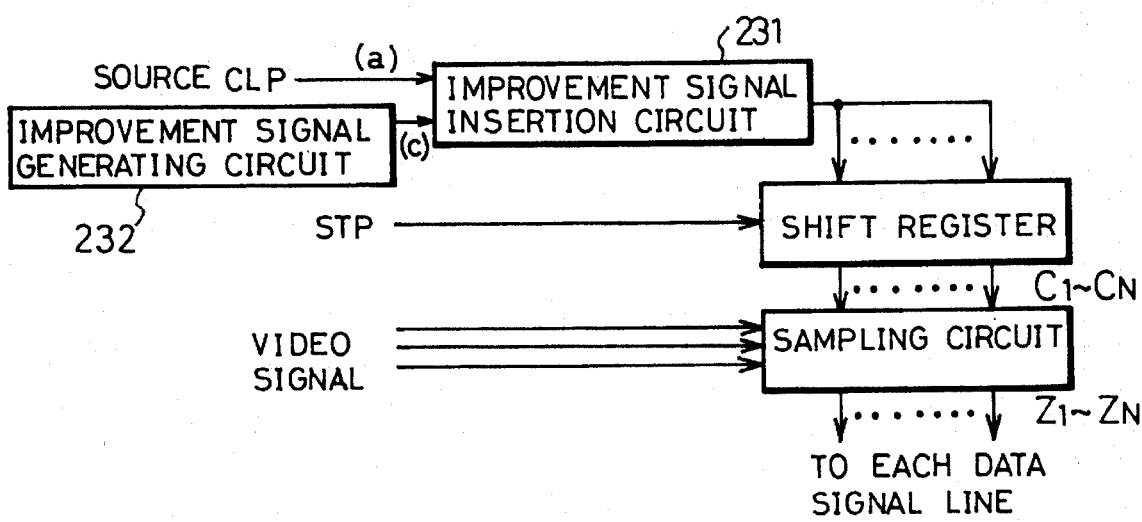

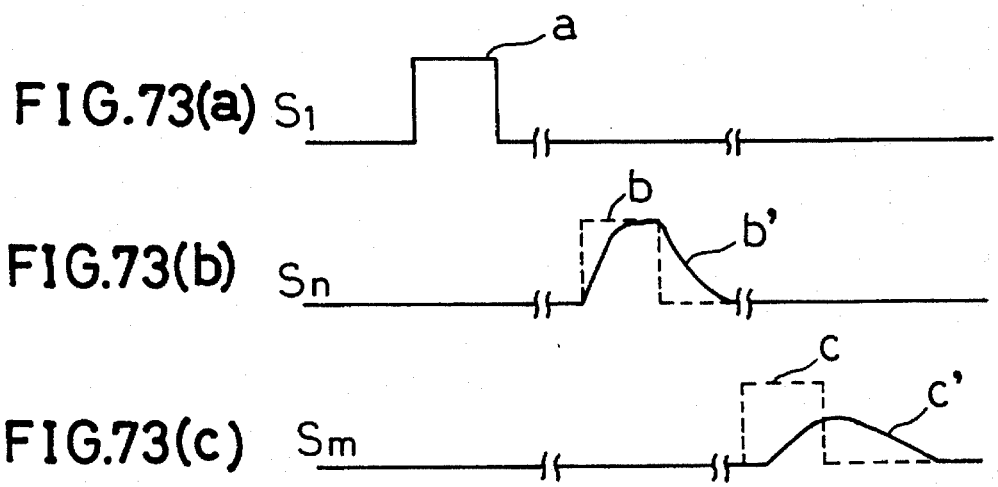
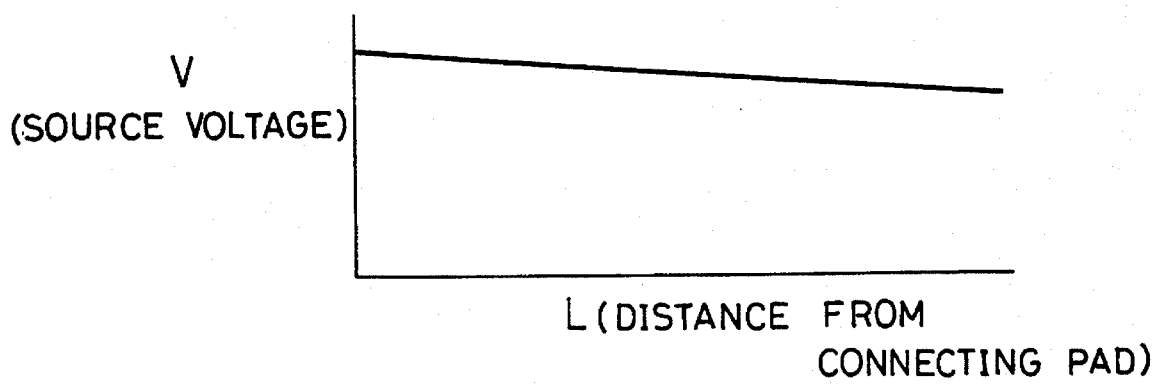

SEMICONDUCTOR DEVICE

FIELD OF THE INVENTION

The present invention relates to a semiconductor device which is represented by an image display unit of a monolithic type driver where a semiconductor active device circuit and electrically conductive lines, such as a power source line for supplying source power to the semiconductor active device circuit or a signal line for inputting a signal to the semiconductor active device circuit, are mounted or formed on one substrate.

BACKGROUND OF THE INVENTION

Most image display units having picture elements arranged so as to form a matrix, which are represented by liquid crystal display units provided with variety of circuits having prescribed functions such as a driver circuit for driving the display units and a controller circuit for controlling the driver circuit. The arrangement and size of these circuits vary with the configuration of the image display units, but these circuits are indispensable to visualize information according to all kinds of media such as TV. Here, the description will be given of the arrangement of a liquid crystal display unit, particularly an active matrix-type liquid crystal display unit.

The above-mentioned liquid crystal display unit is formed with a scanning signal line crossing a data signal line on the surface of a substrate which is a member of a liquid crystal display (LCD), and picture elements with a composition where the liquid crystal is mounted between a picture element electrode and a counter electrode is formed in the vicinity of an intersection of the respective signal lines. These picture elements which are arranged so as to form a matrix constitutes a picture element section. Each picture element is driven by a picture element driving element such as a thin film transistor (hereinafter, referred as TFT) which is formed in the vicinity of the intersection of the scanning signal line and the data signal line.

Two kinds of drivers are used as the driver circuit of the liquid crystal display unit: (1) a data driver also referred as a source driver, which receives a video signal and which samples the signal so as to output sampled image data obtained during one horizontal scanning period, in other words, in one horizontal line period; and (2) a scanning driver also referred as a gate driver, which specifies a storing picture element of the image data transmitted to the picture element section. Although each arrangement in the drivers varies with specifications of liquid crystal displays, the data driver is consisted of, for example, a shift register, a sampling circuit, a transfer circuit, an output buffer, etc., and the scanning driver is consisted of, for example, a shift register, a level shifter, an output buffer, etc.

As an example, the arrangement and operation of the data driver will be described referring to FIGS. 66 through 69. Here, FIG. 66 is a block diagram of a typical data driver adopted a line successive scanning system which is used for a liquid crystal display unit adopted an active matrix, FIG. 67 is an example of a timing chart of each section in FIG. 66, FIG. 68 is a block diagram of the data driver adopted a point successive scanning system, and FIG. 69 is an example of a timing chart of each section in FIG. 68.

As shown in FIG. 66, in the data driver adopted the line successive scanning system, a clock signal (hereinafter, referred as CLP) and a start signal (hereinafter, referred as STP) are inputted into a sampling signal generating circuit 101 in the data driver. For example, if a number of the data driver outputs is N, the sampling signal generating circuit 101 includes the shift register circuit with N steps. The STP, which starts sampling data of one horizontal scanning period, is inputted to the sampling signal generating circuit 101 so that sampling pulses $C_1$ to $C_N$ are outputted from each output section of the circuit 101 in accordance with a timing of the CLP. A video signal is sampled in a sampling circuit 102 by the sampling pulses $C_1$ to $C_N$ outputted from the sampling signal generating circuit 101, and the sampled signal data $Z_1$ to $Z_N$ are successively written to a sampling capacitor. The signal data of one horizontal scanning period written to the sampling capacitor are outputted from a transfer circuit 103 through an output buffer 104 to a data signal line based upon a transfer signal (hereinafter, referred as TRF). The data of one horizontal scanning period are stored into a predetermined picture element of the liquid crystal display panel by applying a scanning pulse from a scanning driver to a scanning signal line in accordance with a data transfer timing to the data signal line.

Furthermore, while the signal data are being transferred to the liquid crystal display, the video signal of next one horizontal scanning period are being sampled. Then, before the TRF signal, which transfers the newly sampled data to an output buffer 104, is inputted into the transfer circuit 103, a discharge signal (hereinafter referred as DIS) is applied to the output buffer 104, and the former signal data are deleted from the data signal line.

Meanwhile, in a data driver which adopts a point successive scanning system, as shown in FIG. 68, the video signal is sampled in accordance with the sampling pulses $C_1$ to $C_N$ outputted from the sampling signal generating circuit 101 in like manner of the data driver which adopts the line successive scanning system. However, the sampled signal is immediately transferred to the data signal line without being written to the sampling capacitor. The data of one horizontal scanning period are stored in predetermined picture elements of the liquid crystal display by applying the scanning pulse from the scanning driver to the scanning signal line in accordance with a timing of the data transfer to the data signal line in similar manner as the above.

Here, in the point successive scanning system, since as to a picture element where the signal data whose sampling timing is last in one horizontal scanning period are stored, the time from a point where the signal data are outputted to the data signal line to a period the scanning pulse goes OFF is short, when carrier mobility of a picture element driving element as an active device is low, a charging time to an picture element is insufficient and the signal data cannot be written sufficiently. Therefore, the point successive scanning system inevitably requires an active device whose carrier mobility is high.

In general, in the line successive scanning system, an amorphous silicon thin film transistor (hereinafter, referred as a-SiTFT) is used as the active device in the liquid crystal display unit, and in the point successive scanning system, a polycrystal silicon thin film transistor (hereinafter, referred as p-SiTFT) whose carrier mobility is higher than that of a-SiTFT is used.

The driver circuit (the data driver or the scanning driver) is connected to a substrate where the picture element section has been formed by generally using a TAB (tape automated bonding) method. In this method, the connection is made by gang-bonding a driver LSI (large scale integration) as the driver circuit to a flexible tape and by, for example, thermocompression bonding the flexible tape to a glass substrate which is included in the liquid crystal display panel.

However, in recent years, as a liquid crystal display unit are highly refined, its picture element pitch becomes narrower. As a result, a picture element pitch, which is less than a connection limit pitch of the above TAB, is required, and a so-called COG (chip on glass) method where a driver LSI is directly mounted on the glass substrate of the liquid crystal display is used.

In addition, in the case where the p-SiTFT is used as the active device, its carrier mobility $\mu$ is obtained as $\mu \geq 5$ $cm^2/V \cdot sec$. As a result, since the carrier mobility $\mu$ is 10 to 1000 times higher than that of a-SiTFT, the picture element section and the above-mentioned driver circuit can be monolithically formed on the glass substrate of the display panel.

As mentioned above, when the driver circuit is directly mounted on the glass substrate by the COG or is monolithically formed on the glass substrate, in the case where the driver circuit is mounted on the glass substrate, it is inevitable to wire not only the scanning signal line and the data signal line but also a power source line for supplying electric power from external power supply to the driver circuit and a plurality of signal lines 152 . . . (see FIG. 70) for inputting a clock signal, a start signal, a video signal, etc. to the driver circuit.

Here, the reference symbols S ($S_1$, $S_2$ . . . ) of FIG. 70 represent a shift register circuit of the sampling signal generating circuit 101, and the reference numerals 102a . . . of FIG. 70 represent the sampling switches of the sampling circuit 102.

If wiring material Ta or TaNx, which is used for conventional a-SiTFT-LCD, is used as wiring material of the power source line and the signal line 152, an image quality differs on the right end and on the left end of the screen, thereby arising a problem such as the lowering of the display characteristic, etc.

This problem is synergistically arisen because of the following two reasons.

Namely, one is a material characteristic that in the case where a resistivity $\rho$ of the Ta or the TaNx is 25 to 30 $\mu\Omega \cdot cm$, and the same wiring material is used for wiring, if the wiring width is 100 $\mu m$ and the film thickness is 300 nm, the wiring resistance becomes $100\Omega$ per centimeter.

As shown in FIG. 71, the other is that each signal line 152 such as a start signal line 152 for inputting the start signal to the shift register circuit S($S_1$, $S_2$ . . . ) and a video signal line 152 for inputting the video signal to the sampling switch 102a . . . is connected, and one connecting pad 153, which is used for the connection with an external circuit substrate, is provided for each input signal. Here, the reference numeral 155 of FIG. 71 represents the substrate.

The concrete description will illustrate a video signal as the signal line 152. In a liquid crystal display unit whose diagonal is 25 cm or so, when the video signal line is connected from end to end in a crosswise direction, its wiring length becomes approximately 20 cm and wiring resistance of the signal line becomes 2 $k\Omega$. Further, even in a liquid crystal display unit whose diagonal is 13 cm or so, the wiring resistance of the signal line becomes 1 $k\Omega$. When a video signal is transmitted through such a signal line having high resistance, impedance increases. As shown in FIG. 72, as a signal, which has a band A in a connecting pad 153 as a signal input terminal, is transmitted through the signal line 152, its band characteristic becomes worse A→B→C, and at the end of the signal line 152, the signal shows a band characteristic like D. Then such a phenomenon causes the trouble that an image quality greatly differs on the right end and on the left end of the screen, thereby arising a problem that images having uniform quality cannot be displayed.

In addition, if this phenomenon occurs in the start signal line 152 or the clock signal line 152 for inputting the start signal to each shift register circuit S ($S_1$, $S_2$ . . . ) of the sampling signal generating circuit 101, or a line for transmitting a shift pulse to a next step in the shift register circuit, as shown in FIGS. 73(a) through 73(c), a waveform of the sampling signal outputted from the sampling circuit 102 is changed from its early state such that its rising part and falling part become duller as the signal is transmitted through the steps of the sampling signal generating circuit 101. In other words, a waveform deterioration occurs. Namely, the sampling signal outputted from the shift register circuit $S_1$ on the first step of the sampling signal generating circuit 101 is represented by a waveform a in FIG. 73(a), but as shown in FIG. 73(b), the sampling signal outputted from the shift register circuit Sn on the "n"th step is represented by a waveform b' which is obtained because of the deterioration of the primary waveform b. Furthermore, as shown in FIG. 73(c), the sampling signal outputted from the shift register circuit Sm on the "m"th step is represented by a waveform c' which is obtained because of the deterioration of the primary waveform c. Therefore, there arises a situation that the sampling phase is displaced from its regular position or the sampling signal is not generated, thereby arising a problem that images of good quality cannot be displayed.

Here, Japanese Laid-Open Patent Publication No. 398385/191992 (Tokukaihei 4-348385) has disclosed an art which compensates for a waveform deterioration of a signal data by detecting an electric current flowing to a display panel and by controlling an applied voltage to the display panel according to an amount of the electric current. However, the art disclosed in the above publication is especially applicable to an image display unit adopted a simple matrix driving, but is not applicable to a waveform deterioration caused by a monolithic or COG (chip on glass) driver in, for example, an image display unit having an active device adopted an active matrix driving system, namely an irregular operation in the circuit of the device.

In addition, the above-mentioned increase in impedance (wiring resistance) may occurs in not only the signal line 152 but also the power source line. As shown in FIG. 74, as the distance from the connecting pad increases, the source voltage lowers. For example, even if a source current is 1 mA, when the current flows through the power source line of 2 $k\Omega$, the source voltage is lowered 2 V. Such a fall of the source voltage causes irregular operations including non-operation of each circuit connected to the power source line, fluctuation in the signal level, etc., thereby causing a fall of the display characteristic.

As the size of the screen in the liquid crystal display panel becomes larger, the above-mentioned problems surely become more conspicuous.

As shown in FIG. 75, in order to prevent the wiring impedance from increasing, it has been conventionally considered to enlarge the wiring width of the signal line 152'. In this case, the wiring resistance can be limited to about ⅒ by, for example, changing the wiring width of 100 $\mu m$ to ten times, namely, 1 mm. However, in this manner, for example, in the case where the impedance of the signal line 152' is further lowered, the signal line 152' needs to be thickened more. As a result, as shown in FIG. 76, when the connecting pads 153 . . . are arranged on the periphery of the substrate 155 so as to make a connection with an external circuit substrate, an area of a non-picture element section relative to the picture element on the display unit becomes larger with an increase in areas of the wiring and the connecting pads. In addition, there arises disadvantages such as an increase in overlapping capacity of wires depending upon a case, an increase in a signal leak between wirings.

In addition, in order to prevent the wiring impedance from increasing, it is considered that aluminum (Al) or an aluminum alloy (Al-Si) is used as wiring material. For example, if Al-Si whose resistivity ρ equals 5 μΩ·cm (ρ=5 μΩ·cm) is used as the wiring material so as to be wired with the aforementioned wiring width and film thickness, the wiring resistance is limited to about ⅙ of that obtained in the case where Ta or TaNx is used. For example, when the above Al-Si is applied to an image display unit whose diagonal is 25 cm or so, the total wiring resistance becomes approximately 330 Ω, and when applied to an image display unit whose diagonal is 13 cm or so, becomes 170 Ω. In this case, if the same load condition (source current=1 mA) as the above is taken into consideration, in the case where the wiring material is used in an image display unit whose diagonal is 25 cm, a voltage drop due to the wiring material can be limited to about 330 mV.

However, it is a rare case that the source current is constantly kept 1 mA, so the source current fluctuate at a high frequency by an ON/OFF operation of each active device such as a transistor which is connected to the power source line, and as shown in FIG. 77, a voltage waveform which fluctuates at a high frequency is shown in a certain point of the power source line. In this case, if it is considered that the ratio of the fluctuation in the signal data ($Z_1$ to $Z_N$ of FIG. 66 or FIG. 68) to the fluctuation in voltage is 1:1, in a certain picture element on the screen, for example, the brightness at the time of the maximum fluctuation in voltage differs greatly from that at the time of the minimum fluctuation in voltage. The more a number of active elements to be turned ON/OFF is or the higher the impedance of the power source line is, the more outstanding this phenomenon is.

Here, the description discusses the influence of the fluctuation in source voltage on the signal data. However, the fluctuation in source voltage, that is, a high-frequency noise generated in the power source line has influence on not only the signal data but also the other signals such as the clock signal. Furthermore, the high-frequency noise surely causes not only the fluctuation in a voltage level of a signal but also the other elements such as a response time (operating speed) and a faulty operation of a circuit.

In order to limit the high-frequency noise, in the conventional art, as shown in FIG. 78, a capacitor 164 is mounted on the outside of a display substrate 155 where picture elements and a power source line 161 are formed, for example, on a flexible substrate 163 so that the capacitor 164 is connected to the power source line 161. Although this method is applicable to the purpose in reducing high-frequency noises generated on the outside of the display substrate 155, it is not inadequate to reduce high-frequency noises generating in the display substrate 155 including the fluctuation in voltage caused in accordance with the fluctuation in electric current caused by turning on/off each active device connected to the power source line 161.

The above description illustrated the image display unit represented by the liquid crystal display unit. The above-mentioned problems, such as the fluctuation in a signal level which causes an irregular operation of a circuit, a signal delay due to a signal waveform deterioration, an increase in high-frequency noises, are related to semiconductor devices where circuits including a semiconductor active device and long electrically conductive lines, such as a power source line for supplying a source power to the circuits, a signal line for inputting a signal to the circuits, are mounted on one substrate.

SUMMARY OF THE INVENTION

It is an object of the present invention to provide a semiconductor device provided with a circuit including a semiconductor active device and an electrically conductive line for supplying a source voltage or a signal to the circuit formed on one substrate, capable of reducing a fluctuation in a signal level, delay of a signal and generation of a high-frequency noise, and of reducing an occurrence of an irregular operation of the circuit greater than before.

In order to accomplish the above object, the semiconductor device of the present invention, is characterized by including:

a substrate;

an active device circuit including a semiconductor active device, the active device circuit having a plurality of input terminals, the active device circuit being formed on the substrate;

an external connection terminal for making an electrical connection with an external circuit aside from the semiconductor device, the external connection terminal being formed in the vicinity of an edge of the substrate; and an electrically conductive line for making an electrical connection between each input terminal of the active device circuit and the external connection terminal, the electrically conductive line being formed on the substrate, wherein the electrically conductive line consists of a plurality of divided lines whose wiring resistance has a predetermined value or less.

With the above arrangement, since the electrically conductive line is divided into a plurality of lines, a length of the electrically conductive line such as a signal line, power source line becomes short, thereby making it possible to lower its wiring resistance. Therefore, the fluctuation in the signal level and a drop in the source voltage can be controlled. In the case where the semiconductor device is an image display device such as a liquid crystal display unit, there does not arise a situation that an image quality of a right edge on a screen is different from that of a left edge by adjusting the wiring resistance of each divided line so as to obtain uniform resistance. As a result, an image of uniform quality can be displayed, thereby improving the display characteristic.

In addition, in order to accomplish the above object, another semiconductor device of the present invention, is characterized by including:

a substrate;

an active device circuit including a semiconductor active device, the active device circuit being formed on the substrate;

a signal line for transmitting a basic signal, which takes at least 2 values inputted from an outside of the semiconductor device thereinto, to the active device circuit, the signal line being formed on the substrate; and a waveform improvement signal generating circuit for generating a waveform improvement signal which is obtained by adding a waveform deterioration response signal component to a basic signal transmitted through the signal line so as to supply the waveform improvement signal to the active device circuit, wherein the waveform improvement signal generating circuit obtains the following relations:

$$|v| < |V|; \quad (1)$$

and $$f \leq F, \quad (2)$$

where v is a maximum amplitude of a basic signal component in the waveform improvement signal, V is a maximum amplitude of a part including the waveform deterioration response signal component, f is a frequency of the basic signal component and F is a frequency of the waveform deterioration response signal component.

With the above arrangement, since the relation between the maximum amplitude v of the basic signal component and the maximum amplitude V of the portion including the waveform deterioration response signal component is represented by the formula: $|v|<|V|$, it is possible to detect the waveform deterioration response signal component from the basic signal component. Furthermore, since the relation between the frequency f of the basic signal component and the frequency F of the waveform deterioration response signal component is represented by the formula: $f \leq F$, the waveform deterioration signal component can be suitably set to the basic signal component.

When the waveform improvement signal which has been preliminarily produced in the above manner is supplied to the active device circuit, the waveform deterioration at the leading edge or the trailing edge of the basic signal, or both of these is controlled. Then, their steepness is maintained, thereby making it possible to prevent a phase shift. In other words, delay of the basic signal to be transmitted through the signal line is preventable and a faulty operation of the active device circuit is avoidable. In the case where the semiconductor device is an image display device such as a liquid crystal display unit, for example, timing delay of a sampling pulse can be prevented, and a desired video signal can be sampled at a regular timing, thereby making it possible to display an image of good quality.

In addition, in order to accomplish the above object, another semiconductor device of the present invention is characterized by including:

a substrate;

an active device circuit including a semiconductor active device, the active device circuit being formed on the substrate;

a power source line for supplying a source voltage from the outside of the semiconductor device to the active device circuit, the power source line being formed on the substrate;

a capacity forming electrode having a reference potential, the capacity forming electrode being arranged so that at least one portion of the electrode is opposite to the power source line; and a capacity forming dielectric arranged between the power source line and the capacity forming electrode which are arranged opposite to each other.

With the above arrangement, a capacitor whose electrode constituted of the power source line and the capacity forming electrode is formed, and a CR filter is equivalently formed by resistance in the power source line which is treated as a distributed constant circuit and the capacitor, thereby lowering the impedance of the power source line. Then, the CR filter, namely, a low-pass filter reduces a high-frequency noise, which is generated in the power source line, including a fluctuation in a voltage caused by a fluctuation in an electric current involved by an ON/OFF operation of each semiconductor active device which is connected to the power source line. As a result, this arrangement can reduce an occurrence of an irregular operation of the active device circuit more greatly than before.

The present invention is applicable to semiconductor devices including an image display device such as a liquid crystal display unit, but in the case where the present invention is applied to an image display device having a pair of substrates which are arranged opposite to each other, the power source line may be formed on one substrate and the capacity forming electrode may be formed on the other substrate. For example, in the case where the present invention is applied to a liquid crystal display unit, liquid crystal can be used as a capacity forming dielectric which is arranged between the power source line and the capacity forming electrode. Moreover, if liquid crystal for display and liquid crystal to be used as the capacity forming dielectric are separated by a partition member, the liquid crystal to be used as the capacity forming dielectric can be distinguished from the liquid crystal for display. Therefore, the liquid crystal which is used as the capacity forming dielectric can be selected without requiring a condition that the liquid crystal is suitable for display. Furthermore, when the liquid crystal for the capacity formation is separated from that for display by the partition member, the liquid crystal for display is not deteriorated due to application of a d.c. voltage.

In addition, in the case of a semiconductor device with an arrangement that a space between a pair of substrates is sealed by a sealing member, for example, a liquid crystal display unit where liquid crystal is sealed between the substrates, an image display device such as a plasma display panel where gas is sealed between the substrates, an effective surface area ratio of the display device can be improved by using the capacity forming dielectric also as the sealing member.

Here, the semiconductor device of the present invention can be produced by monolithically forming an active device circuit on a substrate, or forming an active device circuit as a semiconductor chip so as to mount the semiconductor chip on a substrate. In the case of an arrangement that the semiconductor chip is mounted on the substrate by COG, etc., a power source line for supplying a power to the semiconductor chip is formed on the substrate, and a power supply line for supplying a power to the semiconductor active device is formed in the semiconductor chip. In this case, a high-frequency noise in all the substrates in the semiconductor device can be reduced by forming the CR filter in the semiconductor chip mounted on the substrate in a like manner of the above.

For a fuller understanding of the nature and advantages of the invention, reference should be made to the ensuing detailed description taken in conjunction with the accompanying drawings.

BRIEF DESCRIPTION OF THE DRAWINGS

FIG. 22 is an explanatory drawing which shows another forming condition of the connecting pad for divided lines on the substrate.

FIG. 23 is an explanatory drawing which shows another forming condition of the connecting pad for divided lines on the substrate.

FIGS. 24(a) and 24(b) are explanatory drawings which show another forming conditions of the connecting pad for divided lines on the substrate.

FIGS. 25(a) and 25(b) are explanatory drawings which show configurations of the connecting pads for divided lines: FIGS. 25(c), 25(d) and 25(e) are explanatory drawings which show configuration of portions where a line is drawn from the connecting pad for divided lines.

FIG. 26 is a block diagram which shows a constitution of a main section of a liquid crystal display unit according to the fourth embodiment of the present invention.

FIGS. 27(a) through 27(c) show waveforms of all kinds of signals in the liquid crystal display unit: FIG. 27(a) is a waveform diagram of a source clock; FIG. 27(b) is a waveform diagram of a responsibility improvement signal; and FIG. 27(c) is a waveform diagram of a improvement clock signal.

FIG. 28 is a circuit diagram of a differentiating circuit shown in FIG. 26.

FIG. 33(a) shows the improvement clock signal obtained by adding a sine wave signal as the responsibility improvement signal to the source clock signal; FIG. 33(b) shows the improvement clock signal obtained by adding a pulse wave signal to the source clock signal; FIG. 33(c) shows the improvement clock signal obtained by adding a responsibility improvement signal to a position shifted from the rising and the falling sections of the source clock signal; and FIG. 33(d) shows the improvement clock signal obtained by adding two responsibility improvement signals to one pulse of the source clock signal.

FIGS. 35(a) through 35(c) show waveforms of all kinds of signal in the liquid crystal display unit: FIG. 35(a) is a waveform diagram of the source clock signal; FIG. 35(b) is a waveform diagram of a differentiating circuit input signal; and FIG. 35(c) is a waveform diagram of a differentiating circuit output signal.

FIG. 36 is a block diagram which shows another example of a constitution shown in FIG. 34.

FIGS. 39(a) though 39(e) show waveforms of all kinds of signals in the liquid crystal display unit: FIG. 39(a) is a waveform diagram of the source clock signal; FIG. 39(b) is a waveform diagram of an input signal to the driver circuit; FIG. 39(c) is a waveform diagram of the responsibility improvement signal; FIG. 39(d) is a waveform diagram of the improvement clock signal: and FIG. 39(e) is a waveform diagram of another responsibility improvement signal.

FIG. 40 is a block diagram which shows another example of a constitution shown in FIG. 38.

FIGS. 73(a) through 73(c) show a variation in a waveform of a sampling signal in the conventional liquid crystal display unit: FIG. 73(a) is a waveform diagram of a source signal; FIG. 73(b) is a waveform diagram which shows a state that a waveform deterioration occurs; and FIG. 73(c) is a waveform diagram which shows a state that the waveform deterioration becomes worse.

FIG. 74 is an explanatory drawing which shows a variation in a voltage of the power source line in the conventional liquid crystal display unit.

DESCRIPTION OF THE EMBODIMENTS

First Embodiment

Referring to FIGS. 1 through 14, the following description will discuss the first embodiment of the present invention.

The present embodiment will illustrate an active matrix-type liquid crystal display unit adopted a driver monolithic system as an image display unit, especially a unit where means of the present invention is taken on a video signal line for inputting a video signal to a sampling circuit of a data driver.

Figure 2:
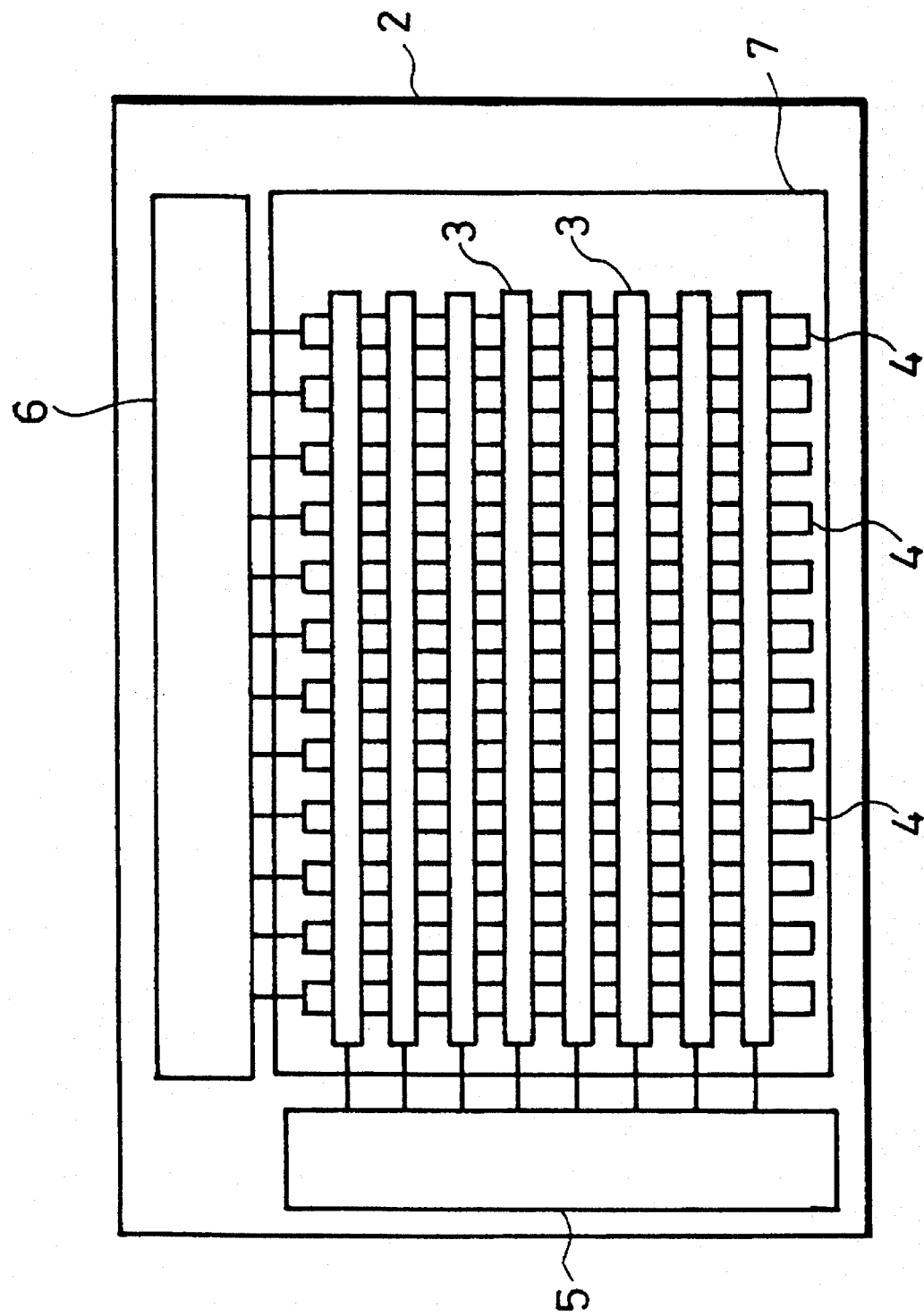
FIG. 2 is a plan view of a substrate on which a scanning signal line, a data signal line, a scanning driver section, a data driver section, etc. are formed in the liquid crystal display unit.

The liquid crystal display unit has a liquid crystal display panel consisted of a pair of substrates, and as shown in FIG. 2, scanning signal lines 3 . . . , data signal lines 4 . . . , a scanning driver 5 for driving the scanning signal lines 3 and a data driver 6 for driving the data signal lines 4 are installed on one substrate 2 in a pair of the substrates. The scanning signal lines 3 . . . and the data signal lines 4 . . . cross each other, and thin film transistors (TFT) 16 which are a picture element driving element and picture element electrodes 15 where supply of electric charges is controlled by the TFTs 16 are provided in each vicinity of the intersections (See FIG. 3). The picture element electrodes 15 . . . form picture elements by mounting liquid crystal in a clearance with the other substrate, not shown. The picture elements are arranged so as to form matrices and consist a picture element section 7. The picture elements are used to control a light transmitting state of liquid crystal by using a voltage generated between the respective electrodes so as to display images.

Figure 3:
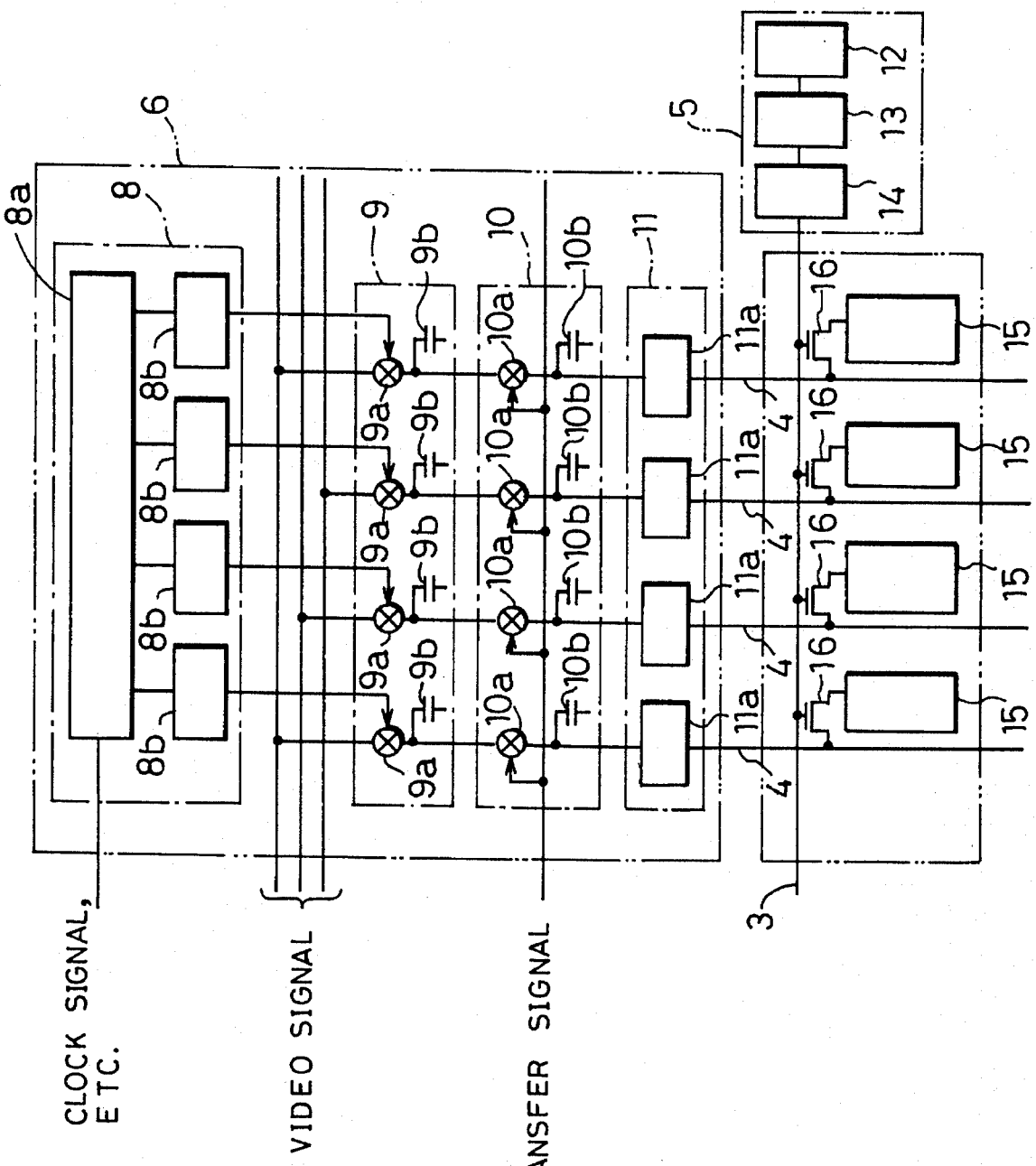
FIG. 3 is a circuit diagram which shows each circuit section formed on the substrate.

As shown in FIG. 3, the data driver 6 installed on the substrate 2 is mainly consisted of four circuit sections: a sampling signal generating circuit section 8; a sampling circuit section 9; a transfer circuit section 10; and a buffer circuit section 11.

Figure 4:
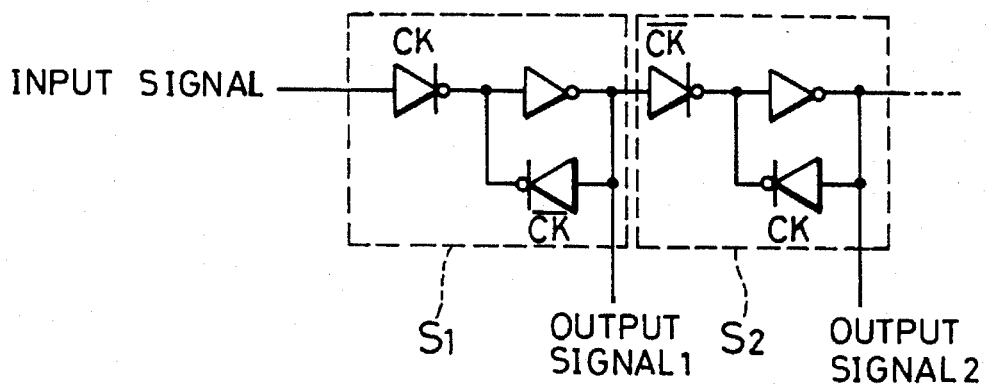
FIG. 4 is a circuit diagram of a shift register circuit which constitutes one of the circuit sections formed on the substrate.
Figure 5:
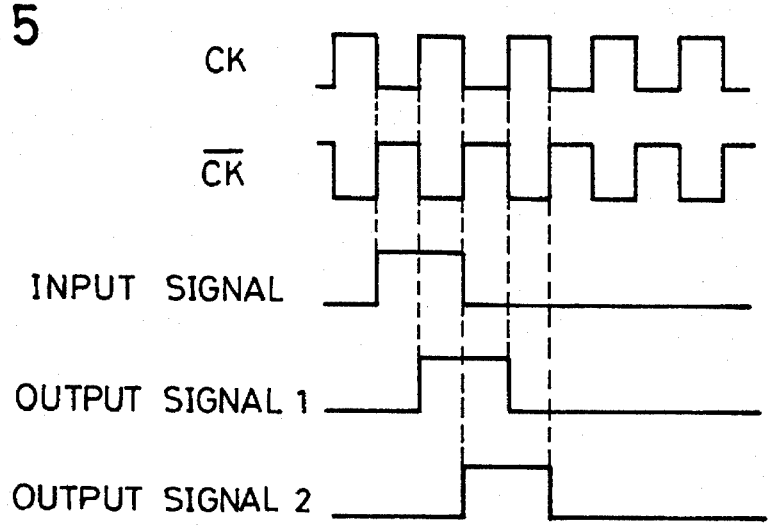
FIG. 5 is a timing chart which shows a timing of an input/output signal in the shift register circuit.
Figure 6:
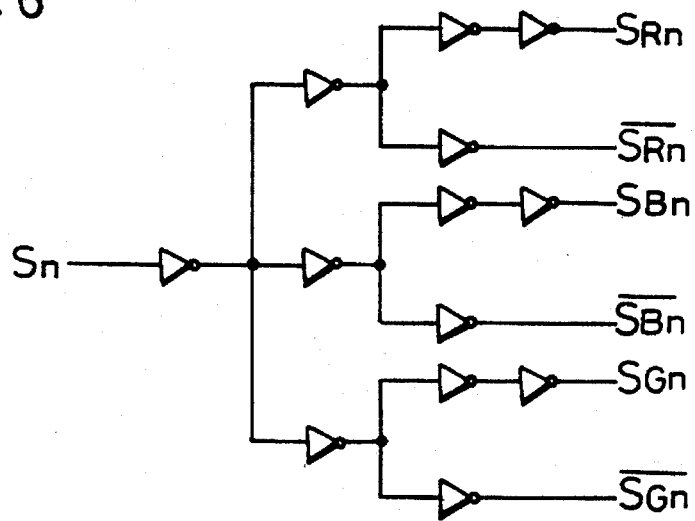
FIG. 6 is a circuit diagram of a buffer circuit which constitutes one of the circuits formed on the substrate.

The sampling signal generating circuit section 8 includes a shift register circuit section 8a and a plurality of buffer circuits 8b . . . As shown in FIG. 4, the shift register circuit section 8a is consisted of a plurality of shift register circuits S ($S_1$, $S_2$ . . . ) where a start signal is inputted and outputs sampling signals which are pulse signals inputted at predetermined intervals so that the sampling circuit section 9 successively samples the video signals. The timing of input and output is shown in FIG. 5. As shown in FIG. 6, the buffer circuits 8b . . . are constituted of a plurality of inverters, and is needed to drive the sampling circuit section 9 of a large-transistor size in accordance with an output signal from the shift register circuit section 8a of a small-transistor size. As getting closer towards the output sections, the transistor size of the inverters is set to become larger.

As shown in FIG. 3, the sampling circuit section 9 includes a plurality of sampling switches 9a . . . and sampling capacitors 9b . . . for sampling the video signal. The sampling switches 9a . . . are used to store information of the video signal into the respective sampling capacitors 9b . . . and each ON/OFF operation of the sampling switches is controlled in accordance with the sampling signal outputted from the sampling signal generating circuit 8.

The transfer circuit section 10 includes transfer switches 10a . . n. and hold capacitors 10b . . . , and the information stored in the sampling capacitor 9b is transmitted to the hold capacitors 10b . . . in accordance with the transfer signal to be inputted.

The buffer circuit section 11 includes a plurality of buffer circuits 11a . . . Each output from the buffer circuit section 11 is supplied to the source of the TFTs 16 . . . shown in FIG. 3 through the data signal lines 4 as the data signal.

The picture element electrode 15 is connected to drains of each TFT 16. Further, gates of each TFT 16 are connected to the scanning signal line 3, and the scanning signal, which is outputted through a shift register circuit 12, a level shifter circuit 13 and a buffer circuit section 14 consisting the scanning driver 5 in this order, is inputted thereto. Incidentally, the FIG. 3 is a drawing which schematically shows each circuit section.

Figure 7:
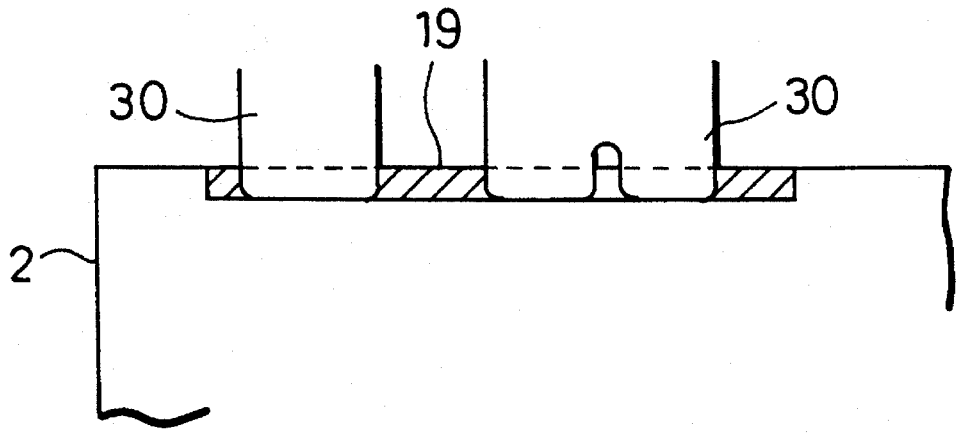
FIG. 7 is an explanatory drawing which shows a connecting condition between a connecting pad for divided lines and a flexible substrate provided on the edge of the substrate.

Here, referring to FIGS. 1, 7 and 8, the detailed description will be given of a wiring state of the video signal lines for inputting the video signal to a plurality of sampling switches 9a . . . in the sampling circuit section 9, a configuration of a connecting pad 19 (for connecting terminal) divided lines to be used for connection with a flexible substrate (external circuit substrate) provided at the edge side of the substrate, etc.

Figure 1:
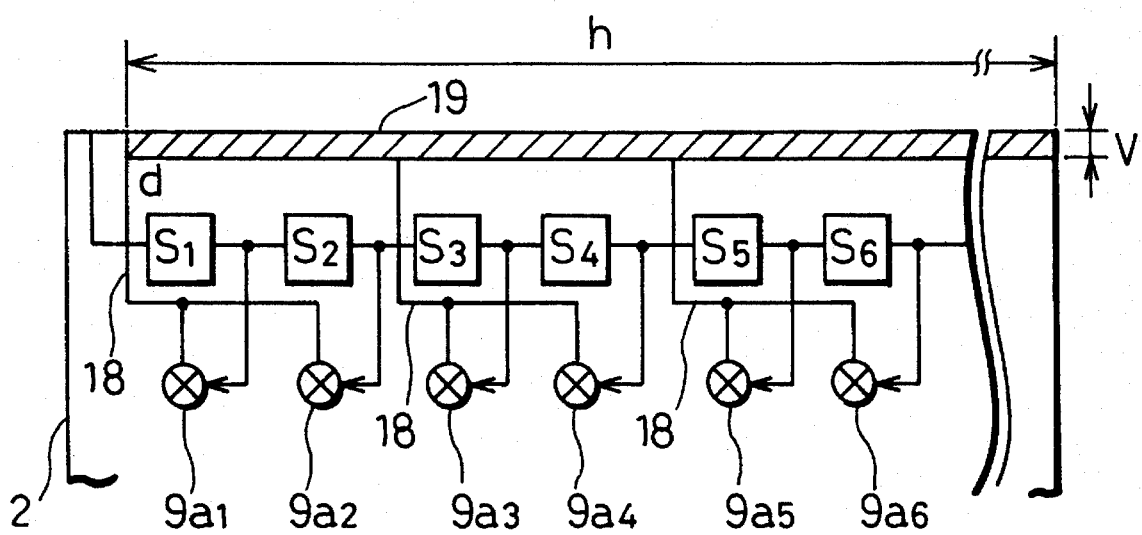
FIG. 1 is an explanatory drawing which shows a dividing condition of a video signal line and a configuration of a connecting pad for divided lines to which the video signal line is connected in a liquid crystal display unit according the first embodiment of the present invention.

As shown in FIG. 1, the sampling switches 9a . . . in the sampling circuit section 9 are divided into N groups of two switches each, for example, ($9a_1$ and $9a_2$), ($9a_3$ and $9a_4$) . . . . Then, divided video signal lines 18 . . . are connected to the respective groups. One end of each divided video signal line 18 . . . is connected to a connecting pad 19 (for divided lines provided on the edge side of the substrate to be used for connection with the flexible substrate. The conventional one video signal line is divided and is formed as N divided video signal lines 18 . . . in order to shorten the length of the video signal line and lower wiring resistance. For example, if N is 10, the wiring resistance of the signal line of 2 kΩ which has been mentioned in background of the invention can be lower to approximately 20 Ω.

As a result, the lowering of the wiring resistance can limit increase in the impedance of the video signal line. If the video signal line is divided into N, the increase in the impedance can be limited to about 1/N compared to the conventional video signal line, thereby obtaining low impedance. Incidentally, the dividing number N and a number of sampling switches 9a per group are arbitrary and are appropriately set.

Meanwhile, the connecting pad 19 to which each divided video signal line 18 . . . is installed along the edge of the substrate 2. If the terminal width of the pad 19 in a direction which is parallel with the edge of the substrate is represented by h and the terminal width of the pad 19 in a direction which is perpendicular to the edge of the substrate by v, the connecting pad 19 is set so as to hold a formula h>v. This allows the connecting pad 19 to become a rectangular pad which installed parallel with the edge of the substrate, thereby obtaining a large contact area with the flexible substrate. As a result, even with the arrangement where the video signal line is divided plurally, the impedance of the video signal line can be kept low without deteriorating connecting reliability with the flexible substrate. Here, the connection between the connecting pad 19 and a flexible substrate 30 does not have to cover the whole pad, so as shown in FIG. 7, the connection may be partially made.

However, in the case where fluctuation in the impedance in the area up to input terminals of the respective sampling switches 9a . . . , which are connected to the respective divided video signal lines 18 . . . , is great in each divided video signal line 18 . . . , even if the divided video signal lines 18 . . . are formed so as to lower the impedance of the video signal line, faulty circuit operation may occur. In the case of the video signal, it is applicable to a certain extent as the method for suppressing an uneven display condition, etc. that fluctuation in signal level in nearby picture elements is limited to ±1/32 or less, so it is basically desirable to limit the fluctuation δR in the impedance in the area from the connecting pad 19 to each sampling switch 9a . . . so as to hold a equation δR<±3.1%.

Figure 8:
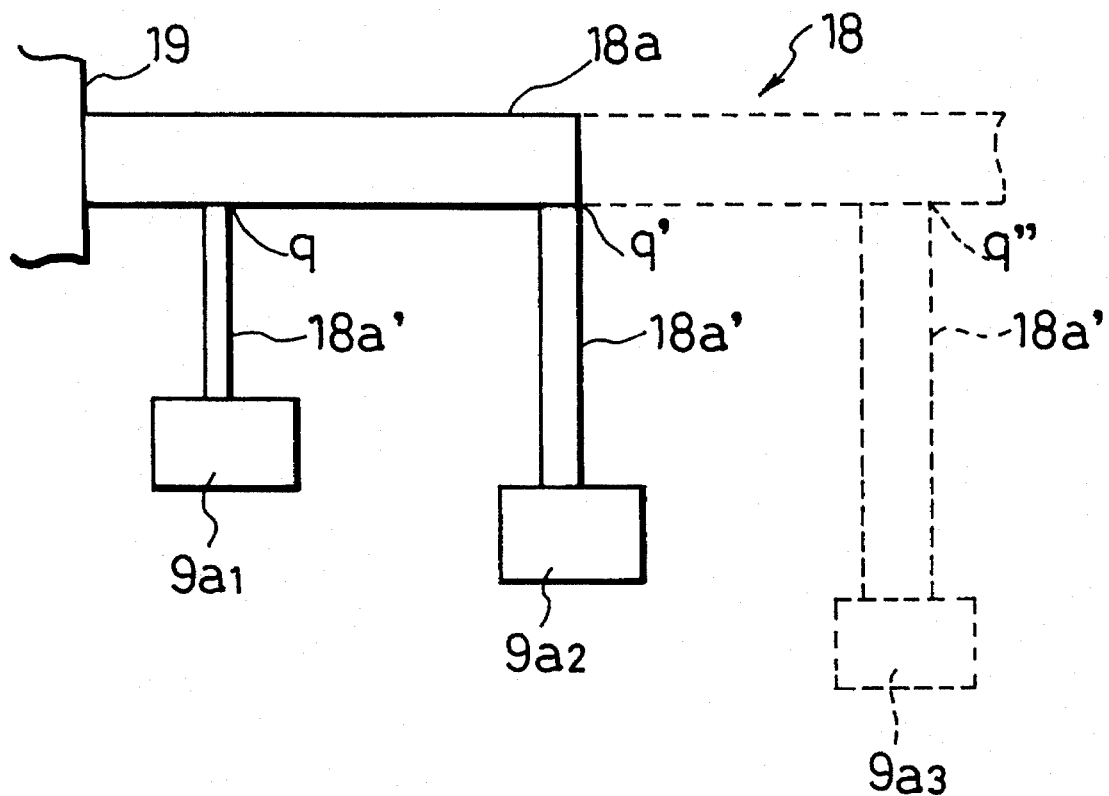
FIG. 8 is an explanatory drawing which shows an arrangement for adjusting impedance of divided video signal lines formed on the substrate so as to obtain uniform impedance.

Therefore, in the present embodiment, as shown in FIG. 8, as junctions q and q' of a main signal line section 18a of the divided video signal line 18 become farther from the connecting pad 19, the line width of branch signal line sections 18a', 18a' . . . branched at the junctions q, q' . . . becomes larger. Namely, as the signal lines are branched at a point that is farther from the connecting pad 19, the wiring resistance is set lower, thereby making the impedance in the area from the connecting pad 19 to each sampling switch 9a . . . uniform so as to control variation in the impedance. Here, the configuration of the divided video signal lines 18 in the case where the sampling switches 9a are divided into groups of three switches or more each is indicated by a broken line in the drawing. In this case, the branch signal line 18a' at the junction q" which is much farther from the connecting pad 19 than the junctions q and q' is formed so as to have larger width than the branch signal line 18a branched at the junction q'.

Figure 9:
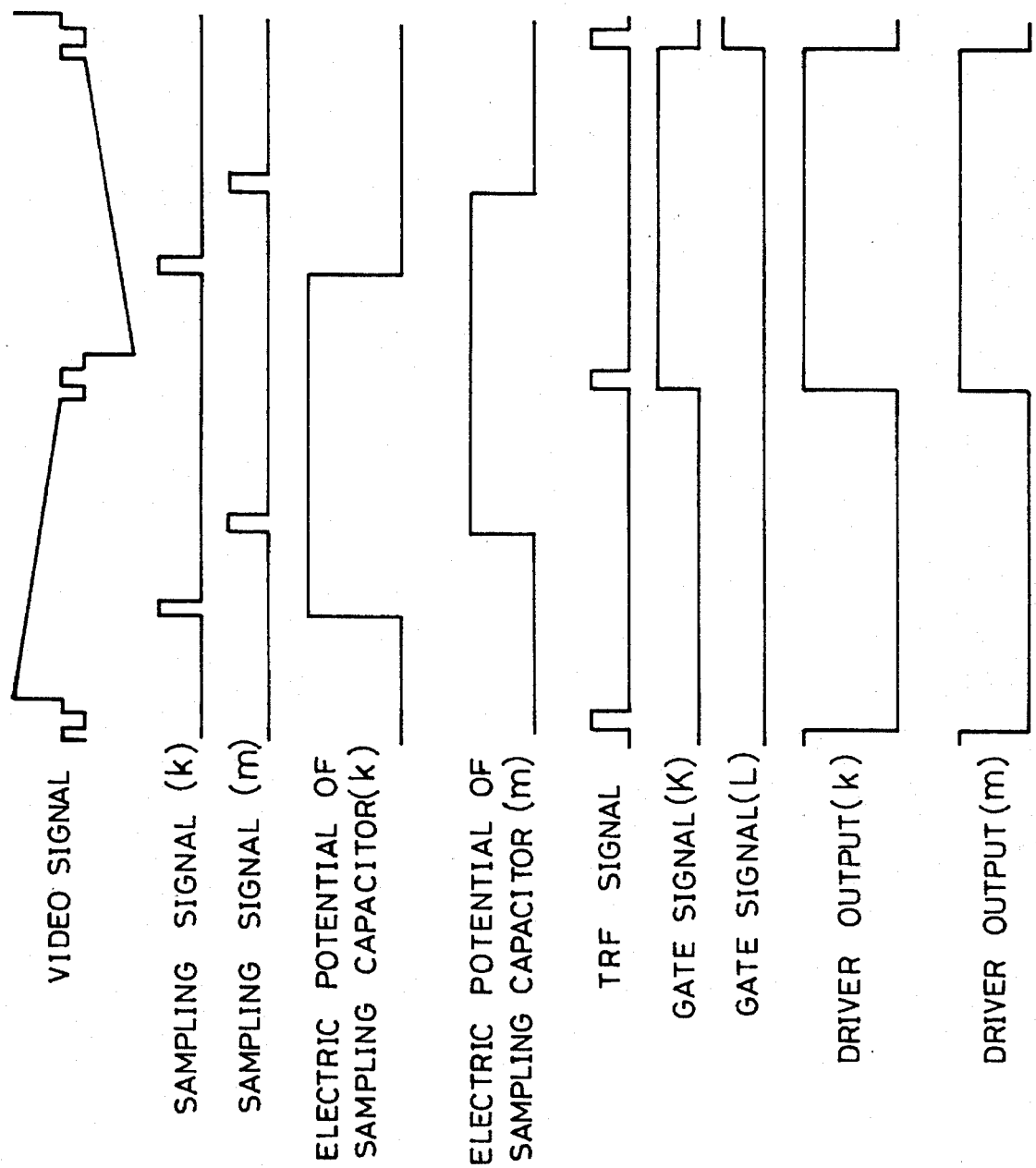
FIG. 9 a waveform diagram which shows all kinds of waveforms of each circuit section in the liquid crystal display unit.

Next, the following description will discuss an operation of the data driver 6 having the above arrangement referring to a waveform diagram of FIG. 9. Here, k and m in the drawing represent signals in each circuit section of the data driver 6 which is connected to the data signal line 4 on the "k"th and "m"th lines, and K and L represent signals in each circuit section of the scanning driver 5 which is connected to the scanning signal line 3 on the "K"th and "L"th lines.

The sampling signals are successively outputted from the sampling signal generating circuit section 8, and when the sampling signals are in "H" state, the respective sampling switches 9a . . . are successively turned on, and information of the video signal is stored into the respective sampling capacitors 9b . . . In this case, since the video signal is inputted through the respective divided video signal lines 18 . . . , it is stored in the sampling capacitors 9b . . . without changing its band characteristic. Moreover, at this time, the respective transfer switches 10a . . . are turned off. Thereafter, when the predetermined sampling time passes, the sampling signals are in "L" state. As a result, the sampling switches 9a . . . are successively turned off again. After the all data signal lines 4 are finished to be sampled, when the transfer signal to be inputted to the transfer switches 10a . . . is in "H" state, the transfer switches 10a . . . are simultaneously turned on so that the information stored in the respective sampling capacitors 9b . . . is transferred to the respective hold capacitors 10b . . . Thereafter, after the predetermined transfer period passes, the transfer signal is in "L" state, and the respective transfer switches 10a . . . are simultaneously turned off again.

As a result, the information stored in the respective hold capacitors 10b . . . is outputted to the respective data signal lines 4 through the buffer circuit section 11 during one horizontal period.

Then a scanning signal (gate signal) outputted from the scanning driver 5 is in "H" state almost simultaneously with the transfer signal, and the TFT 16 is turned on. As a result, the data are written into the picture element so as to be displayed at a good image quality without uneven display condition.

As mentioned above, in the liquid crystal display unit of the present embodiment, since the video signal line for inputting the video signal to a plurality of sampling switches 9a . . . in the sampling circuit section 9, which is a constituent circuit of the data driver 6, is plurally divided so as to be formed as the divided video signal lines 18 . . . one end of which is connected to the connecting pad 19, the length of the video signal line becomes shorter than that of the conventional line, and the signal is inputted through short signal lines into the respective sampling switches 9a . . . This restrains increase in the impedance of the video signal line, thereby lowering the impedance. As a result, the band characteristic of the video signal which passes through the video signal line is not hardly changed, so difference in image quality between the right edge and the left edge on the screen does not occur, thereby providing uniform display.

Figure 10:
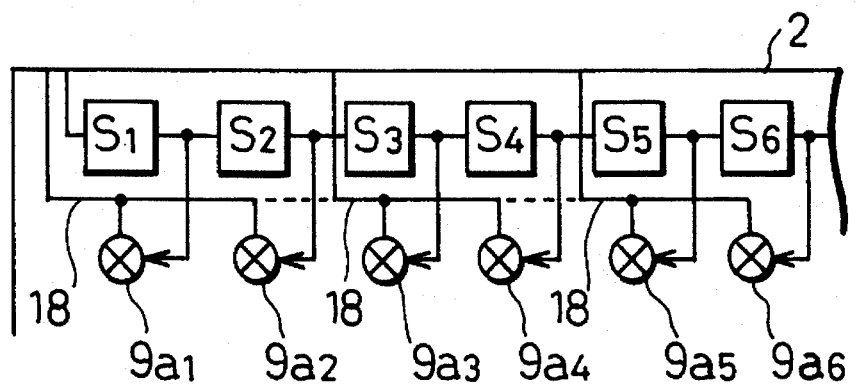
FIG. 10 is an explanatory drawing which shows divided video signal lines connected to a normal connecting pad.

In addition in the present embodiment, the connecting pad 19 to which the divided video signal lines 18 are connected is set so that the terminal width h in a direction which is parallel to the substrate edge of the pad 19 is larger than the terminal width v in a direction which is perpendicular to the substrate edge (h>v), so the contact area with the flexible substrate 30 becomes larger. Therefore, even if the video signal line is divided plurally in order to lower the impedance, and as a result, a number of interfaces with the flexible substrate 30 increases, the connecting dependability is not deteriorated. Namely, as shown in FIG. 10, only with the arrangement that the video signal line is plurally divided, for example, in the case where a dividing number is increased in order to have the lower impedance, a number of connecting pads installed individually increases, so a number of interfaces with the flexible substrate 30 increases. As a result, the connecting dependability is deteriorated and the advantage that the driver monolithic system is adopted is lost, but the above-mentioned arrangement may not cause such problems.

Moreover, in the present embodiment, as the junctions q and q', at which the branch signal line sections 18a'. 18a' are branched in the main signal line section 18a in the divided video signal line 18, are away farther from the connecting pad 19, the line width of the branch signal line sections 18a'·18a' becomes larger. As a result, the impedance in the area from the connecting pad 19 to the respective sampling switches 9a . . . is kept constant and variations in the impedance are controlled. This can restrain the faulty operation of the circuits due to the variations in the impedance of the signal lines in the area from the connecting pad 19 to the input terminals of the respective sampling switches 9a . . . , thereby obtaining the higher display characteristic.

Figure 11:
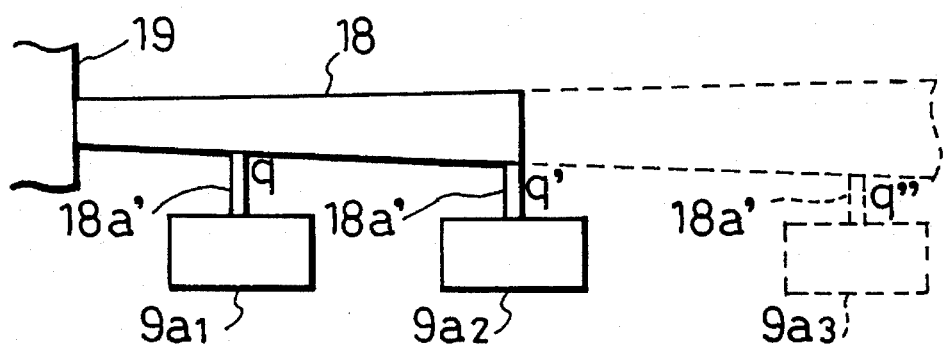
FIG. 11 is an explanatory drawing which shows another arrangement for adjusting the impedance of the divided video signal lines formed on the substrate so as to obtain uniform impedance.
Figure 12:
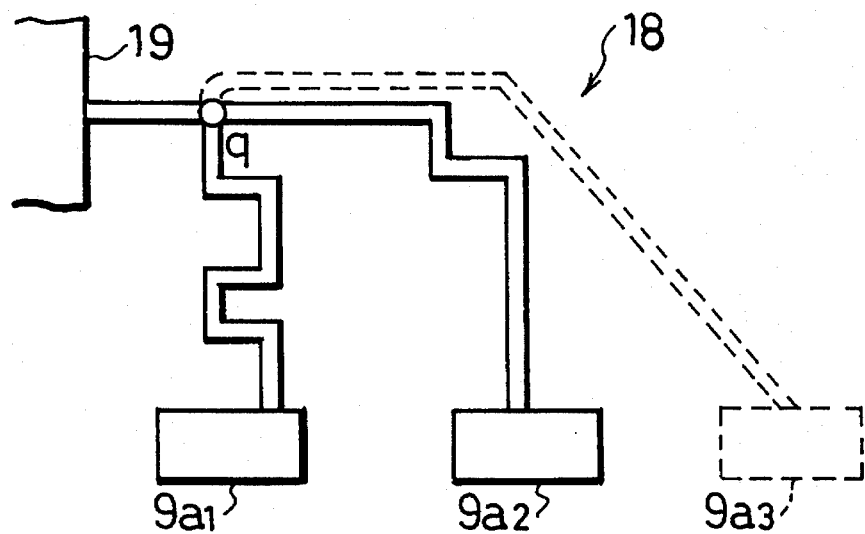
FIG. 12 is an explanatory drawing which shows another arrangement for adjusting the impedance of the divided video signal lines formed on the substrate so as to obtain uniform impedance.

Here, in order to achieve the object, except for the means of the present embodiment, for example, as shown in FIG. 11, the main signal line section 18a may be formed so that its width becomes larger as the signal line section 18a is away farther from the connecting pad 19 without changing the line width of the branched branch signal line sections 18a' . . . Further, as shown in FIG. 12, the length of the divided video signal line 18 may be arranged uniformly so that a difference in the wire length is obtained as approximately δR<±3.1%. In addition, the film thickness of each video signal line 18 can be also changed, and these methods need to be used depending upon circumstances. The configuration of each video signal lines 18 . . . is not limited to that shown in the drawing, and as shown in FIG. 8, the part indicated by a broken line in the drawing shows the configuration of the divided video signal line 18 in the case where the sampling switches 9a ... are grouped per 3.

Figure 13:
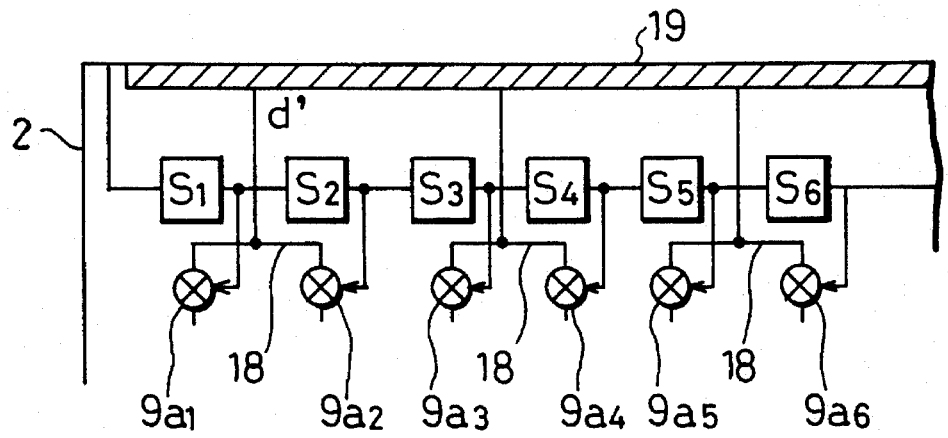
FIG. 13 is an explanatory drawing which shows the dividing condition of the video signal line in FIG. 1 in another wiring display manner.

In addition, in FIG. 1, it is shown that a distance between the signal input terminal, which is connected to the connecting pad 19, and each sampling switch 9a, for example, a distance between the junction d of the video signal line and the sampling switch 9a differs from a distance between the junction d and the sampling switch 9a$_2$, but it is for the convenience of showing the wiring diagram. As shown in FIG. 13, the distance between the junction d' of the video signal line and the sampling switch 9a$_1$ equals the distance between the junction d' and the sampling switch 9a$_2$, in other words, the present invention is arranged so that the impedance between the junction d' and the sampling switch 9a$_1$ equals the impedance between the junction d' and the sampling switch 9a$_2$.

Figure 14:
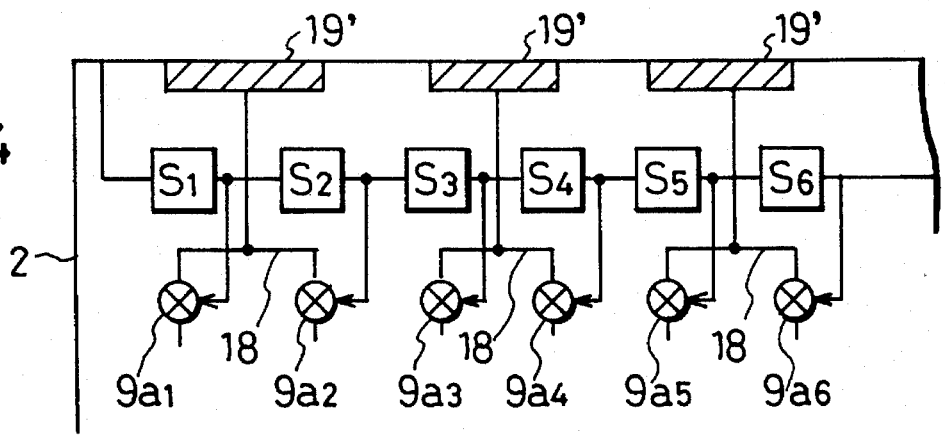
FIG. 14 is an explanatory drawing which shows another arrangement of the connecting pad for divided lines.

In addition, in the present embodiment, the connecting pad 19 is formed along over the end of the substrate 2 but is not limited to this way, and for example, as shown in FIG. 14, a plural of connecting pads 19' can be installed. The connecting pad 19 which is installed along over the edge of the substrate can produce a fault that another signal cannot be inputted to the pad formation area, etc. or in the case of the pad having large area, a crack, etc. can occur due to expansion or shrinkage of the pad after the process of heating and cooling. However, the installation of the pads in a divided manner can solve such problems. In this case, a number of the interfaces with the outside increases, but unlike the arrangement shown in FIG. 10, the area of the contact part is largely provided, thereby preventing the connecting dependability from being deteriorated.

The present embodiment illustrates the arrangement that the video signal line is divided, but the present invention is not limited to this, and for example, another signal line or power source line can be also divided. Further, this method is applicable not only the input signal line but also the output signal line.

Furthermore, the present embodiment illustrates the image display device (especially, liquid crystal display unit), but the present invention is not limited to the image display device, so is applicable to any semiconductor device where an active device circuit including a semiconductor active device and long electrically conductive lines such as a power source line for supplying a source power to the active device circuit, a signal line for inputting a signal to the active device circuit are provided on one substrate.

As mentioned above, a semiconductor device comprising:
a substrate;
an active device circuit including a semiconductor active device, the active device circuit having a plurality of input terminals, the active device circuit being formed on the substrate;
an external connection terminal for making an electrical connection with an external circuit aside from the semiconductor device, the external connection terminal being formed in the vicinity of an edge of the substrate; and
an electrically conductive line for making an electrical connection between each input terminal of the active device circuit and the external connection terminal, the electrically conductive line being formed on the substrate,
wherein the electrically conductive line consists of a plurality of divided lines whose wiring resistance has a predetermined value or less.

With this arrangement, since the length of the electrically conductive line such as a signal line, a power source line becomes short, the wiring resistance can be lowered, thereby making it possible to control a fluctuation in the signal level and a drop in the source voltage. As a result, in the case where the semiconductor device is an image display device such as a liquid crystal display unit, its display characteristic can be improved.

The semiconductor device of the present embodiment according to the above arrangement, is arranged so that the connection terminal is formed along the edge of the substrate, and a terminal width in a direction parallel to the edge of the substrate is larger than a terminal width in a direction at right angles to the edge of the substrate.

With this arrangement, even if the electrically conductive line such as a signal line, a power source line is divided plurally, the connecting reliability between the device and the external circuit substrate is not lowered.

In the above arrangement, the semiconductor device which is an image display device is arranged so that each divided line is formed so that a variation in wiring resistance between the external connection terminal to an input section of the active device circuit falls in the range of ±3.1% with respect to an average value of the wiring resistance. In this way, when the wiring resistance of each line is adjusted so as to fall in the above range, irregular display is not noticeable, thereby improving the display characteristic.

Next, as the second embodiment, the following description will discuss the arrangement that a clock signal line or a start signal line for inputting a start signal into the shift register circuits S ...

Second Embodiment

Next, referring to FIGS. 15 and 16, the second embodiment of the present invention will be described.

Here, for convenience of explanation, those members that have the same arrangement and functions, and that are described in the aforementioned first embodiment are indicated by the same reference numerals and the description thereof is omitted.

Figure 15:
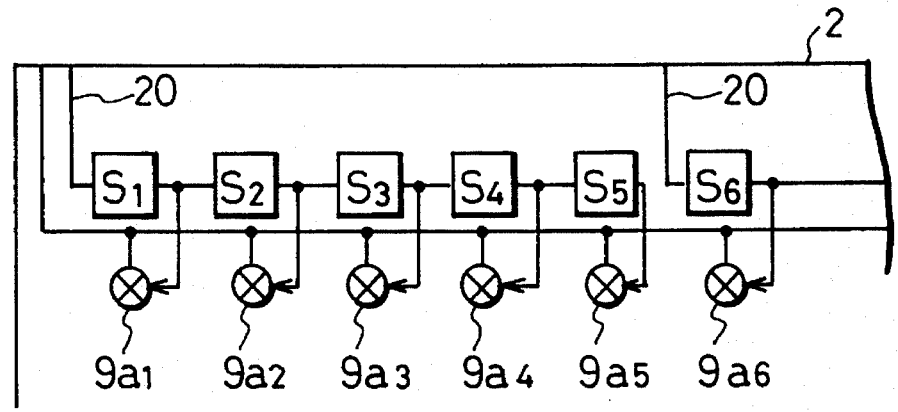
FIG. 15 is an explanatory drawing which shows a dividing condition of a start signal line for inputting a start signal to a shift register circuit in a liquid crystal display unit according to the second embodiment of the present invention.

In the liquid crystal display unit of the present embodiment as the image display unit, as shown in FIG. 15, although the video signal line is divided in the aforementioned embodiment, the video signal line is installed in the conventional way and the clock signal line or the start signal line for inputting a start signal to the shift register circuits S ... is divided so as to arrange as the divided clock signal lines 20 ... or the divided start signal lines 20 .... Here, one end of each divided clock signal line 20 ... or each divided start signal line 20 ..., not shown, is connected to the connecting pad 19.

Figure 16:
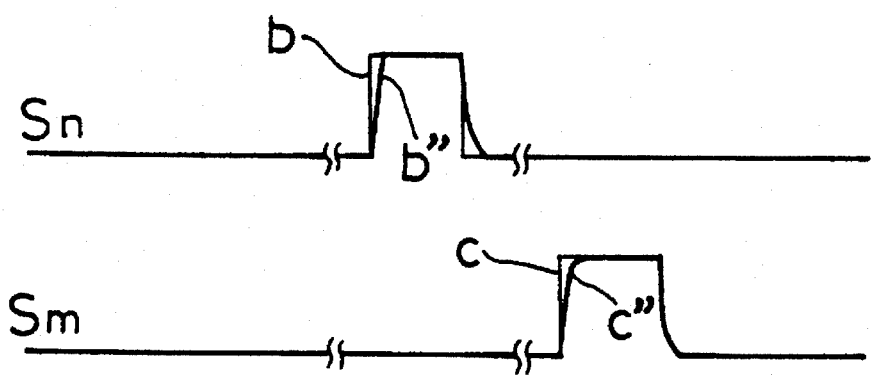
FIG. 16 is a waveform diagram which shows waveforms of a sampling signal in the liquid crystal display unit of FIG. 15.

In this way, in the case where the clock signal line or the start signal line is arranged in a divided manner, as shown in FIG. 16, even_ _as to the shift register circuit Sn on the "n"th step, and the shift register circuit Sm on the "m"th step which is away farther from the signal input terminal, the respective waveforms presented by b" and c" can be close to the original waveforms b and c. Here, in the case where the start signal line is divided depending upon arrangements of the driver circuit, a phase of a start pulse to each divided circuit should be adjusted.

As a result, a variation in the phase does not occur in the sampling signal, thereby improving the display characteristic.

Third Embodiment

Next, referring to FIGS. 17 through 25, the third embodiment of the present invention will be explained.

Here, for convenience of explanation, those members that have the same arrangement and functions, and that are described in the aforementioned embodiment are indicated by the same reference numerals and the description thereof is omitted.

Figure 17:
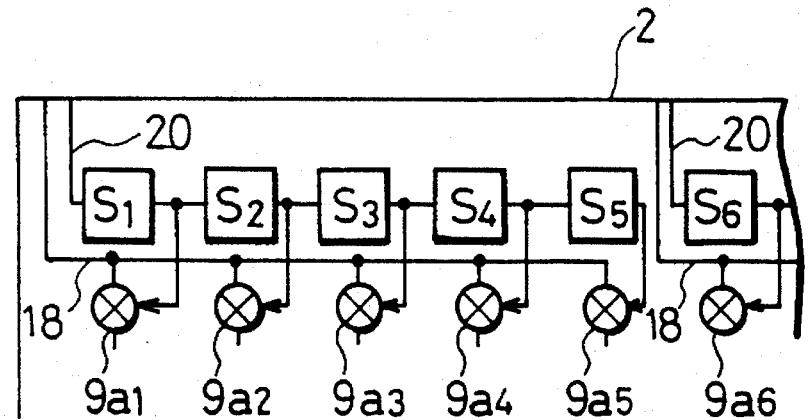
FIG. 17 is an explanatory drawing which shows each dividing condition of a video signal line, a start signal line and a power source line in a liquid crystal display unit according to the third embodiment of the present invention.

In the liquid crystal display unit of the present embodiment which is the image display unit, as shown in FIG. 17, the start signal line (or the clock signal line), the video signal line and the power source line are divided plurally so that the divided start signal lines (or the divided clock signal lines) 20 ..., the divided video signal lines 18 ... and the divided power source line 21 ... are formed.

Figure 18:
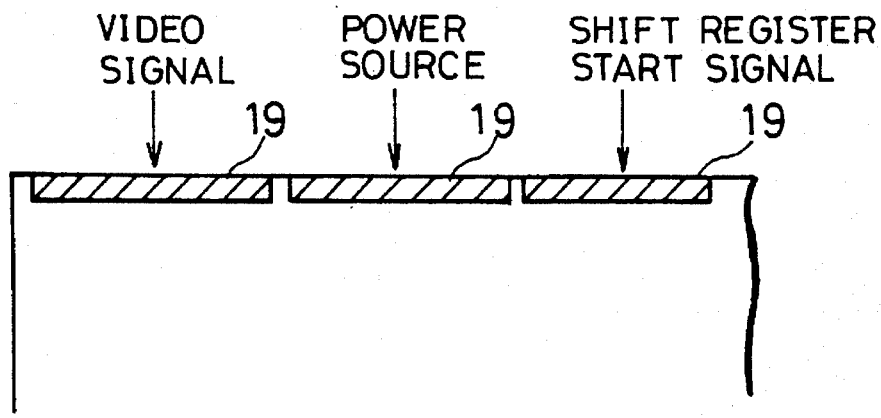
FIG. 18 is an explanatory drawing which shows a forming condition of a connecting pad for divided lines on a substrate.
Figure 19:
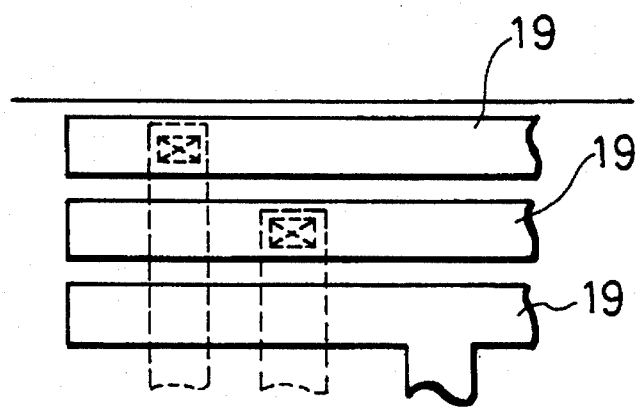
FIG. 19 is an explanatory drawing which shows a forming condition of the connecting pad for divided lines on a substrate in the liquid crystal display unit of FIG. 17.

In the case where a plurality of wiring are made, as shown in FIG. 18, the respective signal lines 20 ..., 18 ... and 21 ..., and the connecting pads 19 ... used for the power source lines can be arranged in a crosswise direction along the edge of the substrate 2. However, in the present embodiment, as shown in FIG. 19, the respective pads are arranged in a row in a direction from the edge of the substrate towards the inside of each substrate through a contact hole, etc. except for a line to be installed on the innermost edge of the substrate. However, the contact hole may be used for the line to be installed on the innermost edge of the substrate. This way suppresses increasing a number of division in the arrangement of FIG. 18 to more than a certain number, and eliminates a fault such as intricateness of wiring of the respective lines 20 ..., 18 ..., 21 ... on the substrate and the power source line.

Figure 20:
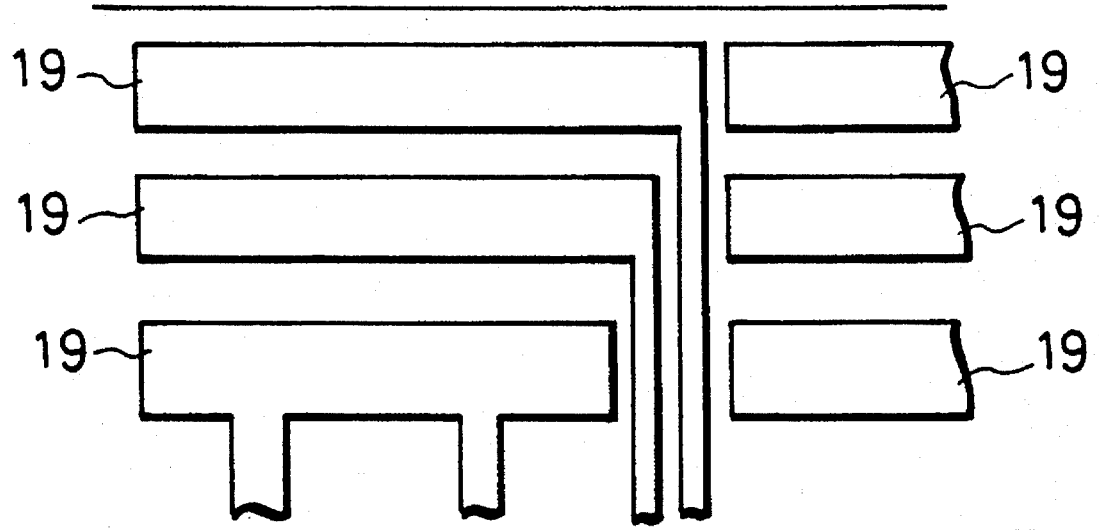
FIG. 20 is an explanatory drawing which shows another forming condition of the connecting pad for divided lines on the substrate.
Figure 21:
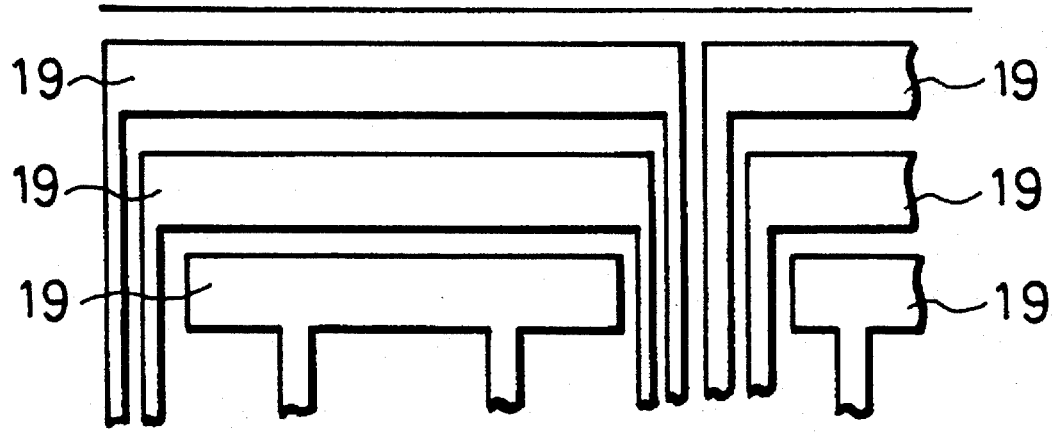
FIG. 21 is an explanatory drawing which shows another forming condition of the connecting pad for divided lines on the substrate.

In addition, not only this arrangement but also, for example, arrangements that the wiring is made via the divided connecting pads 19 as shown in FIGS. 20 and 21, or the combination of these arrangements may be adopted.

Here, in the case where the impedance does not need to be lowered in all the signal lines and power source lines, as shown in FIG. 22, an arrangement that normal connecting pads having narrow width 20·20 are installed between the rectangular connecting pads 19·19 where the impedance is lowered, as shown in FIG. 23, an arrangement that the normal connecting pads having narrow width 20 ... are installed inside the connecting pad 19 where the impedance is lowered, an arrangement that is the reverse of FIG. 23, or the combination of these arrangements may be adopted.

The adjoining connecting pads for divided lines 19·19 do not have to be used for one kind of signal line. For example, as shown in FIG. 24(a), a connecting pad E for the start signal line and a connecting pad G for power source line may be arranged adjoining a connecting pad F for a star signal line. Moreover, in the case where a plurality of connecting pads 19 ... are arranged in a plurality of rows along the substrate edge, the connecting pads 19·19 do not have to be arranged so that their edges in two rows of each row are lined up evenly just like the connecting pads E and F shown in FIG. 24(a), so the connecting pads 19·19 may be arranged so that their ends in two rows of each row are not lined up evenly.

Moreover, the layer inward the substrate of each connecting pad 19 ... ·20 ... is not limited to from one to three layers as mentioned above, so more than three layers can be used. A total number of the pads should not be always constant on each place, so the layout of the pads is also arbitrary. Further, alliance and rupture of each signal line which has been installed on the inside of the substrate is arbitrary, and the respective connecting pads 19 ... ·20 ... placed on the perimeter of the substrate may be contact with or away from the edge of the substrate.

The configuration of the connecting pad 19 can be an angular-type as shown in FIG. 25(a) or a round-type as shown in FIG. 25(b). Further, the wiring configuration of each divided video signal line 18 ... from the connecting pad 19 is also arbitrary; an angular-type as shown in FIG. 25(c), a round-type as shown in FIG. 25(d), a tapered-type as shown in FIG. 25(e), etc.

As mentioned above, the semiconductor device according to present embodiment is arranged so that a plurality of the connection terminals exist on the substrate, and that the plurality of connection terminals are arranged in a row in a direction from the edge of the substrate towards the inside of the substrate. This makes it possible to make a good use of a limited area on the substrate edge and to increase a number of divisions of the signal line or the power source line. In this case, the divided signal lines or power source lines are not jumbled complicatedly.

The driver section of the liquid crystal display unit is illustrated in the first through third embodiments, but the mentioned circuit section is not limited to the driver section and the image display unit not to the liquid crystal display unit. Therefore, another circuits and display units, for example, a circuit which deals with an input signal of a stylus pen as the circuit section, and a plasma display, EL (Electro Luminescent) display, etc. as the display unit may be used.

Fourth Embodiment

Next, referring to FIGS. 26 through 40, the following description will discuss the fourth embodiment of the present invention. Here, the present embodiment also discusses an image display device as an example of the semiconductor device.

The liquid crystal display unit of the present embodiment as the image display unit adopts an active matrix-type point successive scanning system, and includes active elements. In this liquid crystal display unit, circuit means which is provided together with an image display section on one substrate works as a driving circuit for driving the image display section. As shown in FIG. 26, the liquid crystal display unit has a responsibility improvement circuit 202 (waveform improvement signal generating circuit) on a step before a driver circuit 201 for driving a liquid crystal display panel, not shown.

The responsibility improvement circuit 202 includes a differentiating circuit 203 for producing a responsibility improvement signal as a waveform deterioration response signal component which is shown in FIG. 27(b) from the source CLP as a pulse-like basic signal component which is shown in FIG. 27(a), and an adder 204 for adding the responsibility improvement signal to the source CLP, in other words, mixing the responsibility improvement signal with the source CLP, so as to produce a improvement clock signal (hereinafter, referred as improvement CLP) as a waveform improvement signal which is shown in FIG. 27(c). The differentiating circuit 203 consists of, for example, a resistance $R_1$ and a capacitor $C_1$ which are shown in FIG. 28. As widely known, a pulse width t of the responsibility improvement signal outputted from the differentiating circuit 203 which is shown in FIG. 28(b) is determined by the product of $R_1$ by $C_1$ ($t=R_1 \cdot C_1$), namely, a time constant of the differentiating circuit 203.

As for prevention of the waveform deterioration of the improvement CLP, it is more appropriate that the installation position of the responsibility improvement circuit 202 is closer to the driver circuit 201, but it is not limited if the responsibility improvement circuit 202 is installed within an extent between a clock signal generating circuit 206 and the driver circuit 201.

Figure 29:
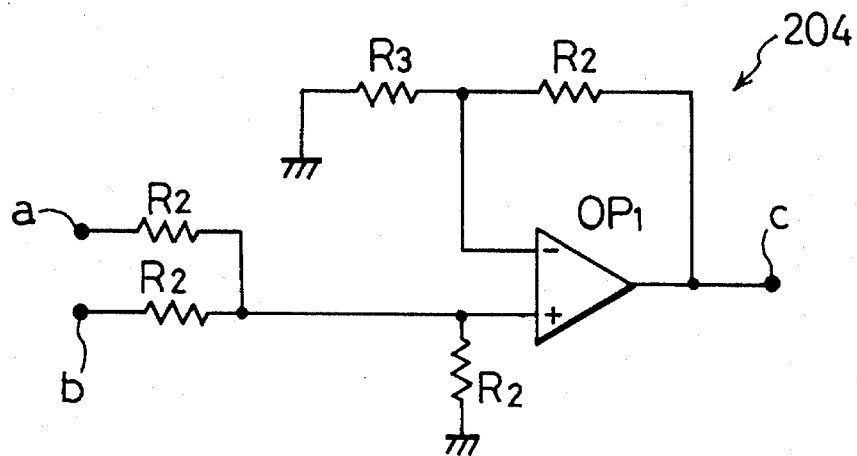
FIG. 29 is a circuit diagram of an adder shown in FIG. 26.

As shown in FIG. 29, the adder 204 consists of, for example, one operational amplifier $OP_1$, four resistances $R_2$ and one resistance $R_3$. Here, as to the resistance $R_3$, the relation: $R_3=R_2/2$ is obtained. In this circuit, when an input voltage of an inversion input terminal in the operational amplifier $OP_1$ is represented by $V^-$, an input voltage of a non-inversion input terminal by $V^+$, input voltages of input terminals a and b respectively by Va and Vb, and an output voltage of an output terminal c by Vc, the following relations are obtained:

$$V^+=(R_2/3)(Va/R_2+Vb/R_2)=(Va+Vb)/3$$

$$V^-=\{Vc/(R_2/2+R_2)\}R_2/2=Vc/3$$

$$V^+=V^-$$

Therefore, $$Vc=Va+Vb$$

Here, the adder is limited to this example, so it may have another arrangement.

Figure 30:
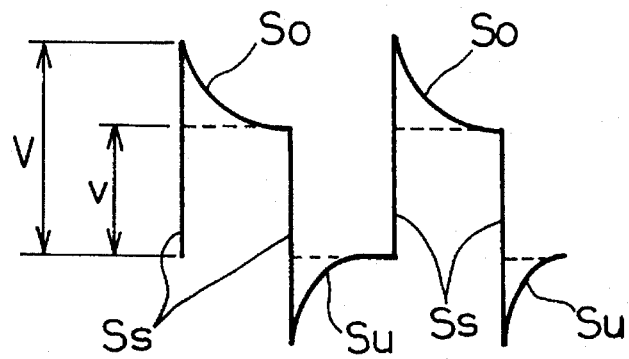
FIG. 30 is an enlargement of an output signal waveform from the adder.

The improvement CLP has a basic signal component Ss indicated by bold lines in FIG. 30, which gets High/Low (1/0) values, an overshoot component So and an undershoot component Su indicated by fine lines which are added to a leading edge and a trailing edge of the source CLP.

Figure 31:
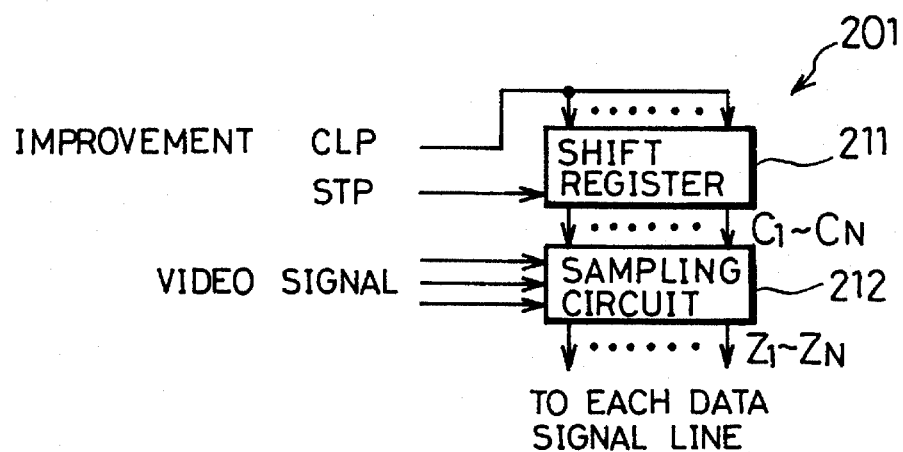
FIG. 31 is a block diagram which shows a constitution of a driver circuit shown in FIG. 26. substituted for a responsibility improvement circuit shown

The driver circuit 201, which is a data driver, for example, with the arrangement shown in FIG. 31, includes a shift register 211 and a sampling circuit 212. The driver circuit 201 is installed on one glass substrate where a picture element section in the liquid crystal display panel is provided. The improvement CLP and a start pulse (hereinafter, referred as STP) are inputted to the shift register 211.

The shift register 211 usually shifts the STP at a timing of rising or falling of the CLP. Here, the shift register 211 shall execute the shift operation at the leading edge of the improvement CLP.

As mentioned above, as to the improvement CLP shown in FIG. 27(c) which has been inputted to the shift register 211, its rising becomes dull (deforms) in accordance the wiring resistance and a parasitic capacity in the driver circuit 201. However, since the overshoot component So is preliminarily added to the improvement CLP, the waveform deterioration of the improvement CLP is prevented, and delay of the rising hardly occurs. Moreover, if the influence of the parasitic capacity is great, the delay of the rising can be surely eliminated by increasing the ratio of the overshoot component So accordingly.

If the number of the outputs in the driver is N, the STP which starts sampling of data of one horizontal scanning period is inputted so that sampling pulses $C_1$ to $C_N$ are outputted from each output section of the shift register 211 in accordance with the timing of the improvement CLP. A video signal is sampled in the sampling circuit 212 by the sampling pulses $C_1$ to $C_N$ which are outputted from the shift register 211, and the sampled signal is immediately transmitted to a data signal line.

The data of one horizontal scanning period are supplied to a predetermined picture element in the liquid crystal display panel by applying a scanning pulse from the scanning driver to the scanning signal line in accordance with the timing of the data transmission to the data signal line. This makes it possible that the liquid crystal display unit displays images of good quality.

Here, in the present embodiment, the improvement CLP has the overshoot component So at the leading edge, and the undershoot component Su at the trailing edge. However, since the shift register 211 executes the shift operation only by rising the improvement CLP, the undershoot component Su at the trailing edge is not needed. On the contrary, if the shift register 211 executes the shift operation by falling the improvement CLP, only the undershoot component Su at the trailing edge is needed.

In addition, in the present embodiment, a responsibility improvement signal is added to the source CLP outputted from the clock signal generating circuit in the responsibility improvement circuit 202, but the improvement CLP to which the responsibility improvement signal is added from the clock signal generating circuit 206 may be outputted, in other words, the clock signal generating circuit 206 may includes the responsibility improvement circuit 202.

Figure 32:
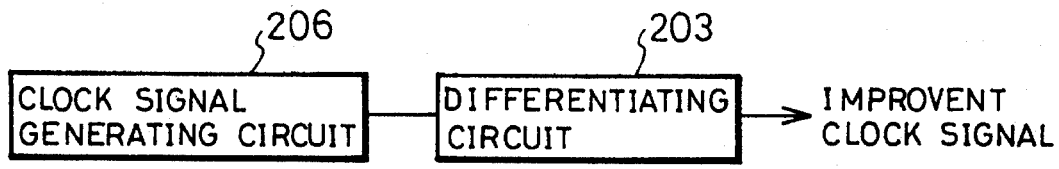
FIG. 32 is a block diagram which shows a constitution in FIG. 26.

Furthermore, as shown in FIG. 32, in order to create the improvement CLP, the source CLP which becomes the improvement CLP in accordance with differentiation may be created in the clock signal generating circuit 206 and may be processed in the differentiating circuit 203.

Figure 33A:
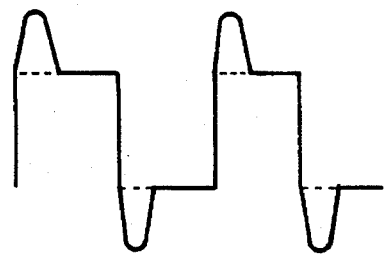
FIGS. 33(a) through 33(d) show another examples of the improvement clock signal outputted from the adder.
Figure 33B:
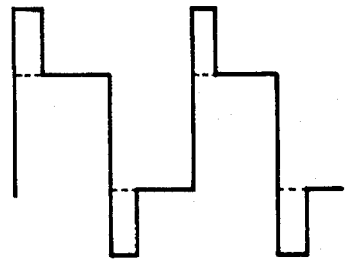
Figure 33C:
Figure 33D:
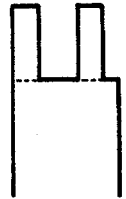

In order to create the improvement CLP, a differentiating signal as the responsibility improvement signal is added to the leading edge and the trailing edge of the source CLP, but another responsibility improvement signal in synchronization with the source CLP, such as a responsibility improvement signal having sine waves which is shown in FIG. 33(a) or a pulse-like responsibility improvement signal shown in FIG. 33(b) may be added. Moreover, as the responsibility improvement signal, one having triangle waves or trapezoidal waves may be added. The responsibility improvement signal may be added to not only the leading edge and the trailing edge of the source CLP but also places which are slightly displaced from the rising and the falling sections as shown in FIG. 33(c). Further, as to the improvement CLP, as shown in FIG. 33(d), two responsibility improvement signal may be added between the leading edge and the trailing edge. Here, if harmful effects is produced, namely, the improvement in the rising characteristic influences the falling characteristic, or on the contrary, the improvement in the falling characteristic influences the rising characteristic, it is desirable that a position for inserting the responsibility improvement signal comes between the leading edge and the trailing edge of the source CLP, in other words, before a ½ point.

Considering the circumstances mentioned above, a waveform improvement signal such as the improvement CLP shall meet the following requirements. As shown in FIG. 30, if maximum amplitude of the component corresponding to the source CLP, namely, a basic signal is represented by v, and maximum amplitude of a portion where the basic signal characteristic is improved is represented by V, the following relation is obtained:

$$|v|<|V|$$

If the frequency of the basic signal component is represented by f and the frequency of the responsibility improvement signal by F, the following relation is obtained:

$$f \leq F$$

In other words, when the relation $|v|<|V|$ is held, the responsibility improvement signal can be a detectable component to the source CLP. Moreover, when the equation $f \leq F$ is held, the responsibility improvement signal can be suitably added to the source CLP.

In addition, since the constitution of the differentiating circuit 203 is simple, the constitution of the circuits can be simplified by using the differentiating circuit 203. The constitution shown in FIG. 26 is a little completer than the constitution shown in FIG. 32. However, since the responsibility improvement signal is produced by the differentiating circuit 203 and is added to the source CLP so as to generate the improvement CLP, the responsibility improvement signal can be formed more suitably.

As mentioned above, A plurality of active elements whose carrier mobility is high is used in the liquid crystal display unit, a polycrystal silicon thin film transistor (hereinafter, referred as p-SiTFT) whose carrier mobility μ is 5 cm$^2$/V·sec or more (μ≧5 cm$^2$/V·sec) as the active elements is used in the liquid crystal display unit, and the driver circuit 201 is formed monolithically on the glass substrate which forms the screen of the liquid crystal display panel.

In the constitution of the present embodiment, the improvement CLP is produced by adding the responsibility improvement signal to the source CLP, but this constitution is also applicable to, for example, a start pulse which attains two values of H/L (1/0), another data signals and a video signal which attains multi-gradation, namely, multi-values just like the improvement CLP. This is also applicable to the other embodiments mentioned later.

As mentioned above, a semiconductor device of the present embodiment, is arranged so as to include:

a substrate;

an active device circuit including a semiconductor active device, the active device circuit being formed on the substrate;

a signal line for transmitting a basic signal, which takes at least 2 values inputted from an outside of the semiconductor device thereinto, to the active device circuit, the signal line being formed on the substrate; and a waveform improvement signal generating circuit for generating a waveform improvement signal which is obtained by applying a waveform deterioration response signal component to a basic signal transmitted through the signal line so as to supply the waveform improvement signal to the active device circuit, wherein the waveform improvement signal generating circuit obtains the following relations:

$$|v|<|V|; \qquad (1)$$

and $$f \leq F, \qquad (2)$$

where v is a maximum amplitude of a basic signal component in the waveform improvement signal, V is a maximum amplitude of a part including the waveform deterioration response signal component, f is a frequency of the basic signal component and F is a frequency of the waveform deterioration response signal component.

With this arrangement, a delay of the basic signal transmitted through the signal line can be prevented, thereby avoiding a faulty operation of the active device circuit. In the case where the semiconductor device is an image display device such as a liquid crystal display unit, for example, a timing delay of a sampling pulse can be prevented, thereby making it possible to sample a desired video signal at a regular timing. As a result, an image of a good quality can be displayed.

Furthermore, the semiconductor device of the present embodiment, is characterized by that the waveform improvement signal generating circuit is a differentiating circuit for differentiating the basic signal inputted from the outside so as to create the waveform improvement signal. This can makes the arrangement simplify.

Moreover, the semiconductor device of the present embodiment, is characterized by that the waveform improvement signal generating circuit includes:

waveform deterioration response signal generating means for generating the waveform deterioration response signal; and adding means for adding the waveform deterioration response signal generated by the waveform deterioration response signal generating means to the basic signal inputted from the outside. This can suitably create the waveform deterioration response signal independently and a desired waveform improvement signal. In the case where the semiconductor device is an image display device, for example, the video signal can be appropriately sampled, thereby making it possible to display an image of good quality.

Fifth Embodiment

Next, referring to FIGS. 34 through 37, the fifth embodiment of the present invention will be explained.

Here, for convenience of explanation, those members that have the same arrangement and functions, and that are described in the aforementioned fifth embodiment are indicated by the same reference numerals and the description thereof is omitted.

Figure 34:
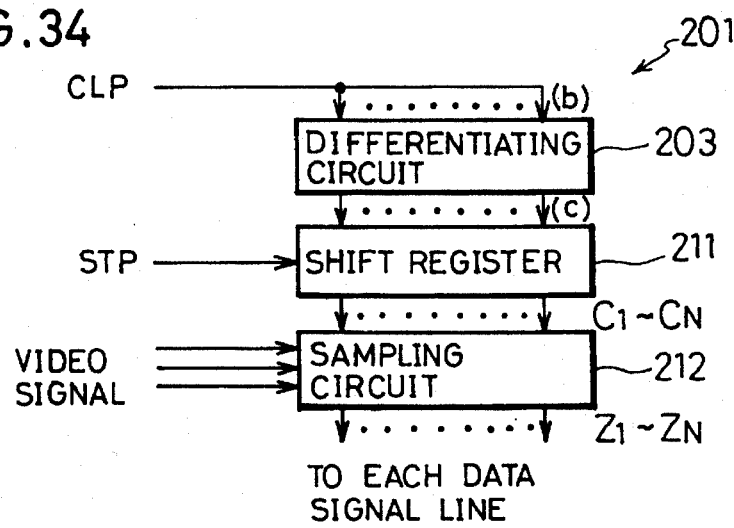
FIG. 34 is a block diagram which shows a constitution of a main section of a liquid crystal display unit according to the fifth embodiment of the present invention.

As shown in FIG. 34, the driver circuit 201 which is a data driver is provided on the glass substrate which forms the screen of the liquid crystal display panel. The driver circuit 201 includes the differentiating circuit 203 as a phase characteristic improvement circuit. The differentiating circuit 203 is provided on all early steps of the shift register 2011 at the "N"th step.

With the above arrangement, as to the source CLP outputted from the clock signal generating circuit (not shown), a waveform shown in FIG. 35(a) is deformed to a waveform shown in FIG. 35(b) because the leading edge and the trailing edge become dull due to the wiring resistance or the parasitic capacity in the driver circuit 1. In other words, the source CLP in which the waveform deterioration occurs is inputted to the differentiating circuit 203. As shown in FIG. 35(c), the source CLP shows a waveform whose leading edge and the trailing edge are steep. As a result, the rising and the falling delay can be compensated for so that the liquid crystal display unit can display images of good quality.

Figure 37:
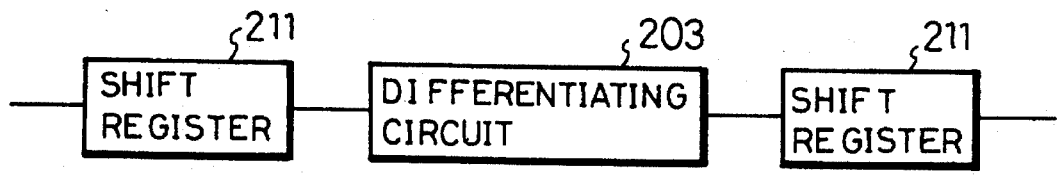
FIG. 37 is a block diagram which shows still another example of a constitution shown in FIG. 34.

Here, with the above arrangement, the differentiating circuit 203 is installed on all early steps of the shift register 211 at the "N"th stage, but as shown in FIG. 36, one differentiating circuit 203 may be installed at a step before the step where a supply line of the CLP is branched in accordance with the shift register 211 at the "N"th stage. Furthermore, as shown in FIG. 37, the responsibility may be improved by processing a transmission pulse itself which is on the way to the shift register 211, namely, to the later step in the differentiating circuit 203.

A semiconductor device of the present embodiment, is arranged so as to include:

a substrate;

an active device circuit including a semiconductor active device, the active device circuit being formed on the substrate; and a signal line for transmitting an input signal inputted from the outside of the semiconductor device to the active device circuit, the signal line being formed on the substrate;

wherein the active device circuit includes a phase characteristic improvement circuit for compensating for a phase characteristic in a signal component, which becomes an indication of a circuit operation deteriorated due to a waveform deterioration, with respect to the input signal. Compared with the arrangement of the fourth embodiment, in other words, the arrangement that the waveform deterioration response signal component for preventing a deterioration due to a waveform deterioration is preliminarily set to the input signal, this arrangement makes it easier to prevent a deterioration of the input signal.

In addition, the semiconductor device of the present embodiment, is characterized by that the phase characteristic improvement circuit is a differentiating circuit. This can make the circuit arrangement simplify.

Sixth Embodiment

Next, referring to FIGS. 38 through 40, the sixth embodiment of the present invention will be explained.

Here, for convenience of explanation, those members that have the same arrangement and functions, and that are described in the aforementioned embodiment are indicated by the same reference numerals and the description thereof is omitted.

Figure 38:
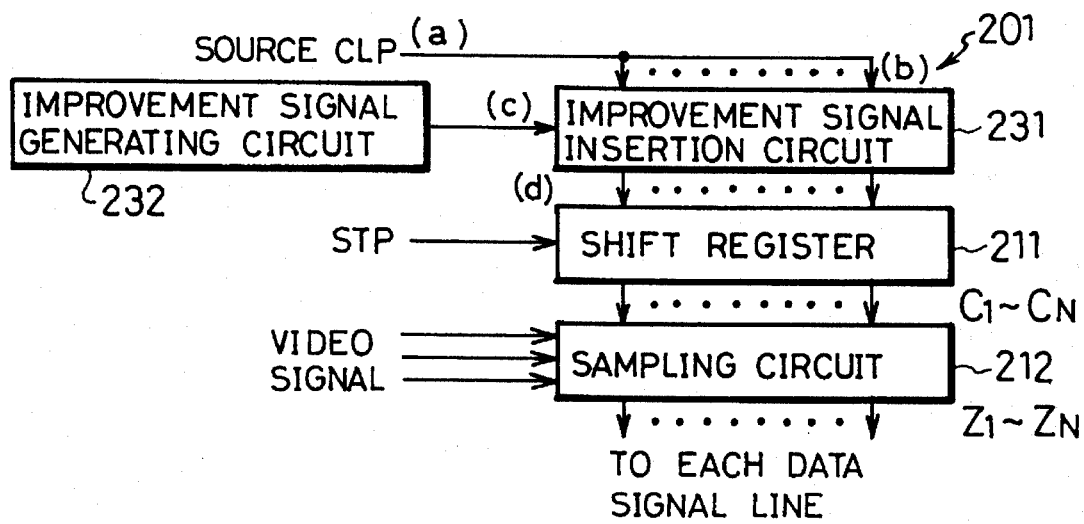
FIG. 38 is a block diagram which shows a constitution of a main section in a liquid crystal display unit according to the sixth embodiment of the present invention.

As shown in FIG. 38, the liquid crystal display unit includes a improvement signal insertion circuit 231 at all early stages of the shift register 211 at the "N"th stage in the driver circuit 201 which is a data driver. The responsibility improvement signal to be outputted from a improvement signal generating circuit 232 as the signal component corresponding to the waveform deterioration shown in FIG. 39(c), and the source CLP outputted from the clock signal generating circuit (not shown) are inputted to the improvement signal insertion circuit 231. The improvement signal generating circuit 232 as well as the improvement signal insertion circuit 231 constitute a waveform improvement circuit. The improvement signal insertion circuit 231 includes, for example, the adder 204 shown in FIG. 29, and adds the responsibility improvement signal to the source CLP so as to output it to the shift register 211.

With the above arrangement, after the waveform shown in FIG. 39(a) of the source CLP outputted from the clock signal generating circuit is deformed to the waveform shown in FIG. 39(b) because waveform deterioration occurs at the rising and the falling sections due to the wiring resistance and the parasitic capacity in the driver circuit 201, the source CLP is inputted to the improvement signal insertion circuit 231. In the improvement signal insertion circuit 231, the responsibility improvement signal shown in FIG. 39(c) which has been inputted from the improvement signal generating circuit 232 is added to the input signal so that an improvement CLP shown in FIG. 39(d) is generated. Then the improvement CLP is outputted to the shift register 21. The rising and falling sections of the improvement CLP is seep, thereby improving the responsibility in the shift register 211.

Here, if a pulse width in the responsibility improvement signal is represented by T and an operation frequency of the driver circuit 201 which has been formed on the glass substrate by f, the pulse width T should be set so as to obtain the following relation:

T<1/f

Therefore, for example, a differentiating signal of the source CLP shown in FIG. 39(e) is also used as the responsibility improvement signal. In other words, if only a signal improves steepness of the rising and the falling sections in the improvement CLP, the signal can be used as the responsibility improvement signal. Therefore, for example, a sine wave is applicable.

Here, in the case where the responsibility improvement signal shown in FIG. 39(c) is generated, the improvement signal generating circuit 232 consists of the pulse signal generating circuit which is widely known. In the case where the responsibility improvement signal shown in FIG. 39(e) is generated, the improvement signal generating circuit 232 consists of the differentiating circuit or a multivibrator. Moreover, in the case where the responsibility improvement signal is a sine wave, the improvement signal generating circuit 232 consists of a sine wave signal generating circuit or an oscillating circuit.

In addition, a relation between the amplitude $V_T$ of the responsibility improvement signal and the amplitude $V_f$ of the source CLP is set so as to obtain the following relation:

$|V_T|>|V_f|$ level adjusting means such as means for amplifying the responsibility improvement signal is unnecessary.

As shown in FIG. 40, the improvement signal insertion circuit 231 may be provided at a step before the step where a supply line of the source CLP to the shift register 211 is branched in accordance with the shift register 211 at the "N"th step.

As mentioned above, a semiconductor device as defined in the present embodiment, includes:

a substrate;

an active device circuit including a semiconductor active device, the active device circuit being formed on the substrate;

a signal line for transmitting a basic signal, which determines operational frequency of the active device circuit, to the active device circuit, the basic signal being inputted from an outside of the semiconductor device, the signal line being formed on the substrate; and a waveform improvement circuit for adding a waveform deterioration response signal component to a portion where an operation timing is specified in the basic signal, wherein the improvement circuit obtains the following relation:

T<1/f where f is an operation frequency of the active device circuit which is operated by the basic signal, and T is a minimum pulse width of the waveform deterioration response signal component.

This arrangement controls a waveform deterioration at the rising or trailing edge of the basic signal or the both of portions so as to maintain a steepness of them, thereby making it possible to prevent a phase shift. Therefore, the delay of the basic signal transmitted through the signal line can be prevented, thereby making it possible to avoid the faulty operation of the active device circuit. In the case where the semiconductor device is an image display device such as a liquid crystal display unit, for example, a timing delay of a sampling pulse can be prevented and a desired video signal can be sampled, thereby making it possible to display images of good quality.

In the aforementioned fourth through sixth embodiments, a data driver adopted a point successive scanning system was illustrated as the active device circuit. However, the arrangement of the present invention is not limited to this, so is applicable to any active device circuit which operates depending upon a signal requiring the timing of rising or falling. Except for the above data driver adopting the point successive scanning system, the present invention is applicable to, for example, a scanning driver adopting the point successive scanning system, a data driver adopting a line successive scanning system or a scanning driver adopting the line successive scanning system. Furthermore, in the case where a stylus pen input processing section or a two-dimensional image sensor input processing section is formed on the substrate where the display section is formed, the present invention is also applicable to a stylus pen input signal processing circuit or a tow-dimensional image sensor input signal processing circuit. Moreover, the present invention is not limited to an image display device consisting of a liquid crystal display unit, so is applicable to another image display device, such as an electroluminescence display device, a plasma display.

In addition, the circuits, such as the driver circuit 201, the responsibility improvement circuit 202, can be realized by forming monolithically an active device whose carrier mobility μ is 5 cm$^2$/V·sec or more on an insulating substrate such as a glass substrate or a semiconductor substrate on which an insulating film is formed, or by mounting a semiconductor chip on the above mentioned substrate using a COG, etc.

In the fourth through sixth embodiments, considering pressure of circuit constitution elements, etc., the waveform improvement signal shall include, for example, a pulse-like signal component, but if there does not exist a problem with the resistance, the waveform improvement signal is amplified by the basic signal. In other words, if a maximum sour voltage of the circuit means is represented by $V_{DD}$, a minimum source voltage which is a voltage on a grand side by $V_{EE}$, the amplitude of a signal to be inputted to the circuit by $V_{PP}$ (peak-to-peak value), the following relation is held:

$$V_{PP} > |V_{DD} - V_{EE}|$$

Therefore, the waveform deterioration in the input signal is restrained with a simple and easy arrangement, thereby making it possible to obtain the effect of the waveform improvement. Here, although a signal whose voltage is higher than the source voltage cannot be generally inputted to a CMOS semiconductor arranged on a crystal silicon substrate, for example, as to the TFT (thin film transistor) arranged on the insulating substrate such as the glass substrate, since common substrate electric potential does not exist like the semiconductor substrate, the TFT is difficult to be destroyed even in the case where the signal whose voltage is higher than the source voltage or the signal whose voltage is lower than the lowest voltage of the source voltage is inputted. As a result, the above operation can be carried out.

Here, in this way, as to the another advantage in inputting the signal whose voltage is higher than the source voltage or the signal whose voltage is lower than the source voltage, there also exists an effort that through current of a transistor on the OFF side can be suppressed depending upon a threshold voltage of the transistor which is a component so that the power used can be restrained, for example, in an inverter circuit having a CMOS which constitutes a shift resistor, etc.

Seventh Embodiment

Next, referring to FIGS. 41 through 55, the following description will discuss the seventh embodiment of the present invention.

Figure 42:
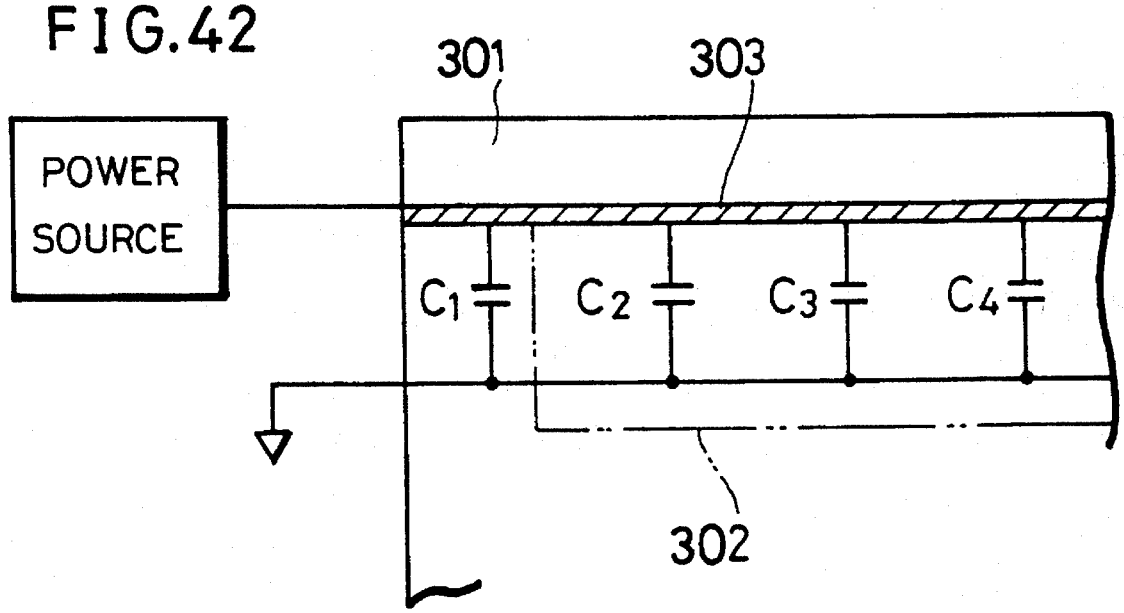
FIG. 42 is an explanatory drawing which shows a basic concept of the invention.
Figure 43:
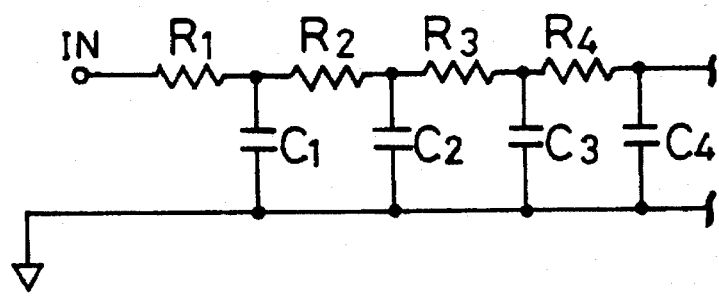
FIG. 43 is an explanatory drawing which shows an equivalent circuit with an arrangement shown in FIG. 42.

The basic concept of the semiconductor device according to the present embodiment is shown in FIGS. 42 and 43. As shown in FIG. 42, in the semiconductor device of the present embodiment, a semiconductor active device 302 and a power source line 303 for supplying a source power to the semiconductor active device 302 are provided on a substrate 301. In the present embodiment, capacitors $C_1 \cdot C_2 \ldots$ are connected to the power source line 303 on the substrate 301, and as shown in FIG. 43, a CR circuit is formed by the wiring resistance of the power source line 303 and the capacitors $C_1 \cdot C_2 \ldots$ which are treated as a distributed constant circuit. Further, a CR filter is formed equivalently by keeping an electrode which is on the opposite side of the power source line 303 in each capacitor to have a reference electric potential, for example, an earth electric potential. As a result, a high-frequency noise which is generated in the power source line 303 is reduced.

Here, FIGS. 42 and 43 only show the basic concept, so as described in the first embodiment, the number of input terminals in the power source line 303 as well as the number of the power source lines may be plural, and the electric potential of each power source line 303 may be also different. In addition, a component other than the C (capacity) and the R (resistance), for example, an L (inductance) component may be included. Furthermore, the electrode which is on the opposite side of the power source line 303 in each capacitor may be kept to have an electric source potential which is different from that of the power source line 303 even without being kept to have an earth electric potential, in other words, a power source line having an electric potential which is different from that of the power source line 303 may be used.

Figure 44:
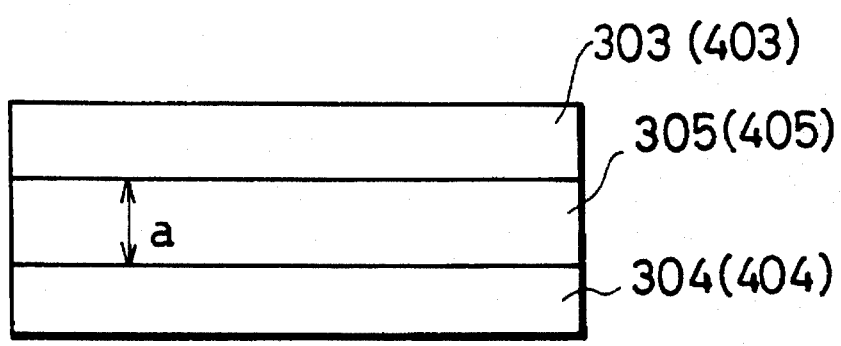
FIG. 44 is an explanatory drawing which shows one basic arrangement example of the semiconductor device.
Figure 45:
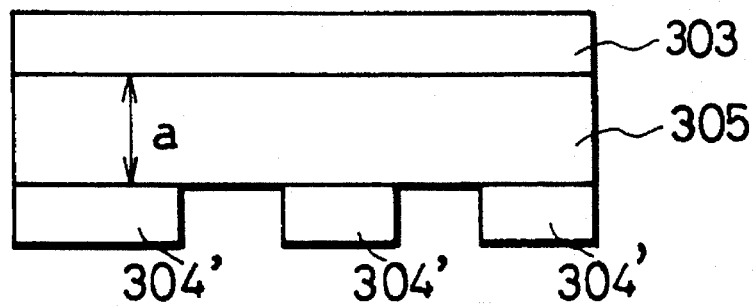
FIG. 45 is an explanatory drawing which shows another basic arrangement example of the semiconductor device.

FIGS. 44 and 45 show the more concrete concept. FIG. 44 shows an example where a line (band)-like capacity forming electrode 304 is provided opposite to the power source line 303 and a capacity forming dielectric 305 is mounted between the power source line 303 and the capacity forming electrode 304. Meanwhile, FIG. 45 shows an example where the electrode group for capacity formation 304' (a plurality of electrodes for capacity formation are arranged at regular intervals) is provided opposite to (crossing) the power source line 303 and the capacity forming dielectric 305 is mounted between the power source line 303 and the electrode group for capacity formation 304'. These examples are that the capacity forming dielectric 305 is mounted between the power source line 303 and the line-like capacity forming electrode 304 or between the power source line 303 and the electrode group for capacity formation 304' so that a capacitor is formed as a pair of counter electrodes constituted of the power source line 303 and the capacity forming electrode 304, or the power source line 303 and the capacity forming dielectric 304'.

Here, FIGS. 44 and 45 show the basic arrangement, so a distance between the power source line 303 and the electrode (group) for capacity formation 304 (304'), namely, a thickness a of the capacity forming dielectric 305 does not have to be uniform with respect to the whole area, and the thickness a of the capacity forming dielectric may change partially. Moreover, a dielectric constant of the capacity forming dielectric 305 may be partially different. Furthermore, a width and a thickness of the power source line 303 and the electrode (group) for capacity formation 304 (304') do not have to be uniform, so they may safely change depending upon a place. As explained referring to FIG. 42, the electrode (group) for capacity formation 304 (304') needs to be kept to have a reference potential, but as shown in FIG. 45, in the case where the capacity forming electrode is divided plurally, the reference potentials of the respective capacity forming electrode which constitute the electrode group for capacity formation 304' may vary.

Hereafter, the description does not particularly discuss the potential of the electrode (group) for capacity formation, but the description will be proceeded, assuming that the electrode (group) for capacity formation is kept to have the reference potential.

Figure 41:
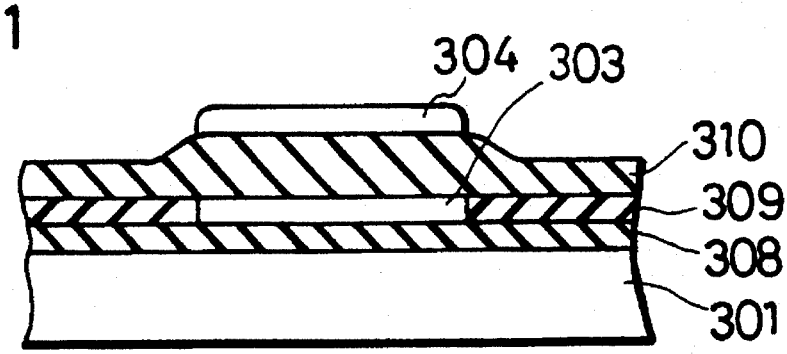
FIG. 41 is a schematic vertical section which shows a main section in a liquid crystal display unit according to the seventh embodiment of the present invention.

FIG. 41 shows one example of a wiring arrangement of the power source line 303 for suppling a power to circuits including the semiconductor active device which has formed on the insulating substrate 301. In the semiconductor device, in order to prevent an entrance of $Na^+$ ion, etc. into a semiconductor layer, a liquid crystal layer, etc., an insulating thin film made up of for example, $SiO_2$, $SiN_x$, etc., namely, a base coat film 308 is formed on the insulating substrate 301 such as a glass substrate by plasma CVD (chemical vapor deposition) etc.

In addition, an intrinsic semiconductor layer (so-called i layer), such as a polysilicon (hereinafter, referred as p-Si) film, an amorphous silicon (hereinafter, referred as a-Si), is formed on the base coat film 308 by LPCVD (low pressure CVD), PECVD (plasma enhanced CVD), etc. Then, an active device such as a transistor is formed by using the semiconductor layer. Since in the portion where the power source line 303 is formed, the semiconductor layer is removed in the later process by etching, here, the description will be proceeded, paying attention to the portion where the power source line 303 is formed.

A gate insulating film 309 made up of $SiO_2$, $SiN_x$, etc. is formed on the base coat film 308 by the PECVD, etc.

Next, the power source line 303 is formed simultaneously with, for example, gate wiring. This is done by (1) sputtering or evaporating Al, Nb, Ta, Mo, Cr, Al-Si, or alloy of these so as to form a film, (2) patterning the formed film by a photo lithograph process, and (3) removing an excessive part of the film by an etching process.

Thereafter, a layer insulating film 310 corresponding to the capacity forming dielectric made up of $SiO_2$, $SiN_x$, etc. is formed on the power source line 303 by the PECVD, etc.

In addition, the capacity forming electrode 304 is formed on a portion which is opposite to the power source line 303 on the layer insulating film 310. The capacity forming electrode 304 forms a film on the layer insulating film 310 (1) sputtering or evaporating Al, Nb, Ta, Mo, Cr, Al-Si or alloy of those, (2) pattering the formed film by the photo lithograph process, and (3) removing an excessive part of the film by the etching process. It is efficient that the wiring of the capacity forming electrode 304 is formed simultaneously with the wiring of source/drain of the transistor.

The above-mentioned forming method for each layer suitably changes with constitution of the semiconductor producing process or the arrangement of the active device such as the TFT. For example, the arrangement where the gate electrode is positioned closer to the insulating substrate 301 than the intrinsic semiconductor layer may be also applicable. In this case, if Ta is used for the gate electrode, an oxidation insulating film made up of $Ta_2O_6$ can be formed as the base coating film 308 by oxidizing the anode.

Figure 46:
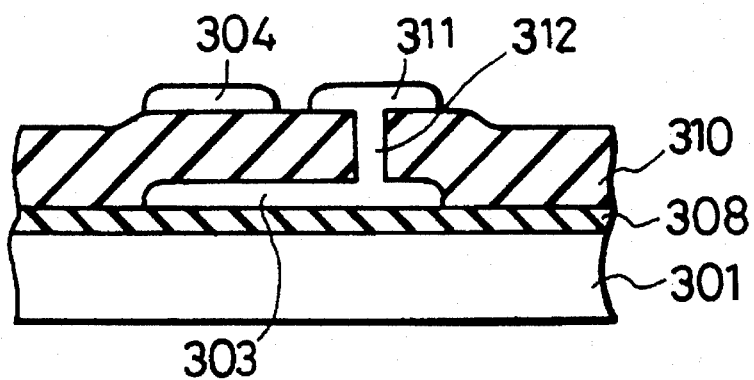
FIG. 46 is a schematic vertical section which shows a connecting portion between the power source line and wiring of another layer in the semiconductor device.
Figure 47:
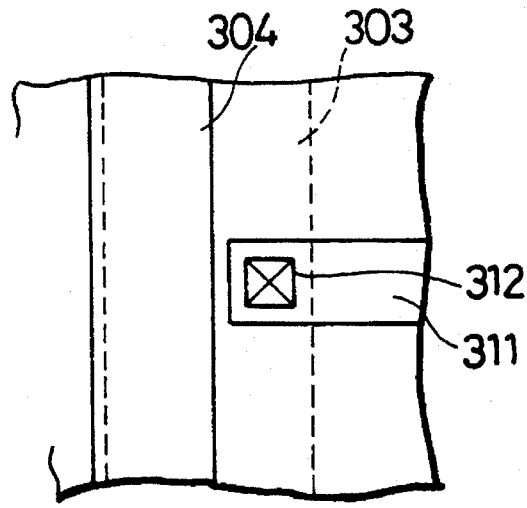
FIG. 47 is a schematic plan view which shows the connecting portion between the power source line and wiring of another layer in the semiconductor device.
Figure 48:
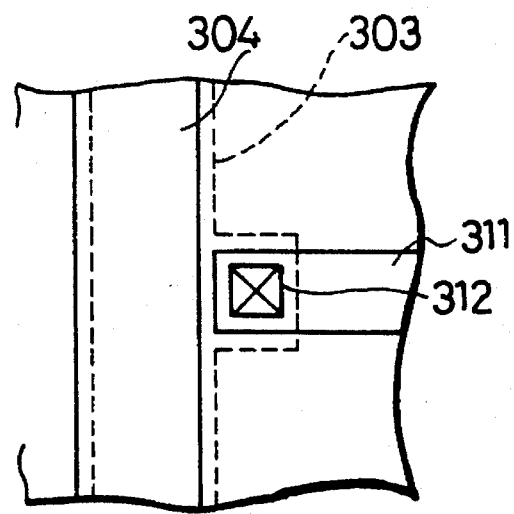
FIG. 48 is a schematic plan view which shows one variation example of the connecting portion between the power source line and wiring of another layer in the semiconductor device.
Figure 49:
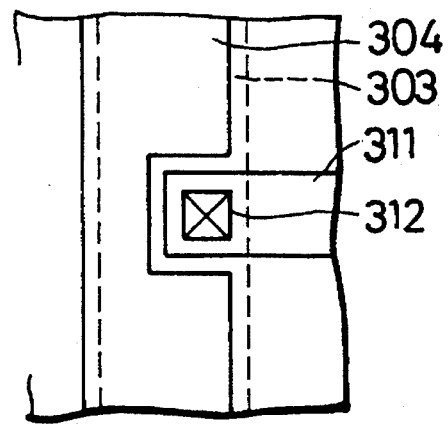
FIG. 49 is a schematic plan view which shows another variation example of the connecting portion between the power source line and wiring of another layer in the semiconductor device.
Figure 50:
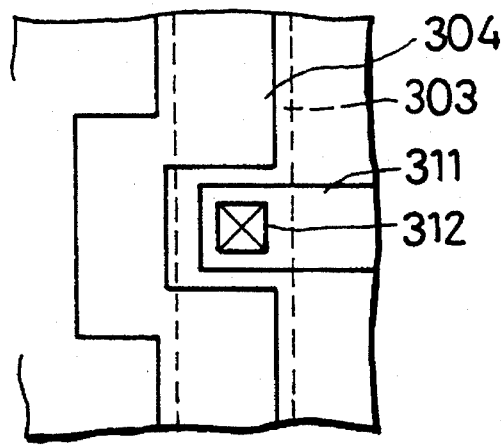
FIG. 50 is a schematic plan view which shows still another variation example of the connecting portion between the power source line and wiring of another layer in the semiconductor device.

Incidentally, when the power source line 303 is connected to the active device circuit, there sometimes arises the case where the power source 303 contacts with a wiring formed on another layer. In this case, for example, as shown in FIG. 46, a method may be used that the power source line 303 and the capacity forming electrode 304 are shifted each other at the part where the power source line 303 contacts with wiring 311 on another layer via a contact hole 312. As an example of this method, methods shown in FIGS. 47 through 50 are considered. FIG. 47 shows an example that the capacity forming electrode 304 is wired so as not to touch the contact area of the power source line 303, FIG. 48 shows an example that the power source line 303 is protruded with respect to only the contact area, on the contrary, FIG. 49 shows an example that only the capacity forming electrode 304 is removed with respect to only the contact area of the power source line 303, and FIG. 50 shows an example that the capacity forming electrode 304 detours around the contact area of the power source line 303.

Here, only the contact of the power source line 303 with another layer is mentioned, but also in the case where the capacity forming electrode 304 comes into contact with another layer, the same arrangements as the power source line 303 should be required.

Figure 51:
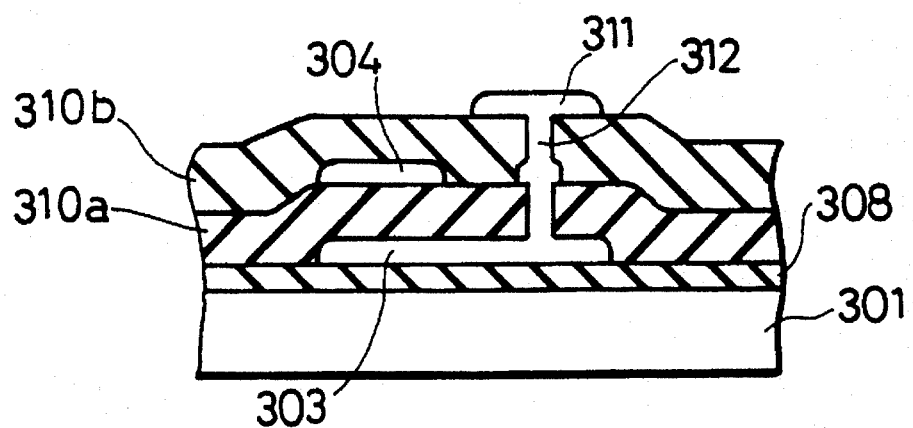
FIG. 51 is a schematic vertical section which shows one variation example of the connecting portion between the power source line and wiring of another layer in the semiconductor device.

If a distance between electrodes which forms the capacitor (namely, a distance between the power source line 303 and the capacity forming electrode 304) becomes great, in other words, the film thickness of the layer insulating film 310 becomes great, capacity of the capacitor is reduced, and an effect of the CR filter is likely to be reduced. In this case, as shown in FIG. 51, wiring 311, which is connected to the power source line 303, and the capacity forming electrode 304 are not formed on one substrate, and the distance between the power source line 303 and the capacity forming electrode 304 may be reduced to be smaller than the distance between the power source line 303 and the wiring 311. In order to make it possible to realize the above arrangement, a layer insulating film 310a as the capacity forming dielectric 305 is formed after the formation of the power source line 303, and the capacity forming electrode 304 is formed on the layer insulating film 310a. Thereafter, a layer insulating film 310b is formed thereon, and the wiring 11 is formed on the layer insulating film 310b.

Figure 52:
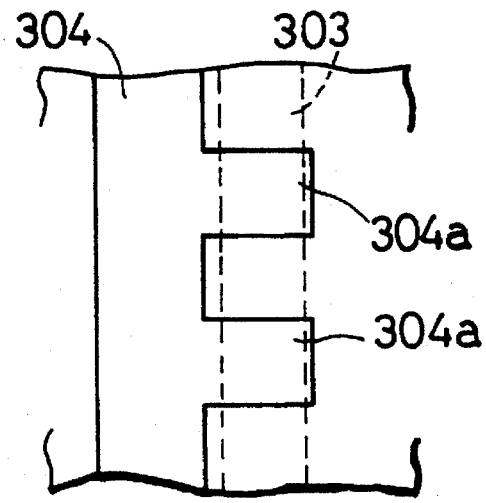
FIG. 52 is a schematic plan view which shows a variation example that the power source line is partially overlapped on the capacity forming electrode in the semiconductor device.

As shown in FIG. 52, the power source line 303 and the capacity forming electrode 304 may partially overlap each other, in other words, the capacitor is not formed over the whole power source line 303, so the capacitor may be partially formed. In this case, since the capacitor is formed invariably, for example, an area of each overlapped section 304a and a distance between the capacity forming electrode 304 and the power source line 303 on each overlapped section 304a are set so that each capacitor formed on the overlapped section 304a of the power source line 303 and the capacity forming electrode 304 has nearly equal capacity, thereby making it possible to intensively eliminate a high-frequency noise having a predetermined frequency.

Figure 53:
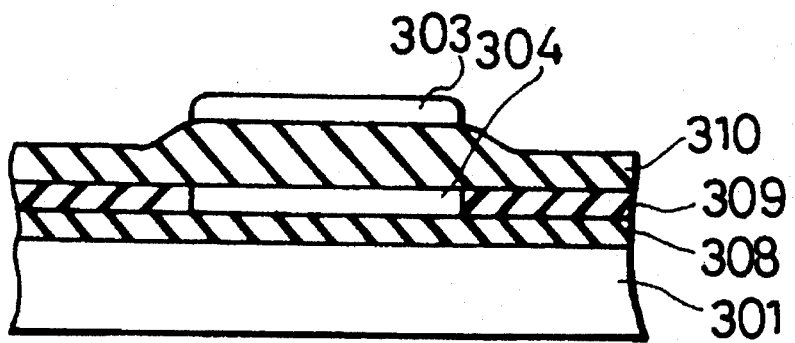
FIG. 53 is a schematic vertical section which shows a variation example that the capacity forming electrode is formed closer to the substrate than the power source line in the semiconductor device.

In the above arrangement, although the power source line 303 is formed earlier than the capacity forming electrode 304 and the power source line 303 is installed closer to the substrate 301 than the capacity forming electrode 304, the positions of these are not limited to this. Therefore, as shown in FIG. 53, after the capacity forming electrode 304 may be formed first, the layer insulating film 310 and the power source line 303 may be formed in this order.

Figure 54:
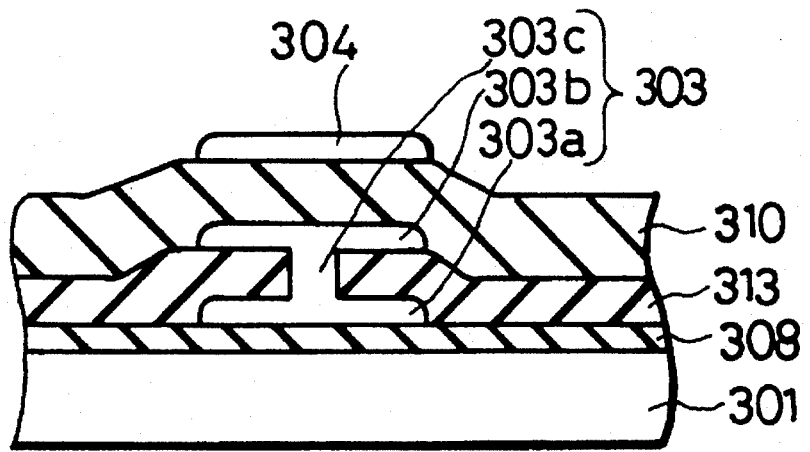
FIG. 54 is a schematic vertical section which shows variation example that the power source line is wired over two layers in the semiconductor device.

As shown in FIG. 54, the power source line 303 may have an arrangement of two-layer wiring that a first layer section 303a and a second layer section 303b, which have been installed opposite to each other through the insulating film 313, are connected at a contact hole 303c. Needless to say, the capacity forming electrode 304 may also have the same arrangement of two-layer wiring.

Figure 55:
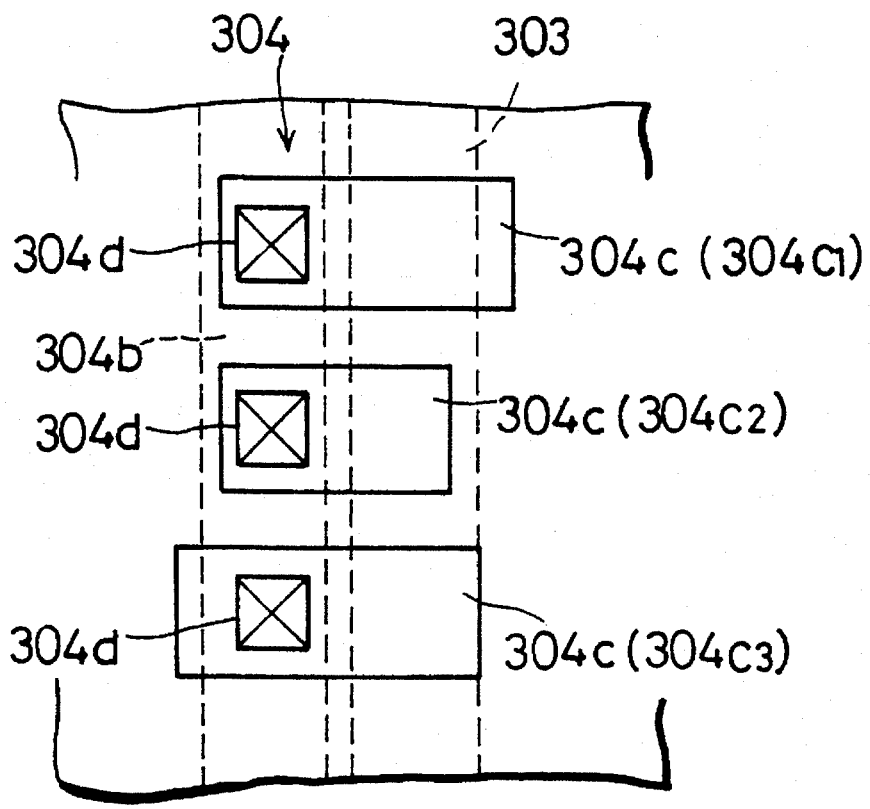
FIG. 55 is a schematic plan view which shows another variation example that the power source line is partially overlapped on the capacity forming electrode in the semiconductor device.

As shown in FIG. 55, a main body section 304b of the capacity forming electrode 304 may be formed on the layer where the power source line 303 is formed, and capacity forming sections 304c... which partially overlap the power source line 303 are formed on another layer so that the main body section 304b may be connected to each capacity forming section 304c... by the contact hole 304d. In this case, an overlapping amount of the capacity forming section 304c and the power source line 303 is not particularly limited. For example, like a capacity forming section 304c$_1$, its tip may stick out from the power source line 303, like a capacity forming section 304c$_2$, its tip may be within an area of the power source line 303, or like a capacity forming section 304c$_3$, its tip may almost mate with the end of the power source line 303.

Each example mentioned above shows only a basic arrangement of the present invention, so another arrangement should be added as required.

The present invention shall not be limited to the arrangements shown in each drawing. For example, the overlapping section of the power source line 303 and the capacity forming electrode 304 can have various patterns as shown in FIG. 55. Furthermore, the layouts of the power source line 303 and the capacity forming electrode 304 may be completed in combination with the arrangements in each drawing. The power source line 303 and the capacity forming electrode 304 do not need to have a linear configuration, so they may have a curved configuration. The capacity forming electrode 304 does not need to have a line-like configuration, so it may safely have another configuration such as a flat board-like one. A capacitor does not have to be installed over the whole power source line 303, so may be installed only on a part of it.

As mentioned above, the semiconductor device of the present embodiment is arranged so as to include the semiconductor active device 302 and the power source line 303 for supplying a source voltage to the semiconductor active device 302 on the substrate 301, the capacity forming electrode 304 having a reference voltage at least one part of which is arranged opposite to the power source line 303, and the capacity forming dielectric 305 which is arranged between the power source line 303 and the capacity forming electrode 304 arranged being opposite to each other.

As a result, the capacitor whose electrodes are constituted of the power source line 303 and the capacity forming electrode 304 is formed, the CR filter is equivalently formed by the wiring resistance of the power source line 303 which is used as a distribution constant circuit and the capacitor, thereby reducing the impedance of the power source line 303. Then, the CR filter, namely, a low-pass filter reduces a high-frequency noise generated in the power source line 303, such as fluctuation of a voltage due to fluctuation of an electric current involved by an ON/OFF operation of each semiconductor active device 302 connected to the power source line 303, thereby making it possible to substantially reduce the occurrence of the irregular operation of circuits such as fluctuation of a signal level, a faulty operation, delay of signal.

Eighth Embodiment

Next, referring to FIGS. 56 through 65, the following description will discuss the eighth embodiment of the present invention.

Here, for convenience of explanation, those members that have the same arrangement and functions, and that are described in the aforementioned embodiment are indicated by the same reference numerals and the description thereof is omitted.

In the seventh embodiment, there explained the method that the capacitor is formed by providing the capacity forming electrode 304 on the substrate where the power source line 303 is installed, but in the present embodiment, there will explain the method that the power source line 303 and the capacity forming electrode 304 are provided on separate substrates. As the example, the following description will illustrate an image display unit having a plurality of substrates which have been installed opposite to one another, especially a liquid crystal display unit having an active device.

Figure 56:
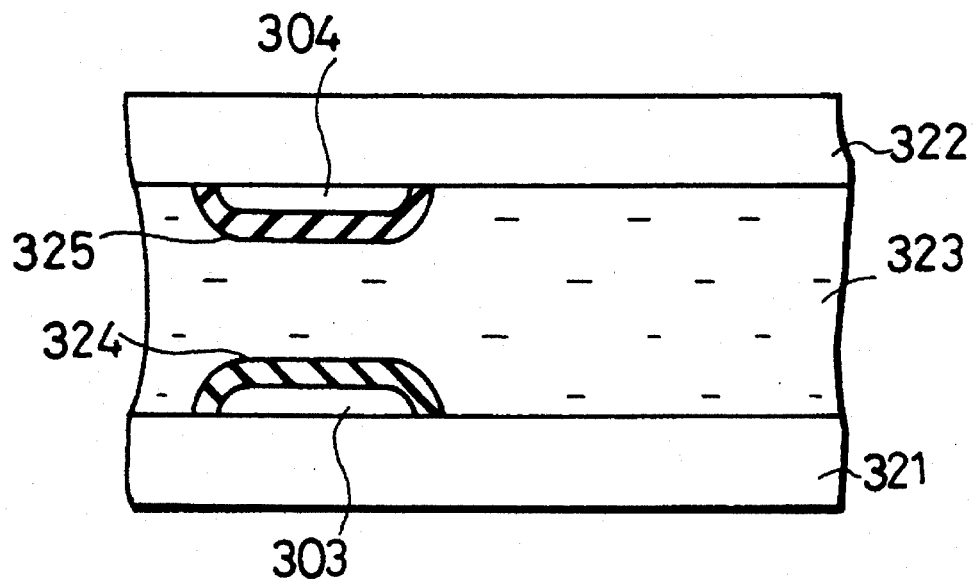
FIG. 56 is a schematic vertical section which shows an arrangement of a main section of a liquid crystal display unit according to the eighth embodiment of the present invention.

As shown in FIG. 56, the liquid crystal display unit of the present embodiment as the semiconductor device has an active device forming substrate 321 (first substrate) where a semiconductor active device such as a TFT has been formed, a counter electrode forming substrate 322 (second substrate, opposite substrate) installed opposite to the active device formation substrate 321, and liquid crystal 323 sealed by a seal member (not shown) which is poured between the substrates 321 and 322. Here, FIG. 56 does not show another components such as the aforementioned base coat film, an orientation film for controlling an orientation state of the liquid crystal, but these film should be provided on the substrates 321 and 322 as required. This is also applied to the further description.

On the active device formation substrate 321, a circuit including the semiconductor active elements on a transparent insulating substrate such as a glass substrate, such as a picture element section, a data driver (image display control means), a scanning driver (image display control means), is monolithically formed. Although the a-SiTFT or the p-SiTFT is considered as the semiconductor active device, especially the p-SiTFT is most suitable.

The picture element section is formed (1) by installing a plurality of band-like data signal lines constituted of a transparent conductive film on a transparent conductive substrate so as to be parallel to one another, (2) by installing a plurality of band-like scanning lines constituted of the transparent conductive film so as to be right angles to the data signal lines and (3) by installing picture element electrodes constituted of the semiconductor active device such as the TFT and the transparent conductive film connected to each semiconductor active device around the intersection of the data signal lines and the scanning signal lines so as to form a matrix.

The data driver is a circuit connected to each data signal line of the picture element section, and samples a data signal for display represented by a video signal so as to transmit the sampled data signal for display to each data signal line.

The scanning driver is a circuit connected to each scanning signal line of the picture element section, and outputs a scanning signal for line-successively scanning each scanning signal line to each scanning signal line.

On the counter electrode forming substrate 22, the opposite electrodes constituted of the transparent conductive film, which becomes a common electrode to each picture element electrode with it arranged on the transparent insulating substrate such as a glass substrate opposite to each picture element electrode, is formed.

On the active device forming substrate 21, the power source line 303 for supplying a power from an external power source to the data driver and the scanning driver is wired, and on the periphery of the power source line 303, a protection film 324 made up of an SiO$_2$ film (BPSG: boron-doped phospho-silicate glass) including SiN$_x$, B and P, an SiO$_2$ film (PSG: phospho-silicate glass) including P, or the protective film 324 made by the transparent insulating film such as SiO$_2$ film is formed.

Meanwhile, on the counter electrode forming substrate 322, the capacity forming electrode 304 is formed opposite to the power source line 303, and the capacity forming electrode 304 is also coated by a protective film 325 having the same arrangement as the protective film 324.

Liquid crystal 323 as the capacity forming dielectric 305 lies between the power source line 303 formed on the active device formation substrate 321 and the capacity forming electrode 304 formed on the counter electrode forming substrate 322. Therefore, the capacitor is formed by the power source line 303, the capacity forming electrode 304 and the liquid crystal 323.

In the case where the liquid crystal 323 for display is used as the capacity forming dielectric 305, if the liquid crystal 323 deteriorates (electrolysis occurs) due to application of a d.c. voltage, the polarity of the capacity forming electrode 304 should be inverted in a alternating way with respect to the power source line 303. However, when a liquid crystal driving system, which periodically changes the electric potential of the power source line 303 at a predetermined amplitude is used, the potential of the capacity forming electrode 304 may be set at mid-point of an oscillating potential of the power source line 303.

Figure 57:
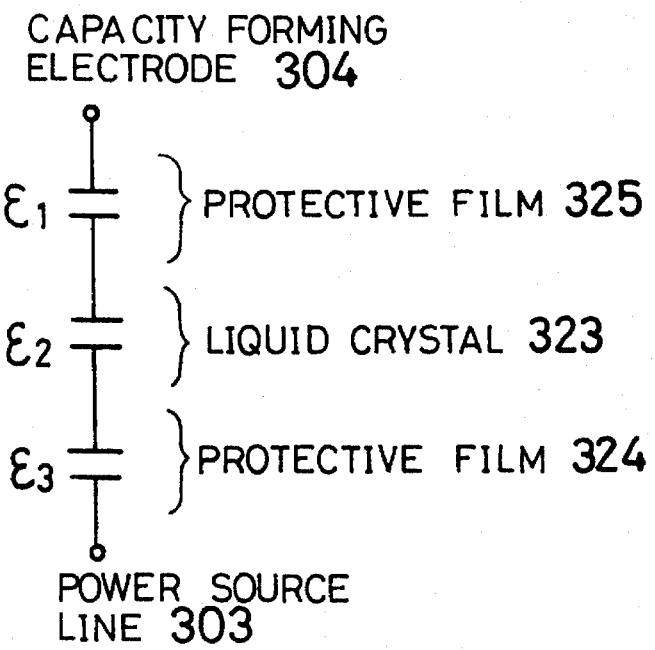
FIG. 57 is an explanatory drawing which shows the equivalent circuit with the arrangement shown in FIG. 56.

In addition, in the case of the arrangement shown in FIG. 56, the capacitor is considered to be formed as shown in FIG. 57. Since this arrangement is equivalent to that three capacitors are connected in series, considering dielectric constants $\epsilon_1$, $\epsilon_2$ and $\epsilon_3$ of the protective film 325, the liquid crystal 323 and the protective film 324, the materials of these should be selected.

Figure 58:
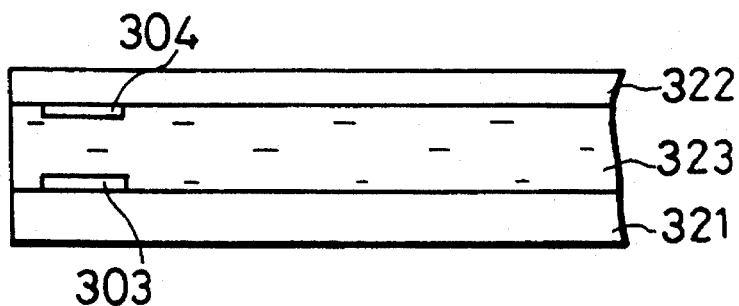
FIG. 58 is a schematic vertical section which shows a variation example that protective films covering the power source line and the capacity forming electrode are omitted in the liquid crystal display unit.

In the case where the power source line 303 and the capacity forming electrode 304 is of a material which does not require the protective films 324 and 325, such as ITO (indium tin oxide), as shown in FIG. 58, the protective film can be omitted.

Figure 59:
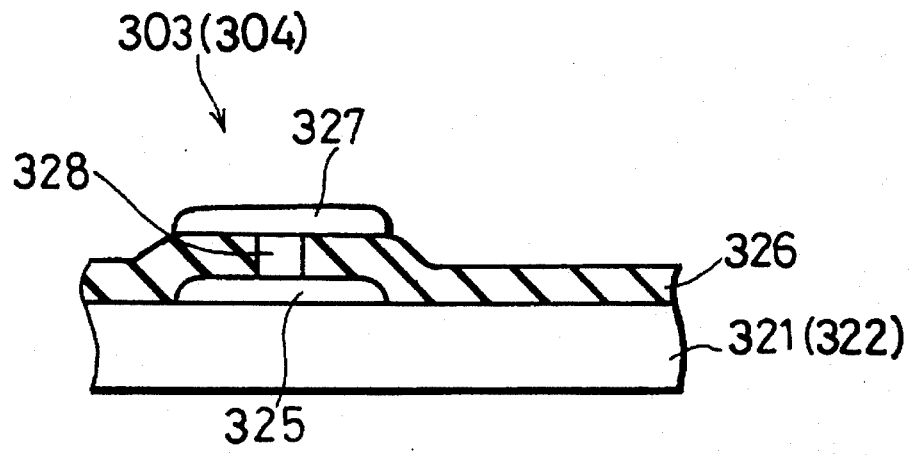
FIG. 59 is a schematic vertical section which shows one variation example that the power source line or the capacity forming electrode has a two-layer structure consisting of an ITO (indium tin oxide) film and a metal film in the liquid crystal display unit.
Figure 60:
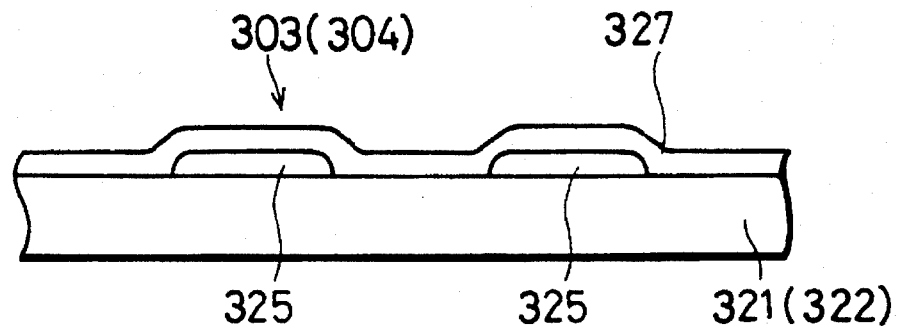
FIG. 60 is a schematic vertical section which shows another variation example that the power source line or the capacity forming electrode has the tow-layer structure consisting of the ITO film and the metal film in the liquid crystal display unit.

For example, in the case where the ITO is used, it may be considered that since the impedance of a portion corresponding to the ITO is high, the ITO is difficult to be used as the power source line 303 and the capacity forming electrode 304. In this case, as shown in FIG. 59 or FIG. 60, the power source line 303 and the capacity forming electrode 304 may have a tow-layer composition of an ITO film 327 (nonmetallic conductive film) and a metal film 325. FIG. 59 shows an example that the metal film 325 is formed on the substrate 321 (322), an insulating film 326 is formed thereon, the ITO film 327 is further formed thereon, and the ITO film 327 and the metal film 325 are connected by means of the contact hole 328 so that the power source line 303 and the capacity forming electrode 304 are formed. FIG. 60 shows an example that the metal films 325 . . . are formed at several points on the substrate 321 (322) and the ITO film 327 is formed over the metal films 325 . . . so that the power source line 303 and the capacity forming electrode 304 are formed.

Figure 61:
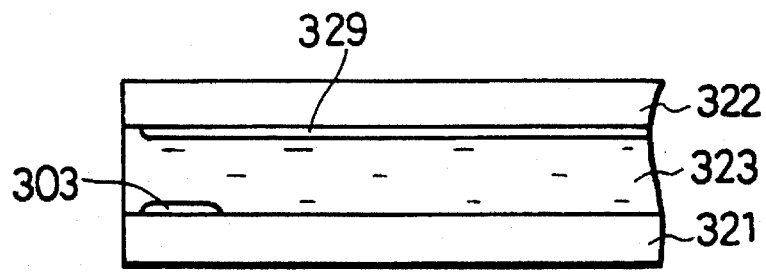
FIG. 61 is a schematic vertical section which shows a variation example that the capacity forming electrode is used also as a counter electrode in the liquid crystal display unit.

As shown in FIG. 61, a counter electrode 329 which is formed on the counter electrode forming substrate 322 is extended to a position where the counter electrode 329 is opposite to the power source line 303 formed on the active device forming substrate 321, thereby, making it possible to use the counter electrode 329 also as the capacity forming electrode 304.

Figure 62:
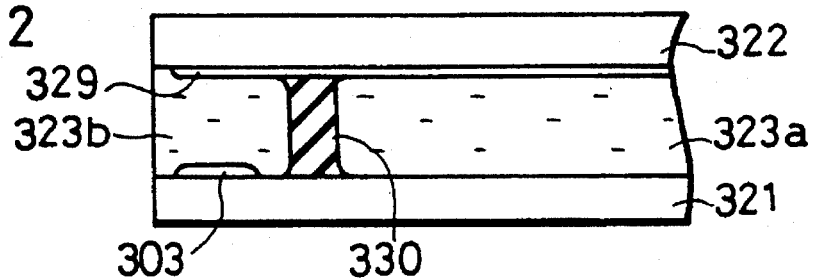
FIG. 62 is a schematic vertical section which shows a variation example that liquid crystal for display and liquid crystal as a capacity forming dielectric are separated by a partition in the liquid crystal display unit.

In the case where the liquid crystal to be used for display may be deteriorated due to application of a d.c. voltage, as shown in FIG. 62, it is desirable that a liquid crystal for display 323a and a liquid crystal 323b as the capacity forming dielectric 305 are separated by a partition (partition member) 303. Here, in order to sealing the liquid crystal 323a for display between the active device formation substrate 321 and the counter electrode forming substrate 322, a sealing member can be used as the partition 330. In such a way, in the case where the liquid crystal 323a for display and the liquid crystal 323b for the CR filter are separated, with respect to the liquid crystal 323a and 323b, different kind of liquid crystal can be used.

Figure 63:
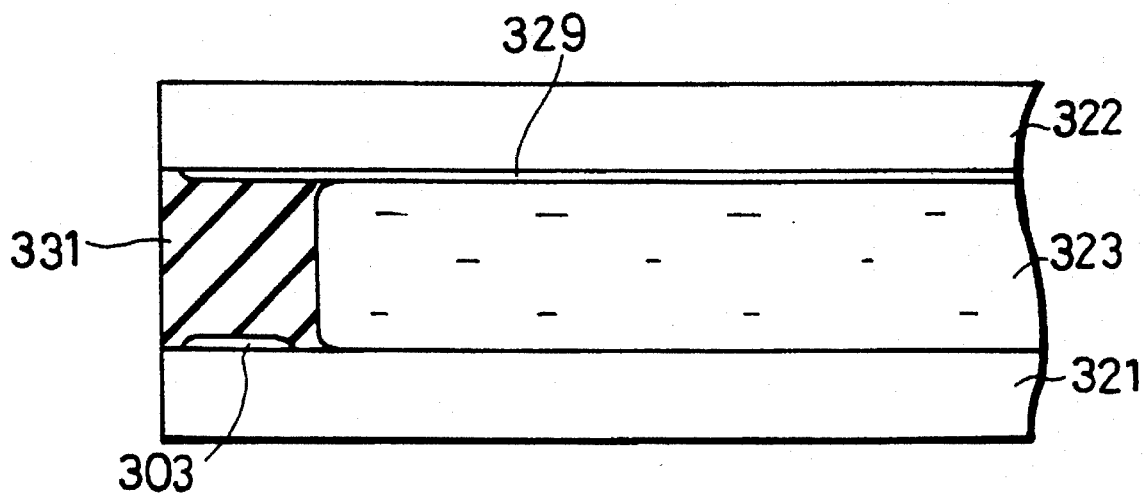
FIG. 63 is a schematic vertical section which shows a variation example that the capacity forming dielectric is used also as a sealing member in the liquid crystal display unit.

In addition, the liquid crystal does not particularly need to be used as the capacity forming dielectric 305 even for the liquid crystal device. For example, as shown in FIG. 63, the sealing member 311 can be also used as the capacity forming dielectric 305. In this case, the effect of improving a ratio of an effective display area in the display device can be obtained.

As to another component, for example, shading means composed of a metal layer for preventing a light from reaching to the semiconductor layer can be also used as the capacity forming electrode 304.

As mentioned above, in the semiconductor device of the present invention, the active device forming substrate 321 where the semiconductor active device is formed and the counter electrode substrate 322 are installed. The semiconductor active device and the power source line 303 for supplying a source voltage to the semiconductor active device are provided on the active device forming substrate 321, and the capacity forming electrode 304 having reference potential is arranged on the counter electrode forming substrate 322 arranged opposite to the active device forming substrate 321 so that at least one portion of the capacity forming electrode 304 is opposite to the power source line 303. Further, the capacity forming dielectric 305 is arranged between the power source line 303 and the capacity forming electrode 304 which are arranged opposite to each other.

As a result, as mentioned in the seventh embodiment, the capacitor, which is a pair of the opposite electrodes composed of the power source line 303 and the capacity forming electrode 304, is formed, and the CR filter is formed equivalently by the wiring resistance of the power source line 303 which is treated as a distributed constant circuit and the capacitor, thereby making it possible to lower the impedance of the power source line 303. Since the high-frequency noise which occurs in the power source line 303 is reduced by the CR filter more greatly, the occurrence of irregular operation of the circuit, such as a fluctuation in the signal level, a faulty operation, delay of a signal, can be reduced more substantially.

In the above description, the image display device having the arrangement that the power source line 303 is formed on the insulating substrate such as the glass substrate, especially the liquid crystal display unit was illustrated as the semiconductor device. However, the image display device is not limited to the liquid crystal display unit, so another image display devices, for example, display devices adopting an electroluminescence (EL), a plasma display panel (PDP), fluorescence, light emitting diode are also applicable.

In addition, the substrate where the power source 303 is wired is not limited to the insulating substrate such as the glass substrate. For example, a semiconductor device having an arrangement that the power source 303 is formed on the semiconductor substrate such as the monocrystal silicon substrate where the insulating film is formed may be also applicable.

Figure 64:
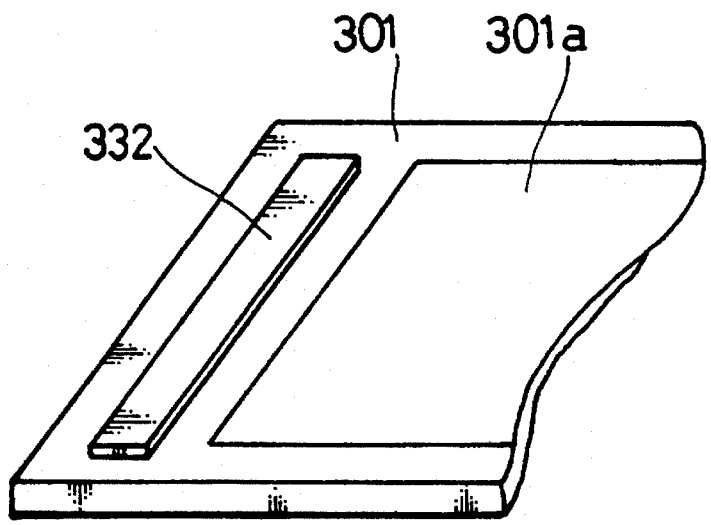
FIG. 64 is an explanatory drawing which shows a variation example that a semiconductor chip is mounted on the substrate where a picture element section is formed in the liquid crystal display unit.

In the above embodiment, an example is given that the semiconductor active device circuit which requires the power source line 303 of the data driver, the scanning driver, etc. is formed monolithically on the substrate where the picture element section is formed. However, the present invention is applicable to all semiconductor devices where the power source 303 needs to be formed on the substrate 301. For example, as shown in FIG. 64, also in the case where a semiconductor chip 332 which requires the power source line of the data driver, the scanning driver, etc. is mounted on the substrate 301 where the picture element section 301a has been formed (for example, in the case of the glass substrate, the semiconductor chip is mounted by means of a mounting method which is so-called COG), just as the case where each semiconductor active device is formed monolithically on the substrate, the power source line 303 for supplying a power to the semiconductor chip 332 needs to be formed on the substrate 301. Therefore, the present invention is effectively applicable.

The semiconductor chip 332 to be mounted on the substrate 301 may be not only one that the semiconductor active device is formed on the semiconductor substrate represented by a monocrystal silicon substrate where the insulating film is formed, but also one composed of the semiconductor active device formed on an insulating substrate, for example, one constituted by forming the TFT on the glass substrate.

In this semiconductor chip 332, since a power supply line for supplying an electric power to the semiconductor active device formed on the chip substrate is formed on the chip substrate, the capacitor can be formed for the power source line by means of all kinds of methods mentioned in the seventh embodiment. Namely, the semiconductor chip has the chip substrate, the semiconductor active device formed on the chip substrate and the power source line connected to the chip substrate. In this semiconductor chip, as shown in FIG. 44, a second capacity forming electrode 404 having a reference potential is arranged so that one portion of the second capacity forming electrode 404 is opposite to the the power supply line 403, and a second capacity forming dielectric 405 is arranged between the power supply line 403 and the second capacity forming electrode 404 which are arranged opposite to each other. Here, a potential of the second capacity forming electrode 404 may differ from that of the capacity forming electrode 304.

In the case where the semiconductor chip 332 is mounted on the substrate 301 in the above manner, the power source line 303 for supplying an electric power to the semiconductor chip 332 is formed on the substrate 301, and the power supply line 403 for supplying an electric power to the semiconductor active device is formed also in the semiconductor chip 332. However, as mentioned above, the CR filter is formed not only in the power source line 303 on the substrate 301 but also in the power supply line 403 in the semiconductor chip 332, thereby making it possible to reduce a high-frequency noise in the whole device.

Figure 65:
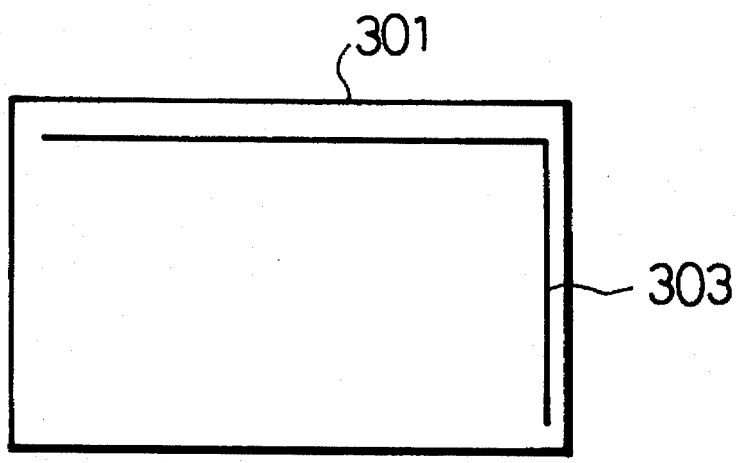
FIG. 65 is an explanatory drawing which shows a wiring example of the power source line formed on the substrate.
Figure 66:
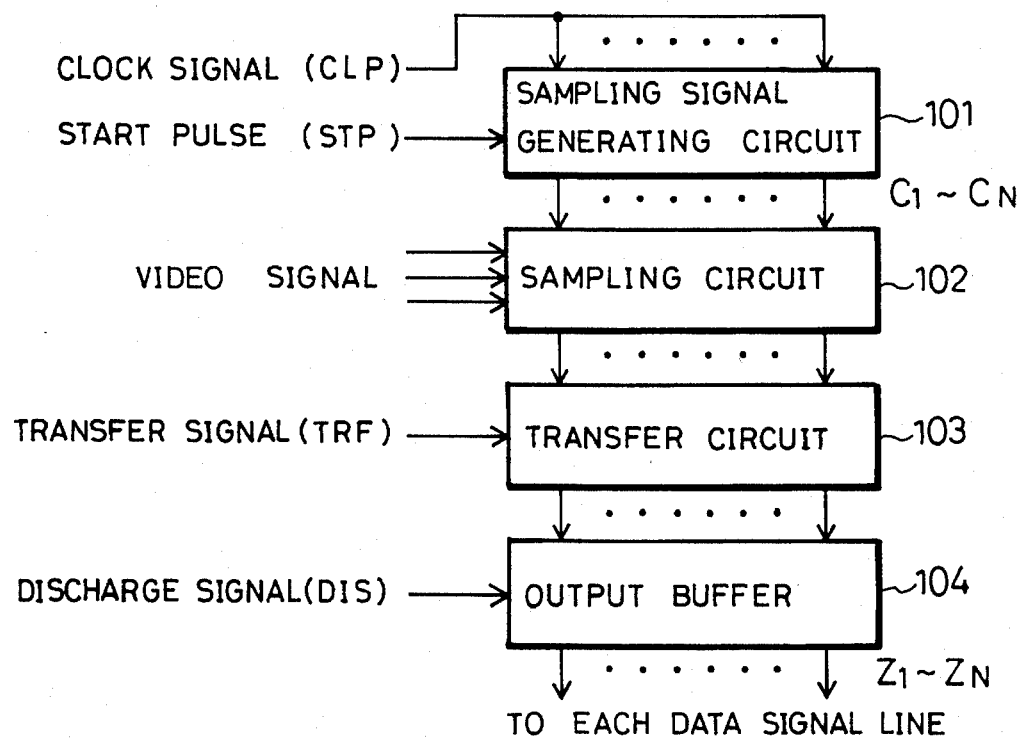
FIG. 66 is a block diagram which shows a constitution of a data driver where a line successive scanning system is adopted in a conventional liquid crystal display unit.
Figure 67:
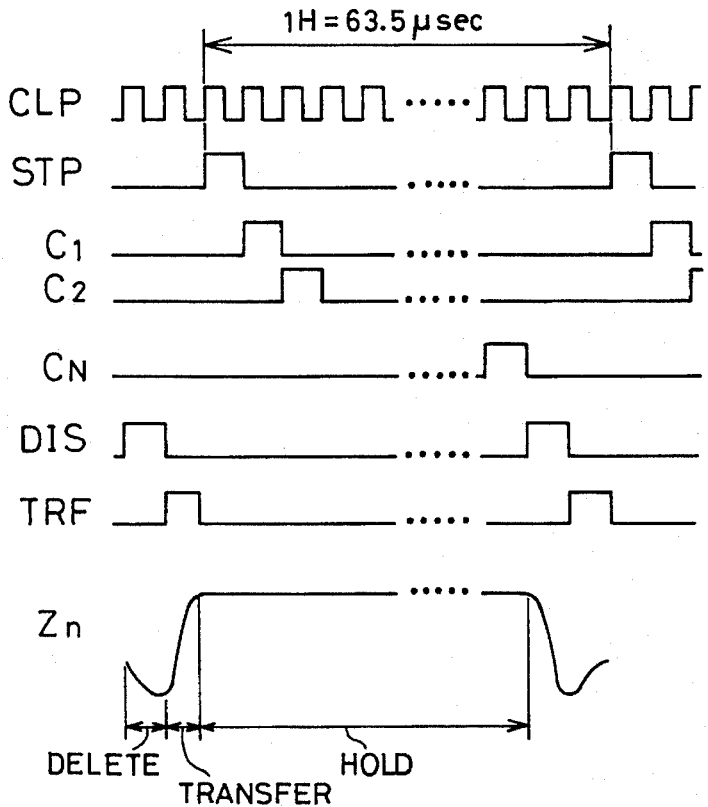
FIG. 67 is a timing chart of all kinds of signals in the data driver shown in FIG. 66.
Figure 68:
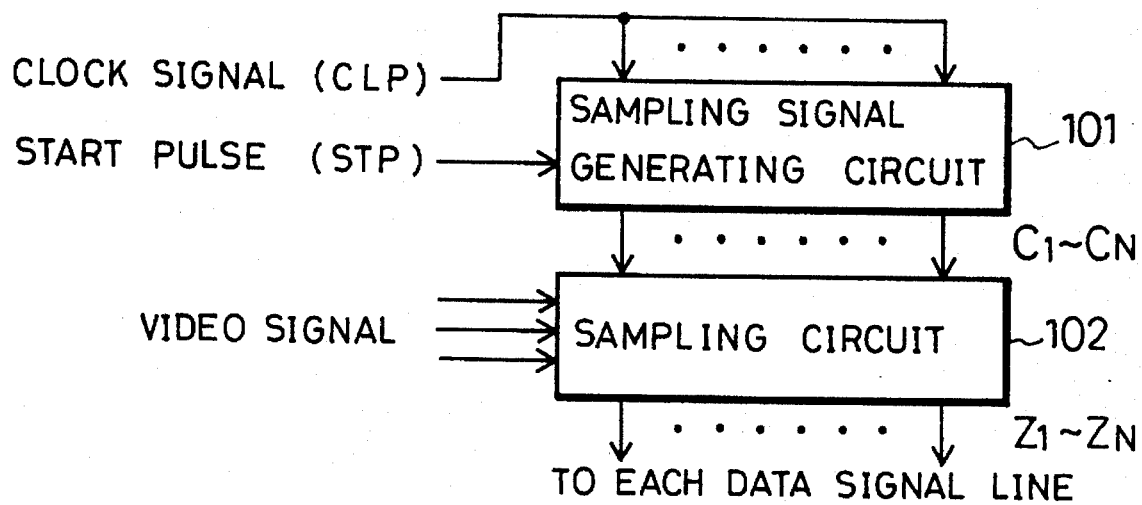
FIG. 68 is a block diagram which shows a constitution of a data driver where a point successive scanning system is adopted in a conventional liquid crystal display unit.
Figure 69:
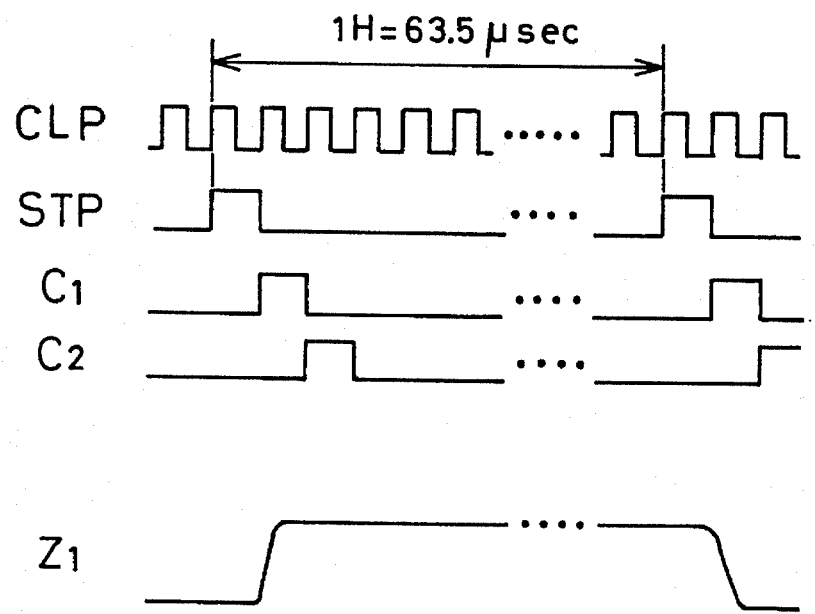
FIG. 69 is a timing chart of all kinds of signals in the data driver shown in FIG. 68.
Figure 70:
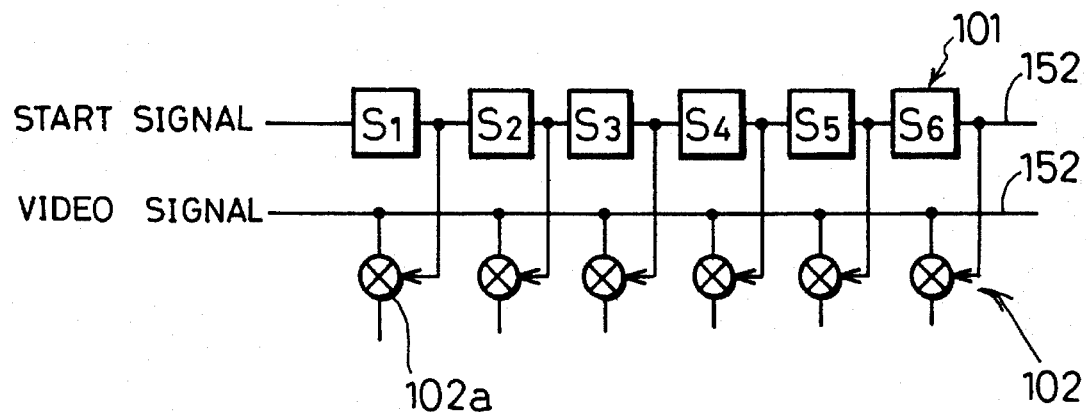
FIG. 70 is an explanatory drawing which shows an arrangement of a main section of the data driver in a conventional liquid crystal display unit.
Figure 71:
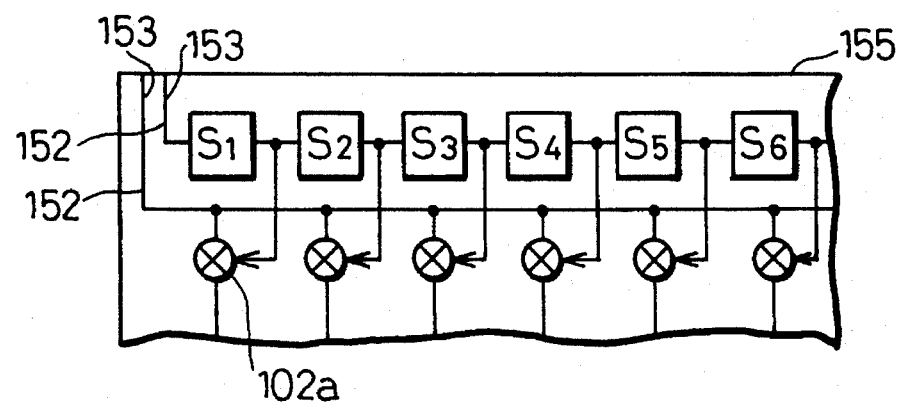
FIG. 71 is an explanatory drawing which shows a wiring condition of a start signal line and a video signal line for inputting a signal to a shift register circuit in the conventional liquid crystal display unit.
Figure 72:
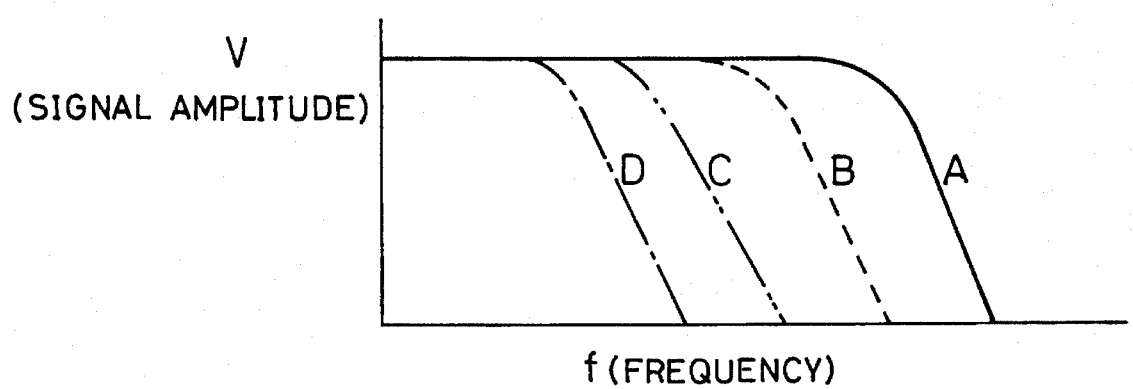
FIG. 72 is a graph which shows a variation in a band characteristic corresponding to a passing distance of a signal in a driver circuit in the conventional liquid crystal display unit.
Figure 75:
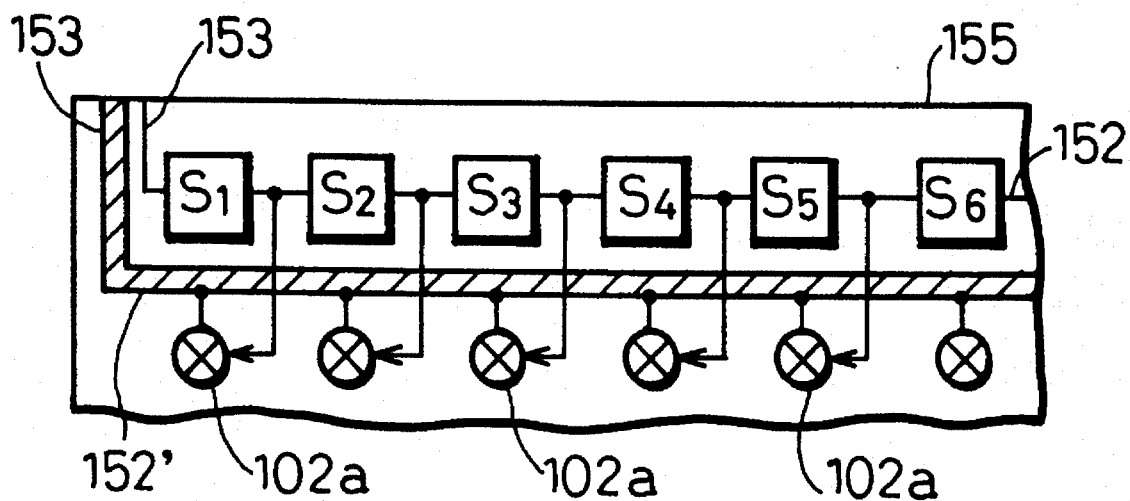
FIG. 75 is an explanatory drawing which shows an arrangement that the video signal line is made thick in the conventional liquid crystal display unit.
Figure 76:
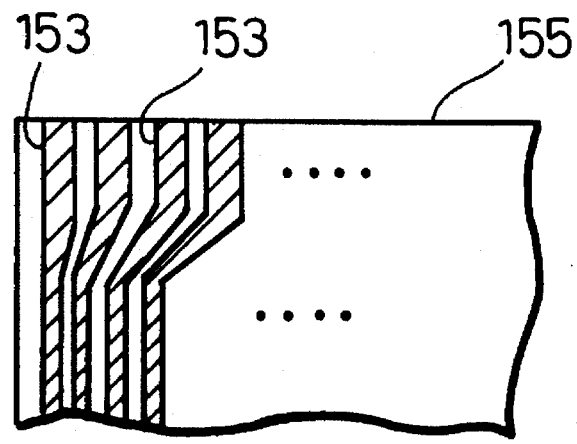
FIG. 76 is an explanatory drawing which shows an arrangement of a connecting pad on the edge of the substrate in the conventional liquid crystal display unit.
Figure 77:
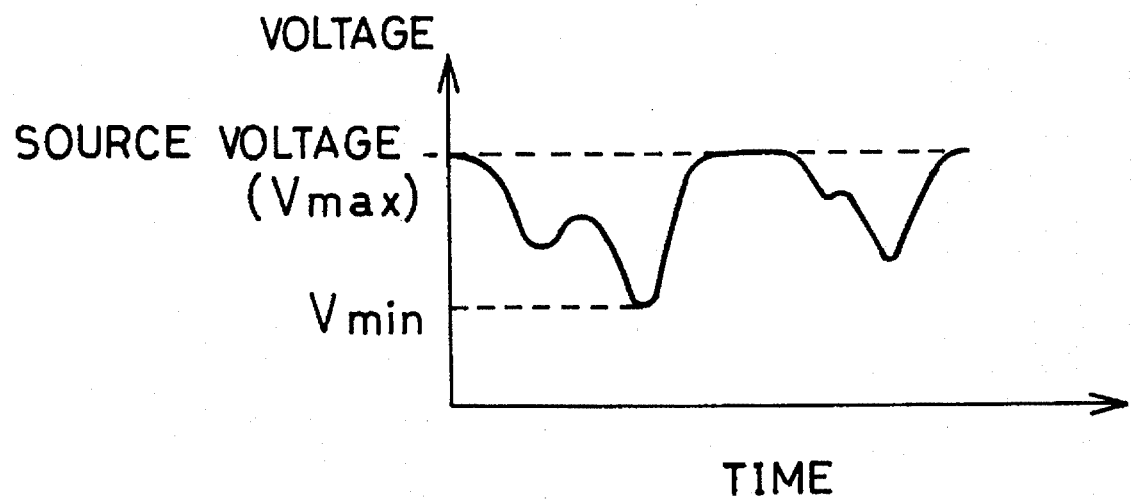
FIG. 77 is an explanatory drawing which shows a waveform of a voltage in a certain portion in the power source line in the conventional liquid crystal display unit.
Figure 78:
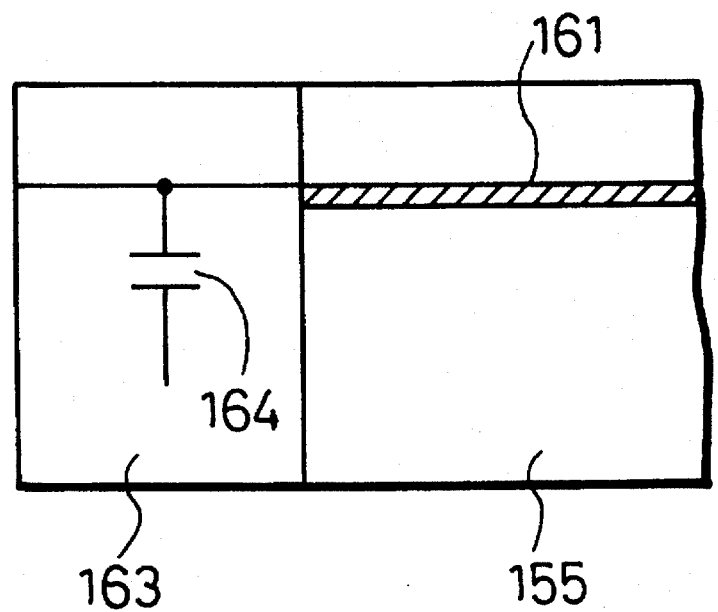
FIG. 78 is an explanatory drawing which explains a conventional method for reducing a high-frequency noise such that a capacitor is installed on the outside of the display substrate and is connected to the power source line.

If a wiring is made so that resistivity ρ of a wiring material is 5 μΩcm and a film thickness is 300 nm (sheet resistance: 2×0.17 Ω/□) provided that the wiring width of the semiconductor device is 100 μm, the wiring resistance becomes 17 Ω for 1 cm wiring. In addition if a device whose wiring is more fine is assumed, when the wiring width is 10 μm, the wiring resistance becomes 170 Ω for 1 cm wiring. An alternating impedance limitation in the power source line is considered to be 10 to 20 Ω. Supposing a semiconductor device whose aspect ratio is 3:4, as shown in FIG. 65, in the case where the power source line 303 is wired along the edge of the substrate 301 from an angle to the opposite angle lengthwise and crosswise, if the wiring resistance with respect to a diagonal length of 0.8 cm is 17 Ω per centimeter, the wiring resistance becomes approximately 20 Ω. Therefore, in devices whose diagonal length is 0.8 cm or more, application of the present invention to this device lowers impedance of the power source line 303, so a great effect can be expected. The present invention is especially applicable to a large-size semiconductor device where a semiconductor active device is formed on a substrate suitable for enlarging the size of substrate such as a glass substrate.

Here, the first through eighth embodiments illustrated the image display device (especially, liquid crystal display unit), but the semiconductor device of the present invention is not limited to an image display device, so it may be another devices, for example, an information input device such as an image scanner, an information output device such as a sensor, an information input/output device such as an image sensor, an information accumulating device such as a memory, capacitor array, a device for controlling transmission and accumulation of information in a data driver or a scanning driver, etc., or a device constituted by compounding the above devices.

In other words, the present invention is applicable to any semiconductor devices where an active device circuit including a semiconductor active device and long electrically conductive lines, such as a power source line for supplying a source voltage to the active device circuit, a signal line for inputting a signal to the active device circuit, are provided on one substrate. It is especially desirable that the semiconductor device has an arrangement that the active device circuit is formed monolithically on the substrate, and an arrangement that the active device circuit is formed as a semiconductor chip so that the semiconductor chip is mounted on the substrate.

Here, in the case where the semiconductor device is an image display device where an image display section is formed on the substrate, it is desirable that carrier mobility μ of an active device for driving a picture element in the image display section is obtained as follows:

$$\mu \geq 5 \text{ cm}^2/\text{V·sec}$$

It is especially desirable that a polycrystal silicon thin film transistor is used as the active device having the above-mentioned high carrier mobility.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:

a substrate having formed thereon a matrix portion having a plurality of active device elements formed thereon in a matrix form;

an active device circuit including a semiconductor active device, said active device circuit having a plurality of input terminals, said active device circuit being formed around the matrix portion on said substrate;

an external connection terminal comprising one or more divided pieces arranged substantially parallel to said active device circuit for making an electrical connection with an external circuit aside from said semiconductor device, said external connection terminal being formed on an edge of said substrate; and an electrically conductive line for making an electrical connection between each input terminal of said active device circuit and said external connection terminal, said electrically conductive line being formed on said substrate, wherein said electrically conductive line is divided into portions comprising a plurality of divided lines whose wiring resistance each has a predetermined value or less.

2. The semiconductor device as defined in claim 1, wherein said active device circuit is formed monolithically on said substrate.

3. The semiconductor device as defined in claim 1, wherein said active device circuit is a semiconductor chip mounted on said substrate.

4. The semiconductor device as defined in claim 1, wherein said electrically conductive line is a signal line for inputting a signal from the external circuit into said active device circuit.

5. The semiconductor device as defined in claim 1, wherein said electrically conductive line is a power source line for supplying a source power from the external circuit to said active device circuit.

6. The semiconductor device as defined in claim 1, wherein said external connection terminal is formed along the edge of the substrate, and a terminal width in a direction parallel to the edge of the substrate is larger than a terminal width in a direction at right angles to the edge of the substrate.

7. The semiconductor device as defined in claim 6, wherein:

a plurality of said external connection terminals exist on the substrate, and said plurality of connection terminals are arranged in a row in a direction from the edge of the substrate towards the inside of the substrate.

8. The semiconductor device as defined in claim 1 which is an image display device, wherein:

an image display section is formed on said substrate, and said active device circuit includes a driver circuit for driving said image display section.

9. The semiconductor device as defined claim 8, wherein each divided line is formed so that a variation in wiring resistance between said external connection terminal and each input section of said active device circuit is within the range of ±3.1% with respect to an average value of the wiring resistance.

10. The semiconductor device as defined in claim 9, wherein:

said each divided line is constituted of a main line having an almost constant width and a plurality of branch lines which are branched from said main line so as to be connected to each input section of said active device circuit, and As a wiring distance from said external connection terminal becomes longer, the width of said branch lines becomes larger so that the variation in the wiring resistance between said external connection terminal and the input section of said active device circuit is within the above range.

11. The semiconductor device as defined in claim 9, wherein:

said divided lines are constituted of a main line and a plurality of branch lines which are branched from said main line so as to be connected to each input section of said active device circuit, and As the main line is away farther from said external connection terminal, its width becomes larger so that the variation in the wiring resistance between said external connection terminal and each input section of said active device circuit is within the above range.

12. The semiconductor device as defined in claim 9, wherein each divided line is formed so that a variation in a length of each divided line falls in the range of ±3.1% with respect to an average value from lengths of all the divided lines.

13. The semiconductor device as defined in claim 8, wherein:

said electrically conductive line is a video signal line for transmitting a video signal from the external circuit to said driver circuit, said driver circuit includes a sampling circuit, which has a plurality of sampling switches, for sampling the video signal inputted from said video signal line, and said sampling switches are divided into a plurality of groups, and each group and said external connection terminal are connected by each divided line of said video signal line.

14. The semiconductor device as defined in claim 8, wherein:

said electrically conductive line is a start line for transmitting a start signal from the external circuit to said driver circuit, and said driver circuit includes a sampling signal generating circuit for generating a sampling signal which determines a sampling period of the video signal based upon the start signal inputted from said start line.

15. The semiconductor device as defined in claim 8, wherein said image display device is a liquid crystal display unit.

16. The semiconductor device as defined in claim 8, wherein:

said image display section includes an active device for driving a picture element, and carrier mobility μ of said active device obtains the following relation:

$$\mu \geq 5 \text{ cm}^2/\text{V·sec.}$$

17. The semiconductor device as defined in claim 16, wherein said active device is a polycrystal silicon thin film transistor.

18. The semiconductor device as defined in claim 8, wherein:

said electrically conductive line is a clock signal line for transmitting a clock signal from an outer circuit to said driver circuit;

said driver circuit includes a sampling signal generating circuit for generating a sampling signal which determines a sampling cycle of an image signal based upon the clock signal inputted from the clock signal line.

19. A semiconductor device, comprising:

a substrate;

an active device circuit including a semiconductor active device, said active device circuit being formed on said substrate;

a signal line for transmitting a basic signal, which takes at least 2 values inputted from an outside of said semiconductor device thereinto, to said active device circuit, said signal line being formed on said substrate; and a waveform improvement signal generating circuit for generating a waveform improvement signal which is obtained by applying a waveform deterioration corresponding signal component to a basic signal transmitted through said signal line so as to supply said waveform improvement signal to said active device circuit, wherein said waveform improvement signal generating circuit obtains the following relations:

$$|v|<|V|; \quad (1)$$

and $$f \leq F, \quad (2)$$

where v is a maximum amplitude of a basic signal component in said waveform improvement signal and V is a maximum amplitude of a part of said waveform improvement signal including the waveform deterioration response signal component, f is a frequency of said basic signal component and F is a frequency of the waveform deterioration response signal component.

20. The semiconductor device as defined in claim 19, wherein said active device circuit is formed monolithically on said substrate.

21. The semiconductor device as defined in claim 19, wherein said active device circuit is a semiconductor chip mounted on said substrate.

22. The semiconductor device as defined in claim 19, wherein said waveform improvement signal generating circuit is a differentiating circuit for differentiating the basic signal inputted from the outside so as to create the waveform improvement signal.

23. The semiconductor device as defined in claim 19, wherein said waveform improvement signal generating circuit includes:

waveform deterioration response signal generating means for generating the waveform deterioration response signal; and adding means for adding the waveform deterioration response signal generated by said waveform deterioration response signal generating means to the basic signal inputted from the outside.

24. The semiconductor device as defined in claim 23, wherein said waveform deterioration response signal generating means is a differentiating circuit for differentiating the basic signal inputted from the outside so as to generate the waveform deterioration response signal.

25. The semiconductor device as defined in claim 19, which is an image display unit, wherein on said substrate an image display section is formed.

26. The semiconductor device as defined in claim 25, wherein said active device circuit includes a driver circuit for driving said image display section.

27. The semiconductor device as defined in claim 25, wherein said image display unit is a liquid crystal display unit.

28. The semiconductor device as defined in claim 25, wherein:

said image display section includes an active device for driving a picture element, and carrier mobility of said active device μ obtains the following relation:

$$\mu \geq 5 \text{ cm}^2/\text{V·sec}.$$

29. The semiconductor device as defined in claim 28, wherein said active device is a polycrystal silicon thin film transistor.

30. A semiconductor device, comprising:

a substrate;

an active device circuit including a semiconductor active device, said active device circuit being formed on said substrate; and a signal line for transmitting an input signal inputted from the outside of said semiconductor device to said active device circuit, said signal line being formed on said substrate;

wherein said active device circuit includes a phase characteristic improvement circuit comprising a differentiation circuit for compensating for waveform deterioration.

31. The semiconductor device as defined in claim 30 which is an image display unit, wherein on said substrate an image display section is formed.

32. The semiconductor device as defined in claim 31, wherein said image display section and said active device circuit are formed monolithically on said substrate.

33. The semiconductor device as defined in claim 31, wherein said active device circuit is constituted of a semiconductor chip and is mounted on said substrate where said image display section has been formed.

34. A semiconductor device, comprising:

a substrate;

an active device circuit including a semiconductor active device, said active device circuit being formed on said substrate;

a signal line for transmitting a basic signal, which determines operational frequency of said active device circuit, to said active device circuit, said basic signal being inputted from an outside of said semiconductor device, said signal line being formed on said substrate; and a waveform improvement circuit for adding a waveform deterioration response signal component to a rising portion or a falling portion that is a portion where an operation timing is specified in said basic signal, wherein said waveform improvement circuit obtains the following relation:

where f is an operation frequency of the active device circuit which is operated by said basic signal, and T is a minimum pulse width of said waveform deterioration response signal component.

35. The semiconductor device as defined in claim 34, wherein said waveform improvement circuit includes:

waveform deterioration response signal generating means for generating the waveform deterioration response signal;

adding means for adding the waveform deterioration response signal generated by said waveform deterioration response signal generating means to the basic signal inputted from the outside.

36. The semiconductor device as defined in claim 35, wherein said waveform deterioration response signal generating means is a differentiating circuit for differentiating the basic signal inputted from the outside so as to create the waveform deterioration response signal.

37. The semiconductor device as defined in claim 35, wherein said waveform deterioration response signal generating means is a sine wave generating circuit for generating the waveform deterioration response signal having a sine wave.

38. The semiconductor device as defined in claim 34, wherein said waveform improvement circuit obtains the following relation:

$$|V_T|>|V_f|$$

where $V_T$ is a peak value of said waveform deterioration response signal component and $V_f$ is a peak value of said basic signal component.

39. The semiconductor device as defined in claim 34 which is an image display device, wherein on said substrate an image display section is formed.

40. The semiconductor device as defined in claim 39, wherein said image display section and said active device circuit are formed monolithically on said substrate.

41. The semiconductor device as defined in claim 39, wherein said active device circuit is constituted of a semiconductor chip and is mounted on said substrate where said image display section has been formed.

42. A semiconductor device, comprising:

an insulating substrate;

an active device circuit including a semiconductor active device, said active device circuit being formed on said substrate; and a signal line for transmitting an input signal inputted from an outside of said semiconductor device to said active device circuit, said signal line being formed on said substrate, wherein said active device circuit obtains the following relation:

$$V_{pp} > |V_{DD} - V_{EE}|$$

where $V_{DD}$ is a maximum source voltage of said active device circuit, $V_{EE}$ is a minimum source voltage and $V_{pp}$ (peak-to-peak value) is an amplitude of the input signal to be inputted to said active device circuit.

43. The semiconductor device as defined in claim 42 which is an image display device, wherein on said substrate an image display section is formed.

44. The semiconductor device as defined in claim 43, wherein said image display section and said active device circuit are formed monolithically on said substrate.

45. The semiconductor device as defined in claim 43, wherein said active device circuit is constituted of a semiconductor chip and is mounted on said substrate provided with said image display section formed thereon.

46. A semiconductor device, comprising:

a substrate;

an active device circuit including a semiconductor active device, said active device circuit being formed on said substrate;

a power source line for supplying a source voltage from the outside of said semiconductor device to said active device circuit, said power source line being formed on said substrate;

a capacity forming electrode having a reference potential, said capacity forming electrode being arranged so that at least one portion of said electrode is opposite to said power source line; and a capacity forming dielectric being arranged between said power source line and said capacity forming electrode which are arranged opposite to each other.

47. The semiconductor device as defined in claim 46, wherein said active device circuit is formed monolithically on said substrate.

48. The semiconductor device as defined in claim 46, wherein said active device circuit is a semiconductor chip mounted on said substrate.

49. The semiconductor device as defined in claim 48, wherein said semiconductor chip includes:

a chip substrate;

said semiconductor active device formed on said chip substrate;

a power supply line for supplying a power to said semiconductor active device, said power supply line being formed on said chip substrate;

a second capacity forming electrode having a reference potential, said second capacity forming electrode being arranged so that at least one portion of said second electrode is opposite to said power supply line; and a second capacity forming dielectric arranged between the power supply line and the second capacity forming electrode which are arranged opposite to each other.

50. The semiconductor device as defined in claim 46, wherein said substrate is an insulating substrate.

51. The semiconductor device as defined in claim 50, wherein said insulating substrate is a glass substrate.

52. The semiconductor device as defined in claim 46, wherein said substrate is a semiconductor substrate on which an insulating film is formed.

53. The semiconductor device as defined in claim 46 which is an image display device, wherein on said substrate an image display section is formed.

54. The semiconductor device as defined in claim 53, wherein said active device circuit includes a driver circuit for driving said image display section.

55. The semiconductor device as defined in claim 53, wherein said image display device is a liquid crystal display unit.

56. The semiconductor device as defined in claim 53, wherein said image display device is a plasma display device.

57. The semiconductor device as defined in claim 53, wherein said image display device is a light emitting diode display device.

58. The semiconductor device as defined in claim 53, wherein:

said image display section includes an active device for driving a picture element, and carrier mobility $\mu$ of said active device is 5 cm$^2$/V·sec or more ($\mu \geq 5$ cm$^2$/V·sec).

59. The semiconductor device as defined in claim 58, wherein said active device is a polycrystal silicon thin film transistor.

60. The semiconductor device as defined in claim 46 is an information input device.

61. The semiconductor device as defined in claim 46 is an information output device.

62. The semiconductor device as defined in claim 46 is an information accumulating device.

63. The semiconductor device as defined in claim 46, wherein said power source line includes a nonmetallic electrically conductive film and a metal film electrically connected to said nonmetallic electrically conductive film.

64. The semiconductor device as defined in claim 46, wherein said capacity forming electrode includes a nonmetallic electrically conductive film and a metal film connected to said electrically nonmetallic conductive film.

65. A semiconductor device, comprising:

a first substrate;

a second substrate arranged opposite to said first substrate;

an active device circuit including a semiconductor active device, said active device circuit being formed on said first substrate;

a power source line for supplying a source voltage from an outside of said semiconductor device to said active device circuit, said power source line being formed on said first substrate;

a capacity forming electrode having a reference potential arranged so that at least one portion of said electrode is opposite to said power supply line, said capacity forming electrode being formed on said second substrate; and a capacity forming dielectric being arranged between the power supply line and the capacity forming electrode which are arranged opposite to each other.

66. The semiconductor device as defined in claim 65 which is an image display device, wherein on said first substrate an image display section is formed.

67. The semiconductor device as defined in claim 66, wherein said image display device is a liquid crystal display unit.

68. The semiconductor device as defined in claim 67, wherein said capacity forming dielectric is liquid crystal.

69. The semiconductor device as defined in claim 68, further comprising a partition member for separating liquid crystal to be used for display and liquid crystal to be used as said capacity forming dielectric.

70. The semiconductor device as defined claim 66, wherein:

said image display section on said first substrate includes an image display electrode, said second substrate is an opposite substrate where a counter electrode arranged opposite to said image display electrode is formed on the surface.

71. The semiconductor device as defined in claim 70, wherein said capacity forming electrode is said counter electrode which is formed so as to be extended to a position facing said power source line.

72. The semiconductor device as defined in claim 65, further comprising:

a sealing member for sealing a space between said first and second substrates, said sealing member being provided between said substrates, wherein said capacity forming dielectric is constituted of said sealing member.

73. A semiconductor device, comprising:

a monolithic substrate having an external connection terminal comprising one or more portions arranged parallel to an edge of said substrate for making an electrical connection external to said semiconductor device;

an active device semiconductor circuit formed on said substrate, said active device circuit having a plurality of circuit input points associated therewith;

an electrical conductor formed on said substrate for making an electrical connection between said external connection terminal and a plurality of said circuit input points, wherein said electrical conductor comprises a plurality of conductive line portions each of which has an electrical resistance of a predetermined value, such that different conductive paths from said external connection terminal to each input point in said active device circuit have substantially uniform resistances.

74. In a semiconductor device having an active device circuit formed on a monolithic substrate, an external connection terminal for making an electrical connection with an another circuit aside from said active device circuit, said external connection terminal being formed on an edge of said substrate, and a signal line formed on said substrate for conducting an input signal from the external connection terminal to various points in said active device circuit, a method for compensating for a characteristic phase shift in the input signal due to waveform deterioration along the length of said signal line, comprising the steps of:

generating a waveform deterioration response signal component, said waveform deterioration response signal component produced by a phase characteristic improvement circuit also formed on said substrate; and combining the waveform deterioration response signal component with the input signal on said signal line so as to coincide with rising or falling edge components of said input signal.

75. In a semiconductor device having an active device circuit formed on a monolithic substrate, and a signal line formed on said substrate for conducting an input signal from an external connection terminal to various input points in said active device circuit, a method for improving characteristics of the input signal, comprising the steps of:

forming said external connection terminal as one or more portions arranged parallel to an edge of said substrate for making an electrical connection external to said substrate; and forming said signal line as a plurality of connected portions consisting of electrically conductive lines of varying widths, each of which has an electrical resistance of a predetermined value such that different conductive paths from said external connection terminal to each input point in said active device circuit have substantially uniform resistance.

* * * * *